(12) United States Patent
Walters et al.

(10) Patent No.: US 12,324,244 B2
(45) Date of Patent: Jun. 3, 2025

(54) EPITAXIAL SINGLE CRYSTALLINE SILICON GROWTH FOR MEMORY ARRAYS

(71) Applicant: Micron Technology, Inc., Boise, ID (US)

(72) Inventors: Glen H. Walters, Boise, ID (US); John A. Smythe, III, Boise, ID (US); Scott E. Sills, Boise, ID (US); John F. Kaeding, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 945 days.

(21) Appl. No.: 17/464,780

(22) Filed: Sep. 2, 2021

(65) Prior Publication Data

US 2022/0102384 A1 Mar. 31, 2022

Related U.S. Application Data

(63) Continuation-in-part of application No. 17/035,819, filed on Sep. 29, 2020, now Pat. No. 11,289,491.

(51) Int. Cl.
*H10D 86/00* (2025.01)
*H10D 86/01* (2025.01)
*H10D 87/00* (2025.01)
*H01L 21/02* (2006.01)
*H10D 86/80* (2025.01)

(52) U.S. Cl.
CPC .......... *H10D 87/00* (2025.01); *H10D 86/01* (2025.01); *H10D 86/011* (2025.01); *H10D 86/215* (2025.01); *H01L 21/02381* (2013.01); *H01L 21/0262* (2013.01); *H01L 21/02639* (2013.01); *H01L 21/02647* (2013.01); *H10D 86/80* (2025.01)

(58) Field of Classification Search
None
See application file for complete search history.

(56) References Cited

U.S. PATENT DOCUMENTS 10,446,578 B1 * 10/2019 Howder ............... H10D 64/037
10,607,995 B2    3/2020 Roberts et al.
10,930,707 B2 *  2/2021 Fratin ................. H10N 70/882
2018/0323200 A1 11/2018 Tang et al.
(Continued)

*Primary Examiner* — Steven M Page
(74) *Attorney, Agent, or Firm* — Brooks, Cameron & Huebsch, PLLC

(57) ABSTRACT

Systems, methods, and apparatuses are provided for epitaxial single crystalline silicon growth for memory arrays. One example method includes forming logic circuitry on a silicon substrate in a first working surface and depositing an isolation material on the first working surface to encapsulate the logic circuitry and to form a second working surface above the first working surface. Further, the example method includes etching the isolation material to form a vertical opening through the isolation material and epitaxially growing single crystalline silicon from the silicon substrate and horizontally on the second working surface in a first, a second, and a third direction to cover the second working surface. The example method further includes removing a portion of the epitaxially grown single crystalline silicon to partition distinct and separate third working surface areas in which to form memory cell components and forming storage nodes above the memory cell components.

22 Claims, 35 Drawing Sheets

(56) References Cited

U.S. PATENT DOCUMENTS

| | | |
|---|---|---|
| 2019/0019546 A1* | 1/2019 | Luan ................. H01L 29/66363 |
| 2019/0103406 A1 | 4/2019 | Tang et al. |
| 2019/0164985 A1 | 5/2019 | Lee et al. |
| 2020/0176465 A1 | 6/2020 | Tang et al. |
| 2021/0257370 A1* | 8/2021 | Son .......................... G11C 7/18 |

\* cited by examiner

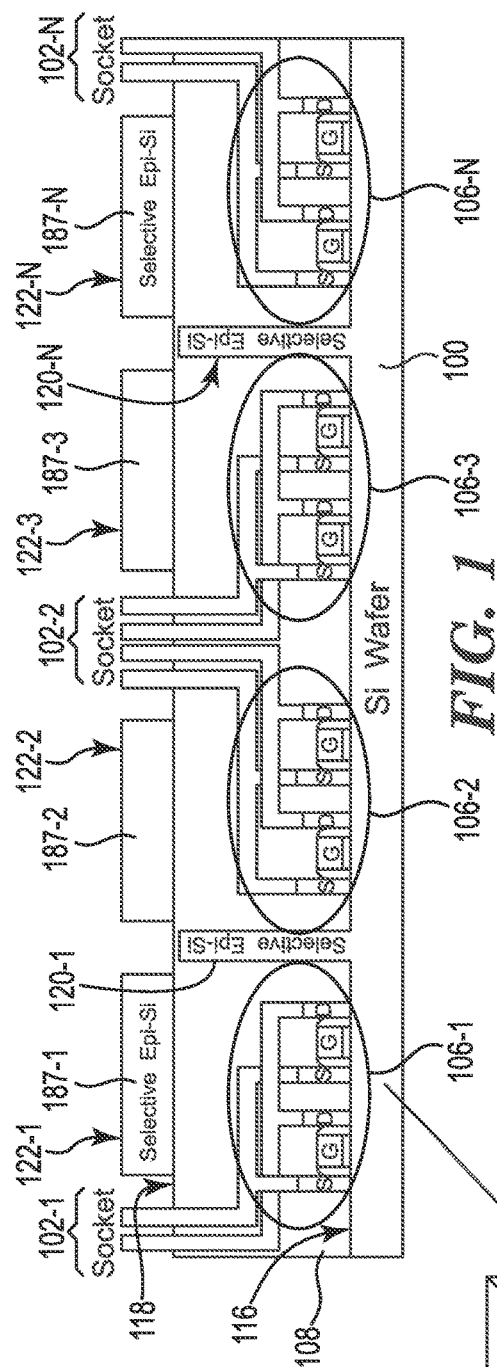
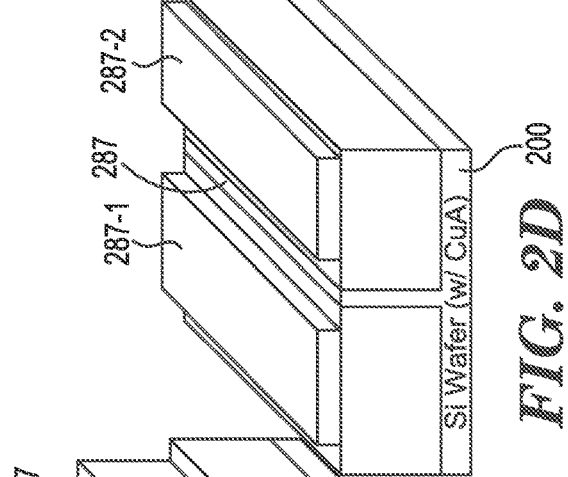
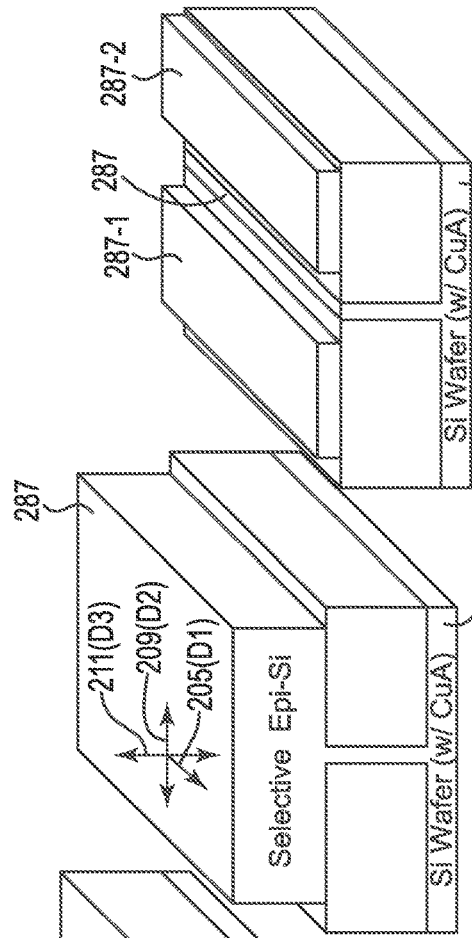
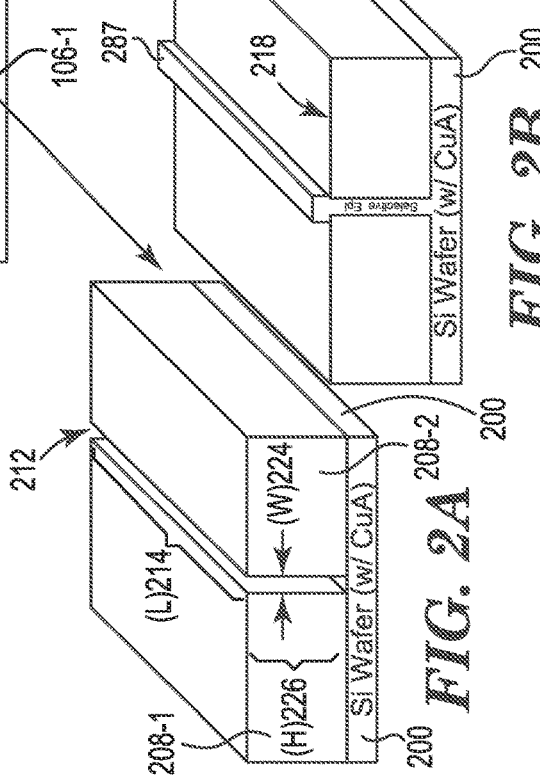
FIG. 1
FIG. 2A
FIG. 2B
FIG. 2C
FIG. 2D

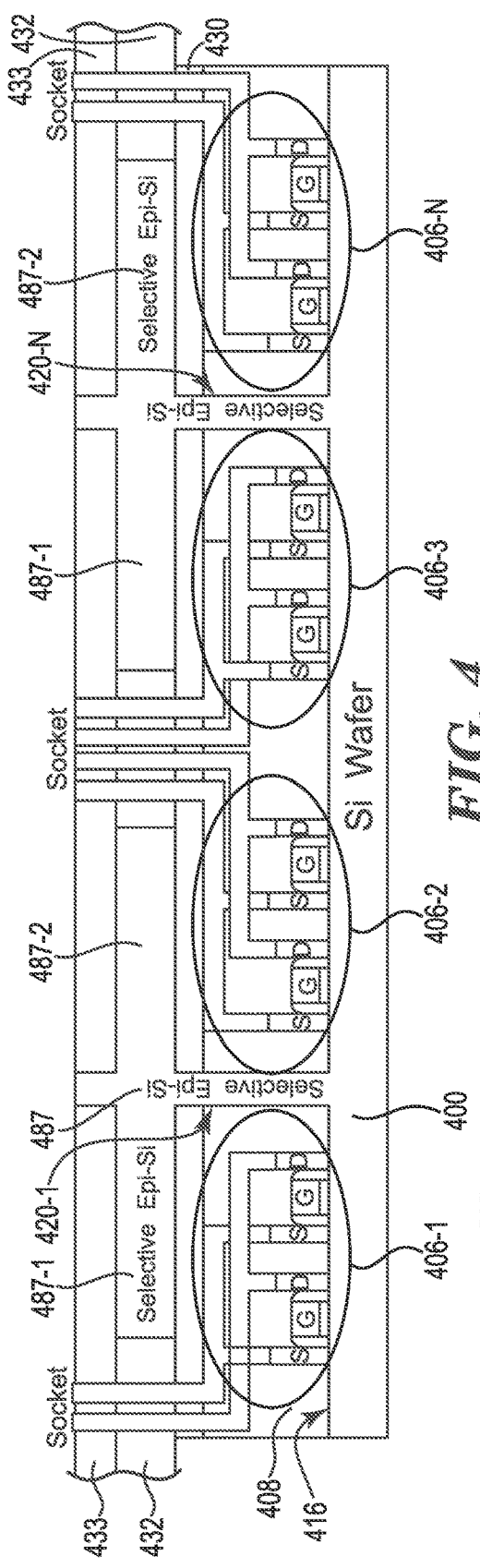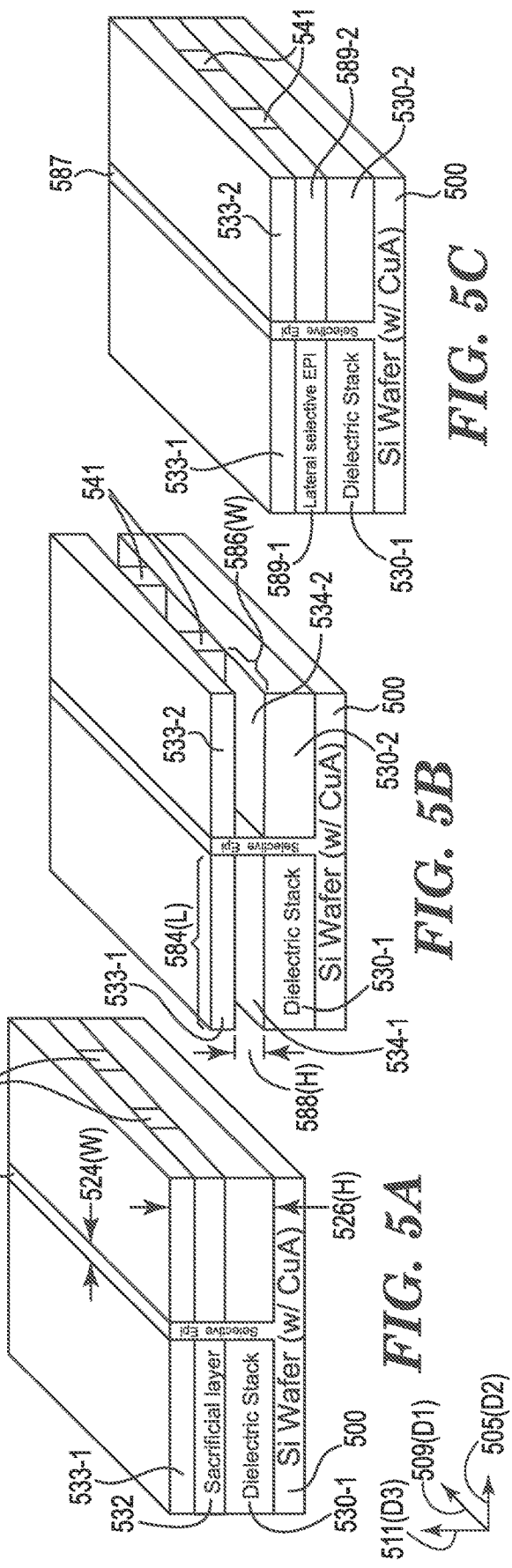
FIG. 4
FIG. 5A
FIG. 5B
FIG. 5C

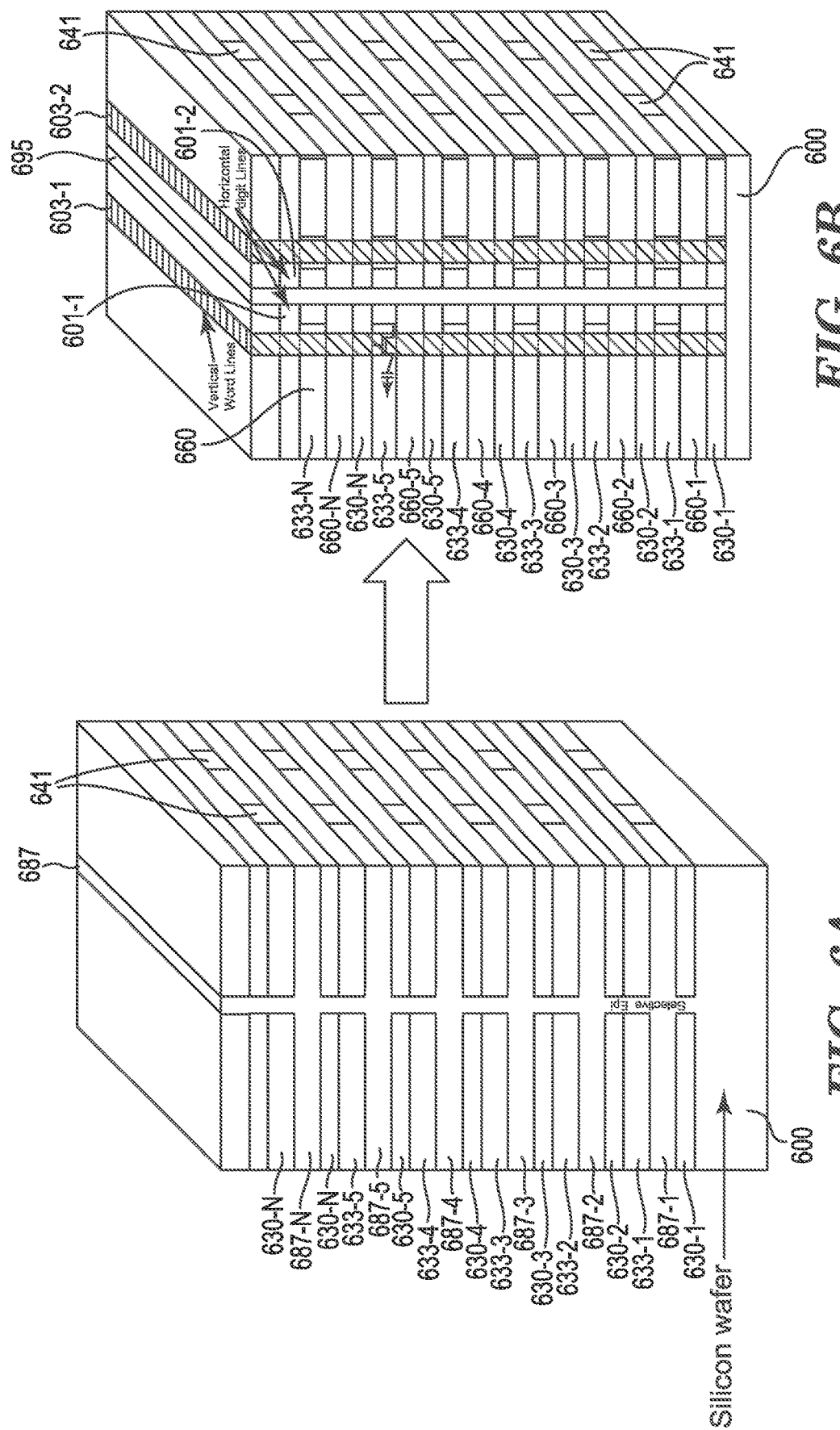

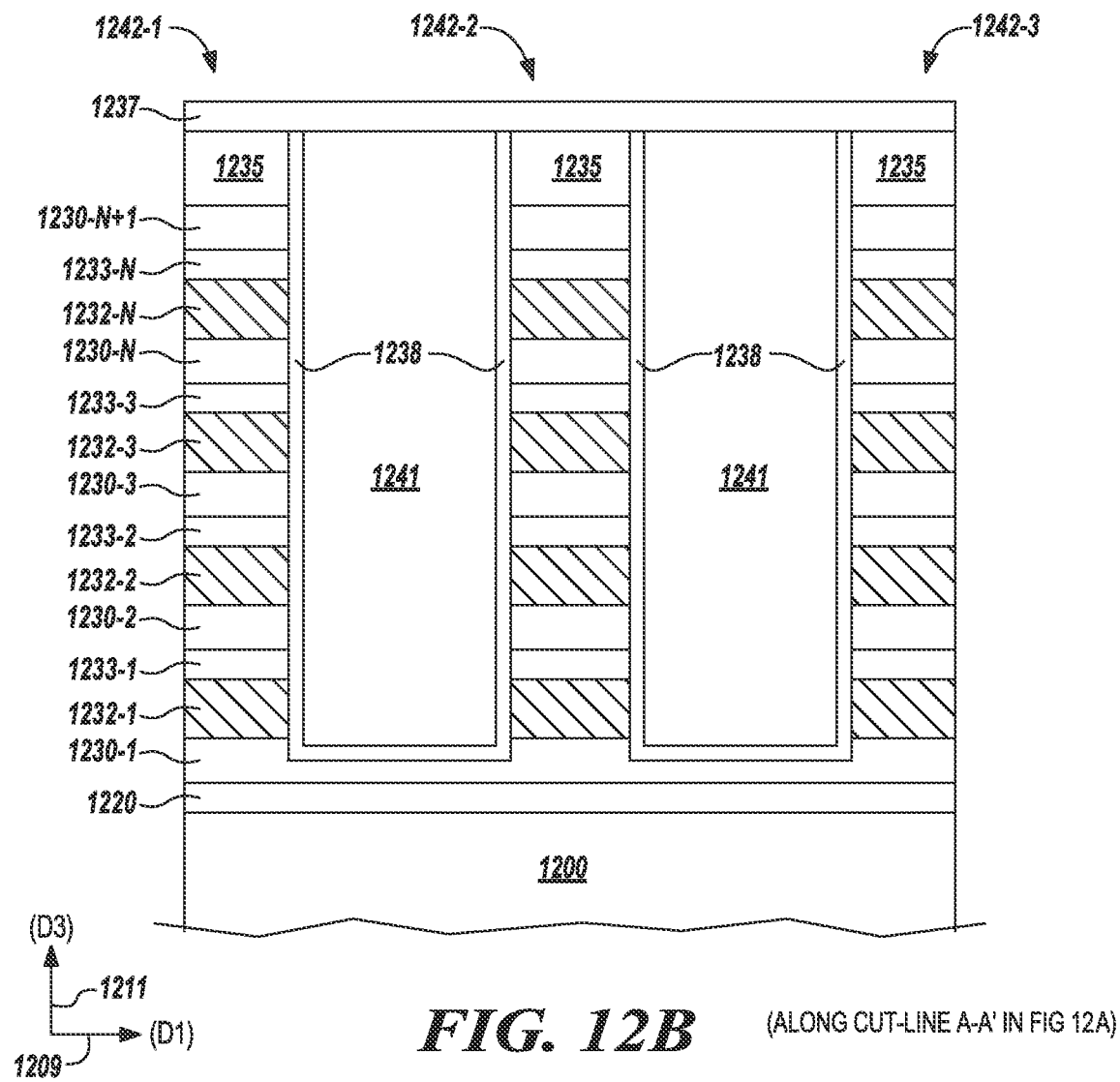
FIG. 12B (ALONG CUT-LINE A-A' IN FIG 12A)

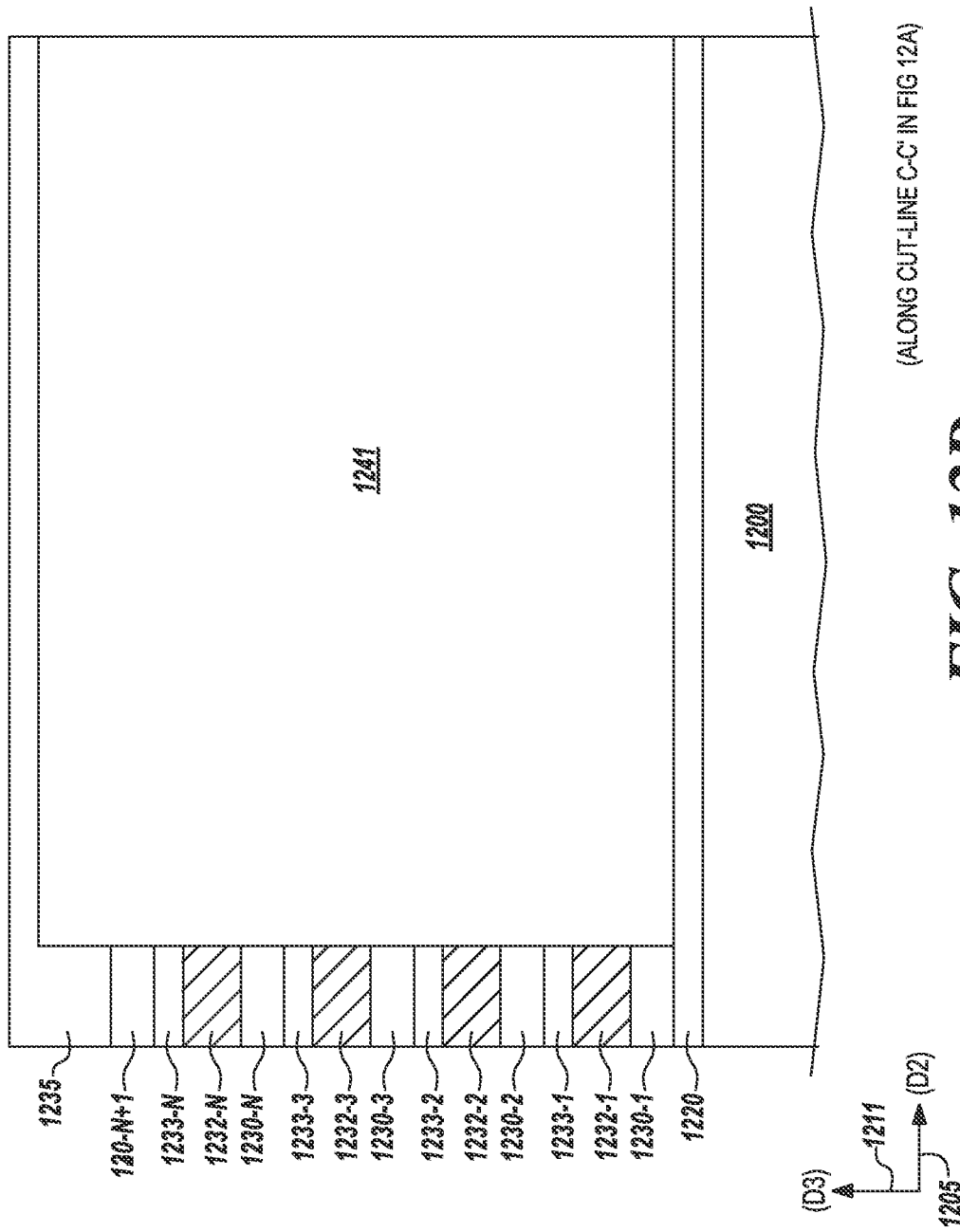

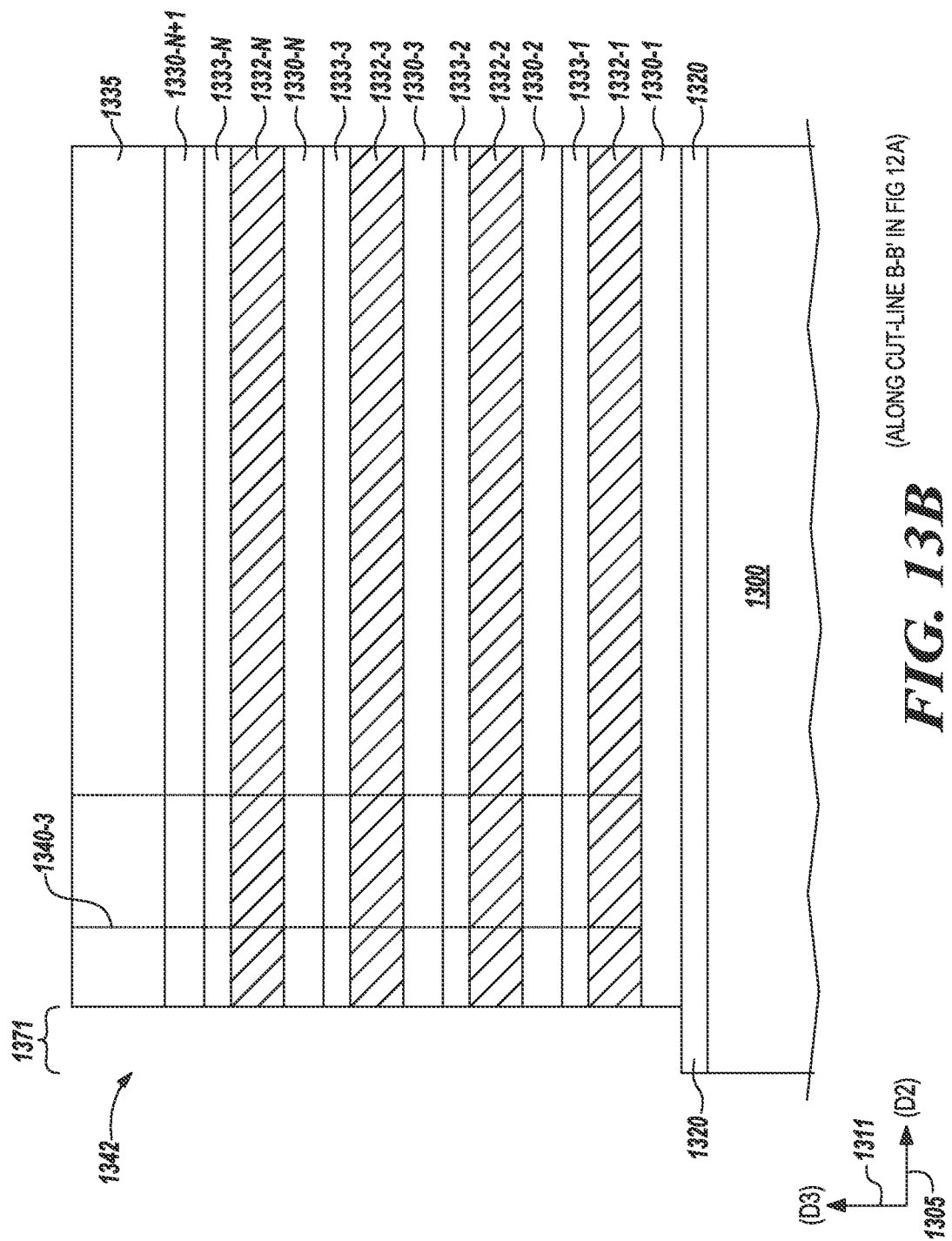
FIG. 13B (ALONG CUT-LINE B-B' IN FIG 12A)

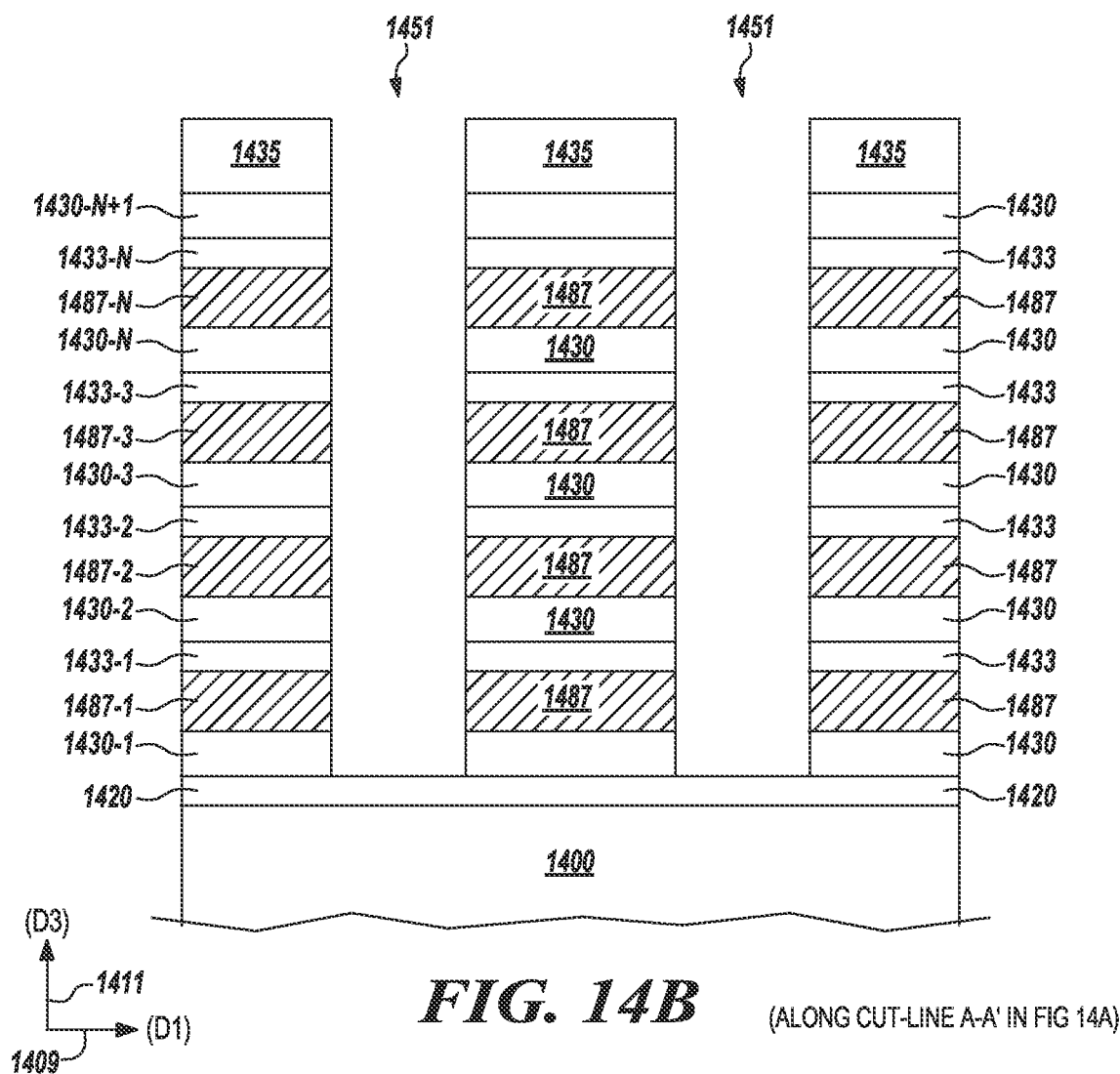
FIG. 14B (ALONG CUT-LINE A-A' IN FIG 14A)

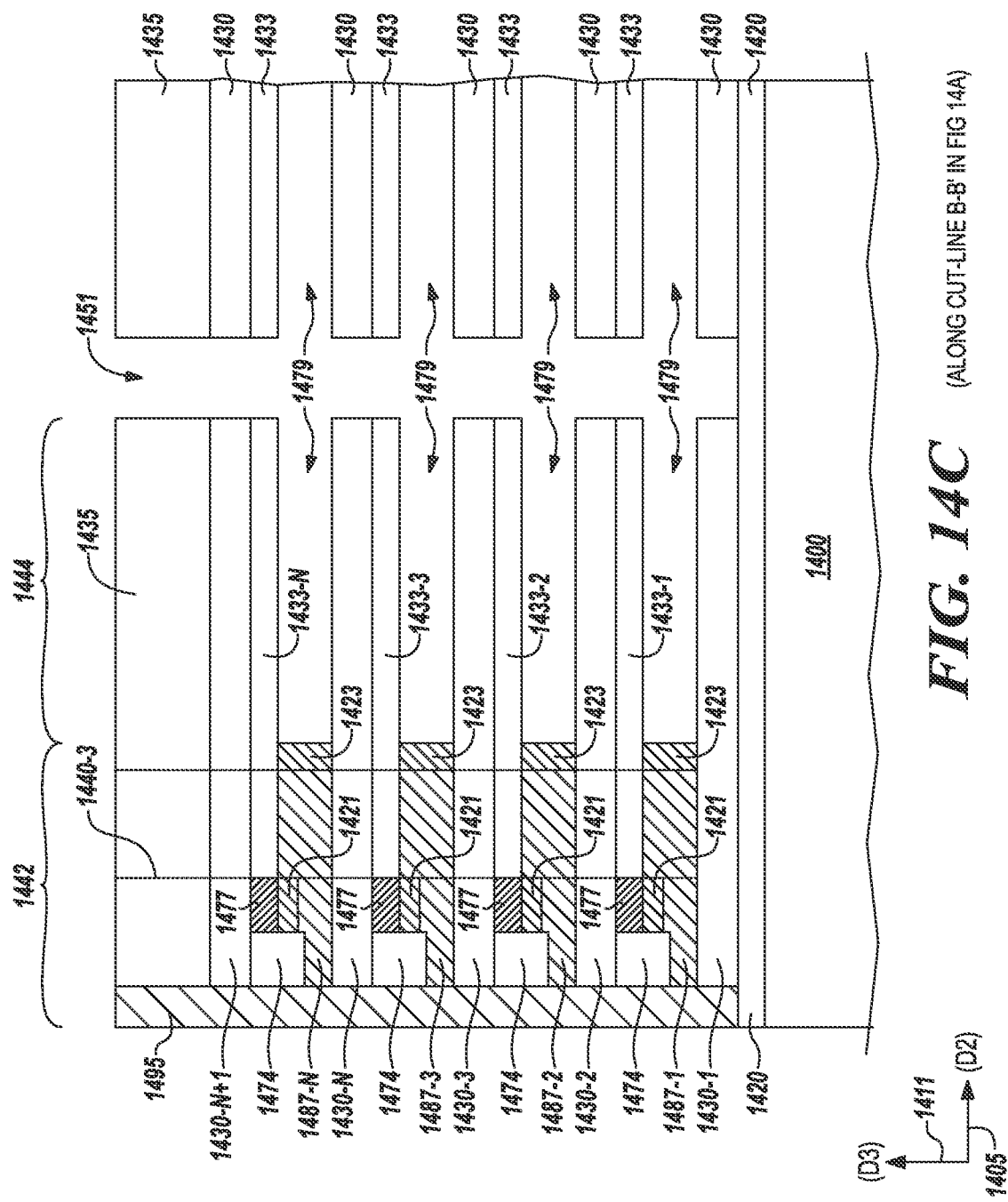
FIG. 14C (ALONG CUT-LINE B-B' IN FIG 14A)

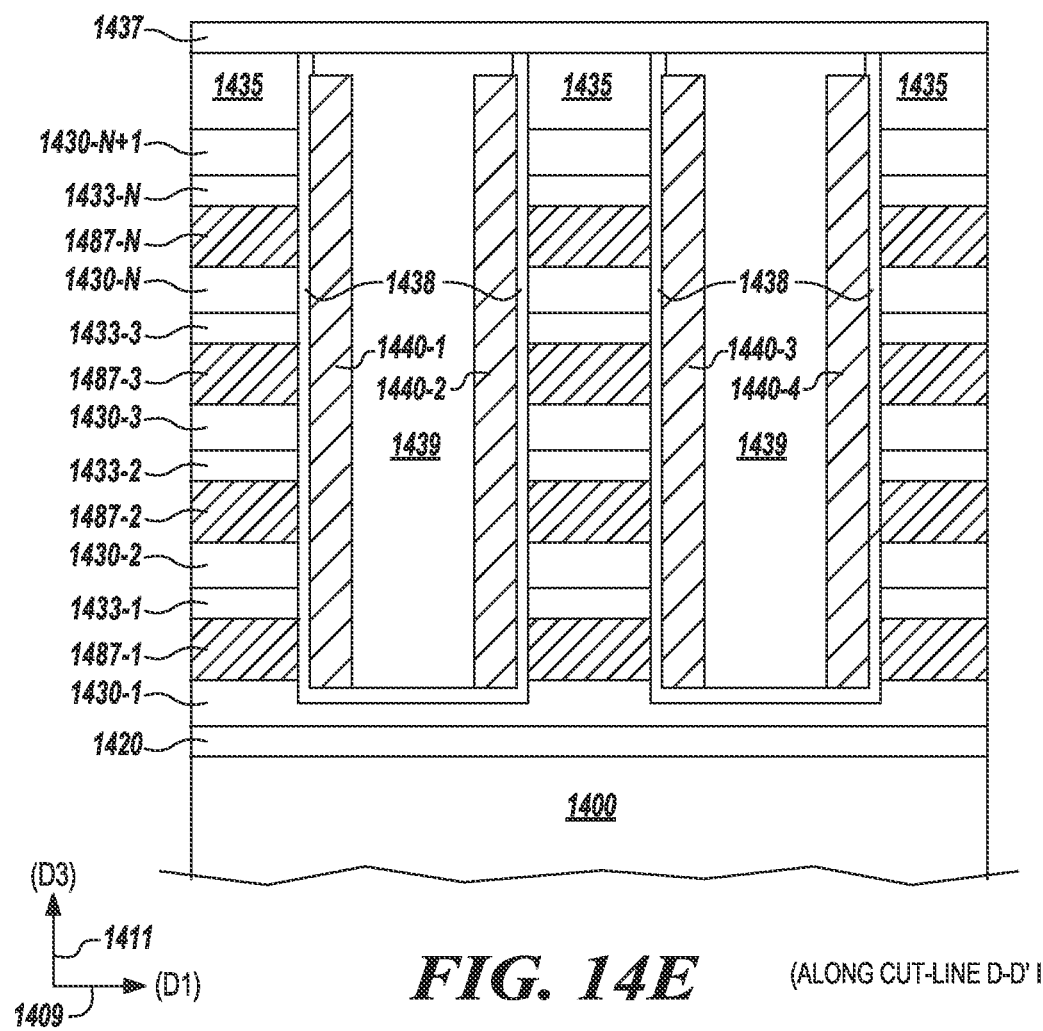
FIG. 14E (ALONG CUT-LINE D-D' IN FIG 14A)

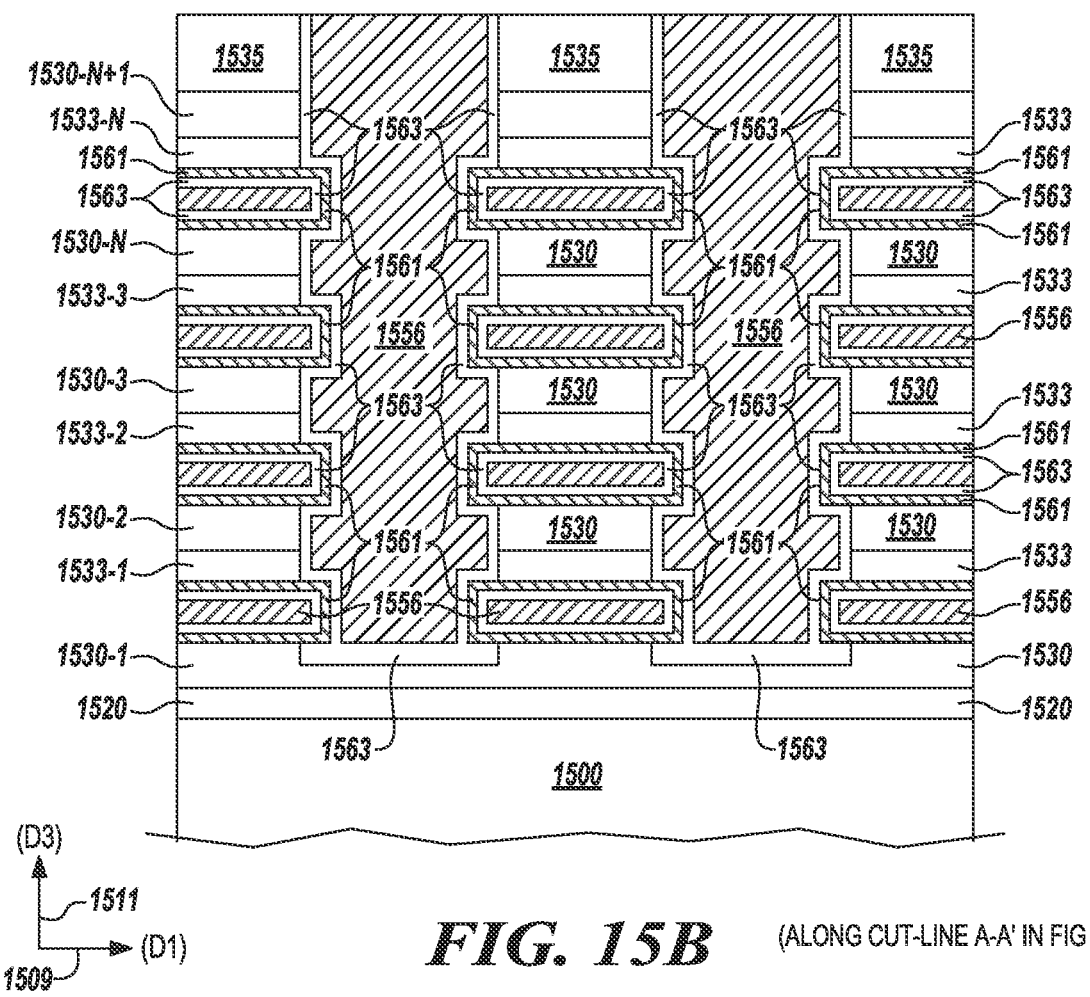
FIG. 15B (ALONG CUT-LINE A-A' IN FIG 15A)

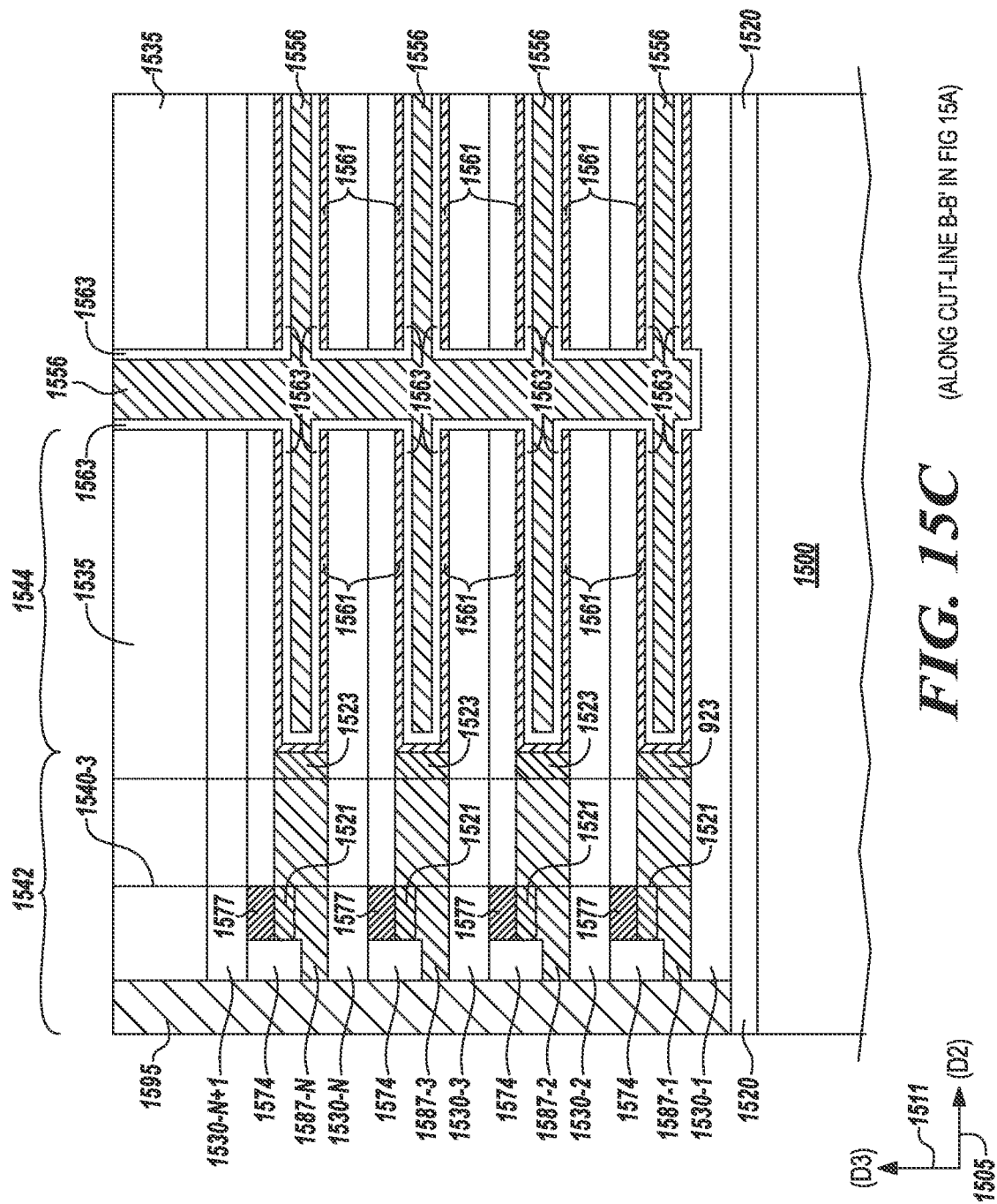
FIG. 15C (ALONG CUT-LINE B-B' IN FIG 15A)

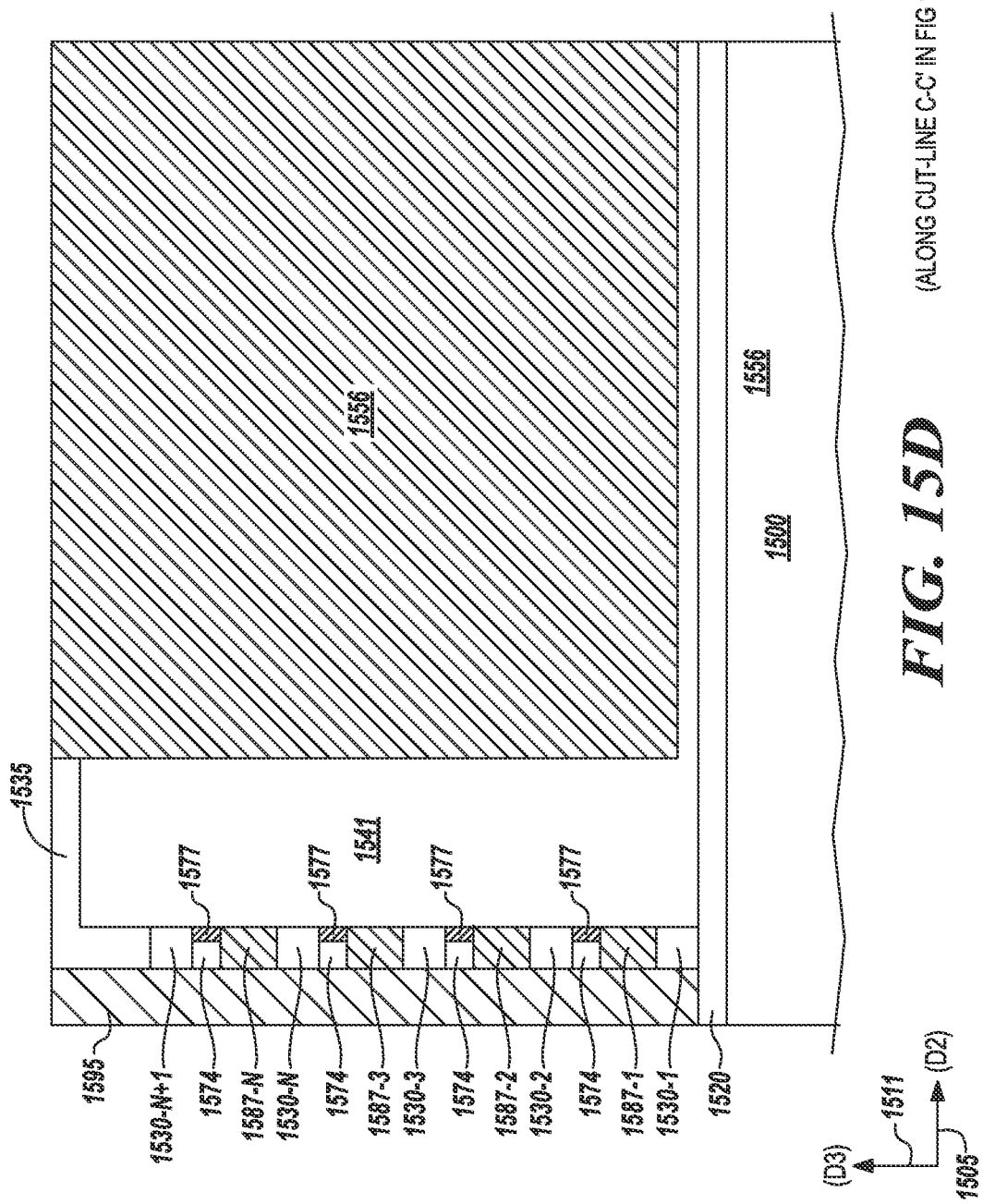

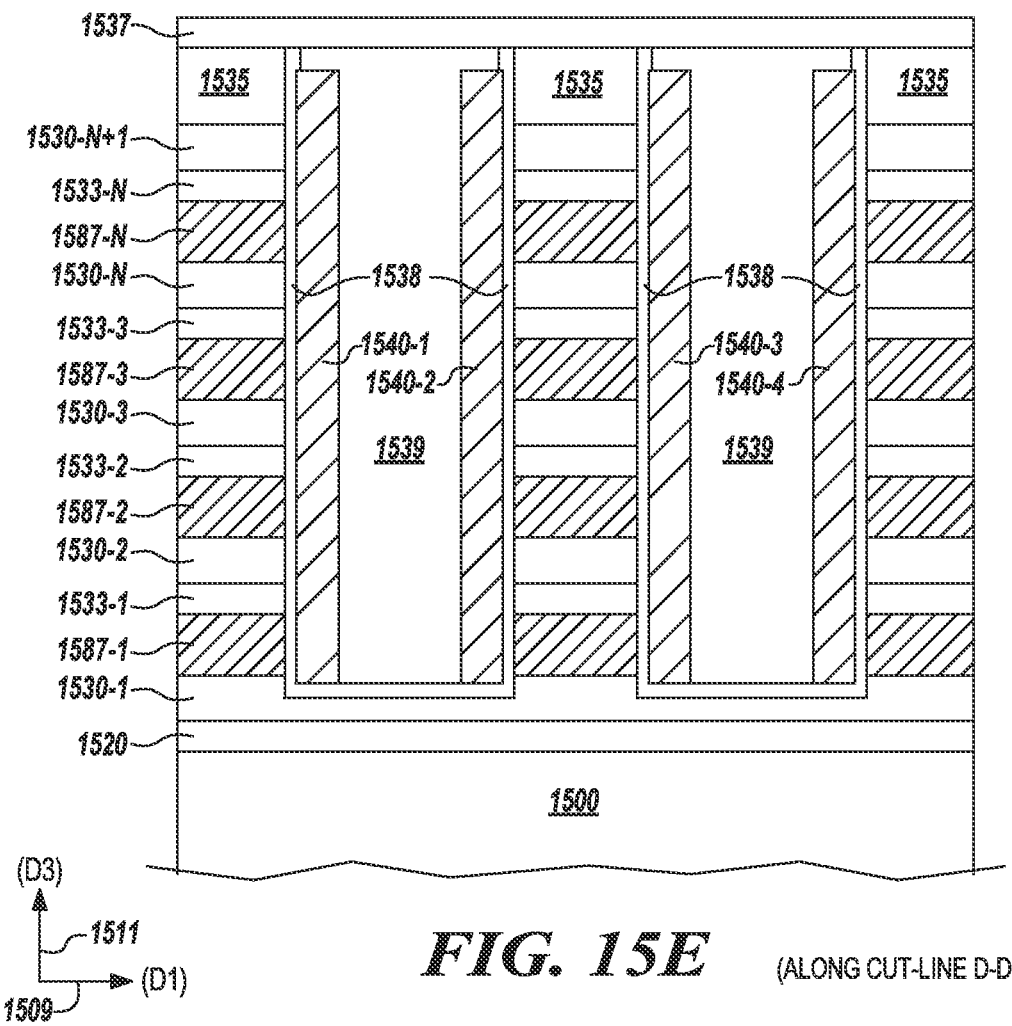
FIG. 15E (ALONG CUT-LINE D-D' IN FIG 15A)

US 12,324,244 B2

1

EPITAXIAL SINGLE CRYSTALLINE SILICON GROWTH FOR MEMORY ARRAYS

PRIORITY INFORMATION

This application is a Continuation in Part of U.S. application Ser. No. 17/035,819, filed on Sep. 29, 2020, the contents of which are incorporated herein by reference.

TECHNICAL FIELD

The present disclosure relates generally to memory devices, and more particularly, to epitaxial single crystalline silicon growth for memory arrays.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by a channel and body region. A gate may oppose the channel region and be separated therefrom by a gate dielectric. An access line, such as a word line, is electrically connected to the gate of the DRAM cell. A DRAM cell can include a storage node, such as a capacitor cell, coupled by the access device to a digit line. The access device can be activated (e.g., to select the cell) by an access line coupled to the access transistor. The capacitor can store a charge corresponding to a data value of a respective cell (e.g., a logic "1" or "0").

BRIEF DESCRIPTION OF THE DRAWINGS

FIG. 1 is a cross-sectional view of a memory array formed over complementary metal oxide semiconductor (CMOS) logic circuity, in accordance with a number of embodiments of the present disclosure.

FIGS. 2A to 2D illustrate an example method, at one stage of a semiconductor fabrication process, for epitaxial single crystalline silicon growth for memory arrays, in accordance with an embodiment shown in FIG. 1.

FIG. 4 is a cross-sectional view of a memory array formed over complementary metal oxide semiconductor (CMOS) logic circuity, in accordance with another number of embodiments of the present disclosure.

2

FIGS. 5A to 5C illustrate an example method, at one stage of a semiconductor fabrication process, for epitaxial single crystalline silicon growth for memory arrays, in accordance with an embodiment shown in FIG. 4.

FIGS. 6A to 6B illustrate a perspective view of a vertical three dimensional (3D) memory, in accordance with a number of embodiments of the present disclosure.

Figure 7:
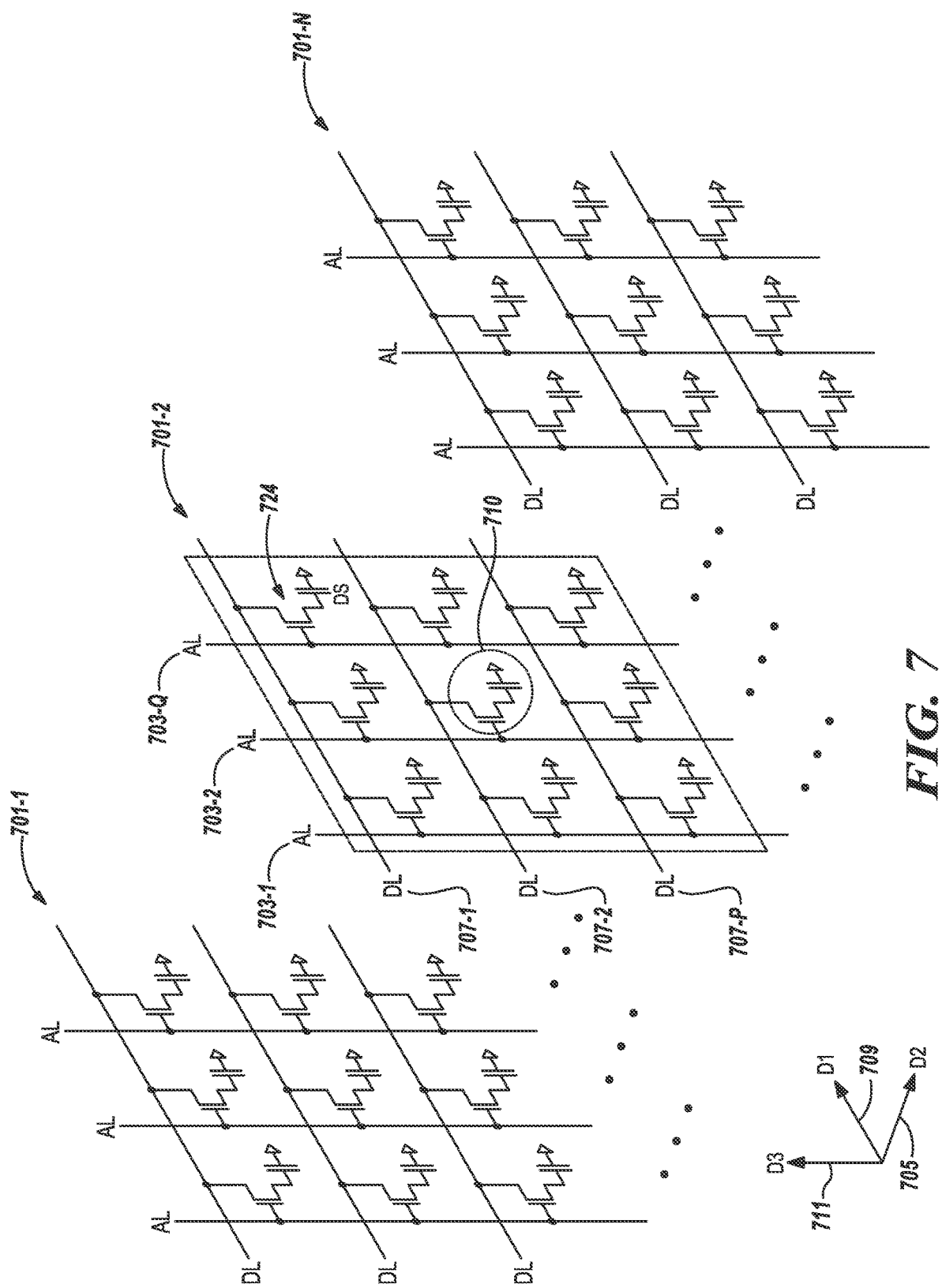

FIG. 7 is a schematic illustration of a vertical three dimensional (3D) memory, in accordance with a number of embodiments of the present disclosure.

Figure 8:
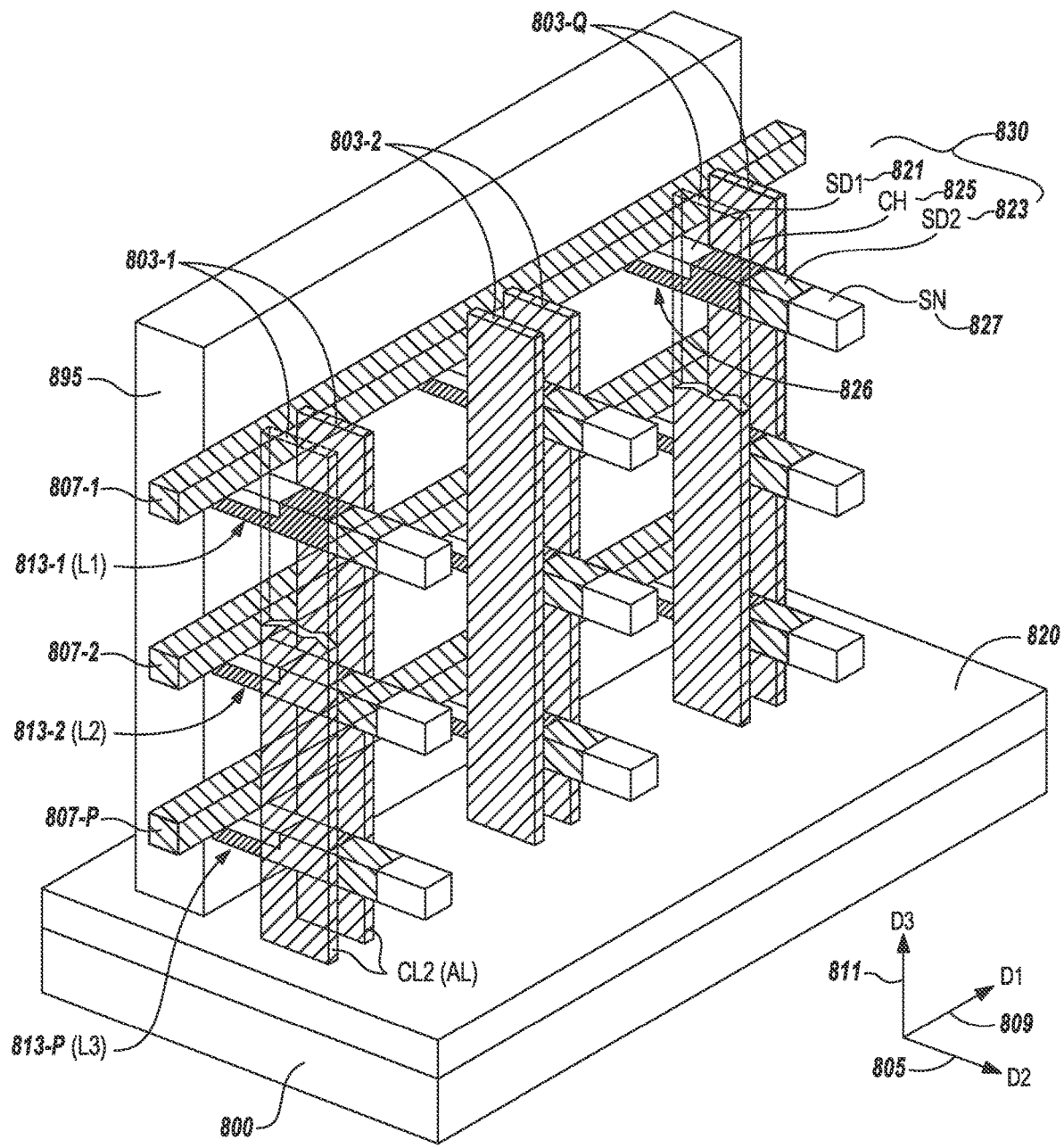

FIG. 8 is a perspective view illustrating horizontal access devices coupled to a horizontal storage nodes having vertical access lines and horizontal digit lines for a vertical 3D memory, in accordance with a number of embodiments of the present disclosure.

Figure 9:
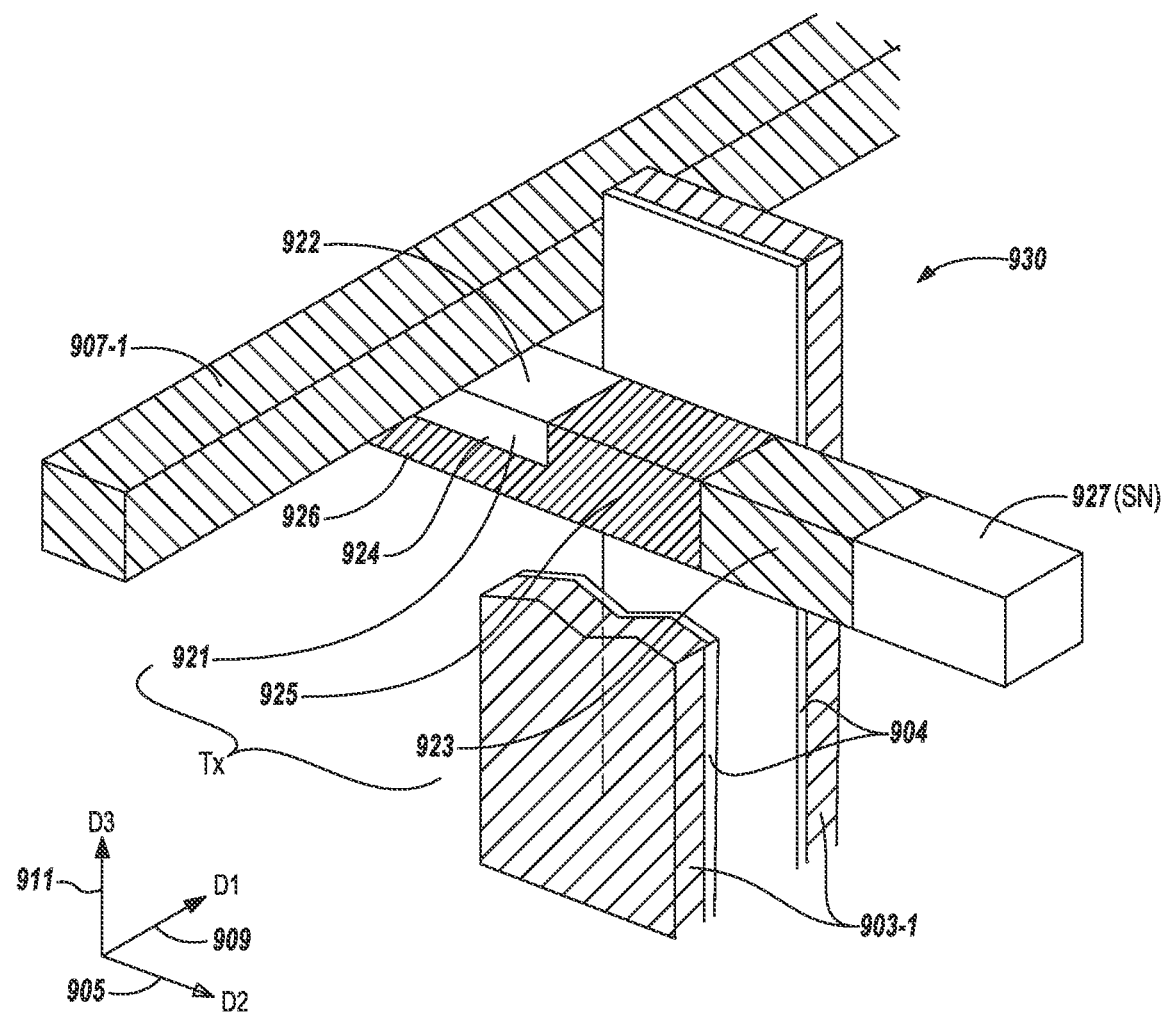

FIG. 9 is a perspective view illustrating in unit memory cell having a horizontal access device coupled to a horizontal storage node having vertical access lines and horizontal digit lines, in accordance with a number of embodiments of the present disclosure.

Figure 10:
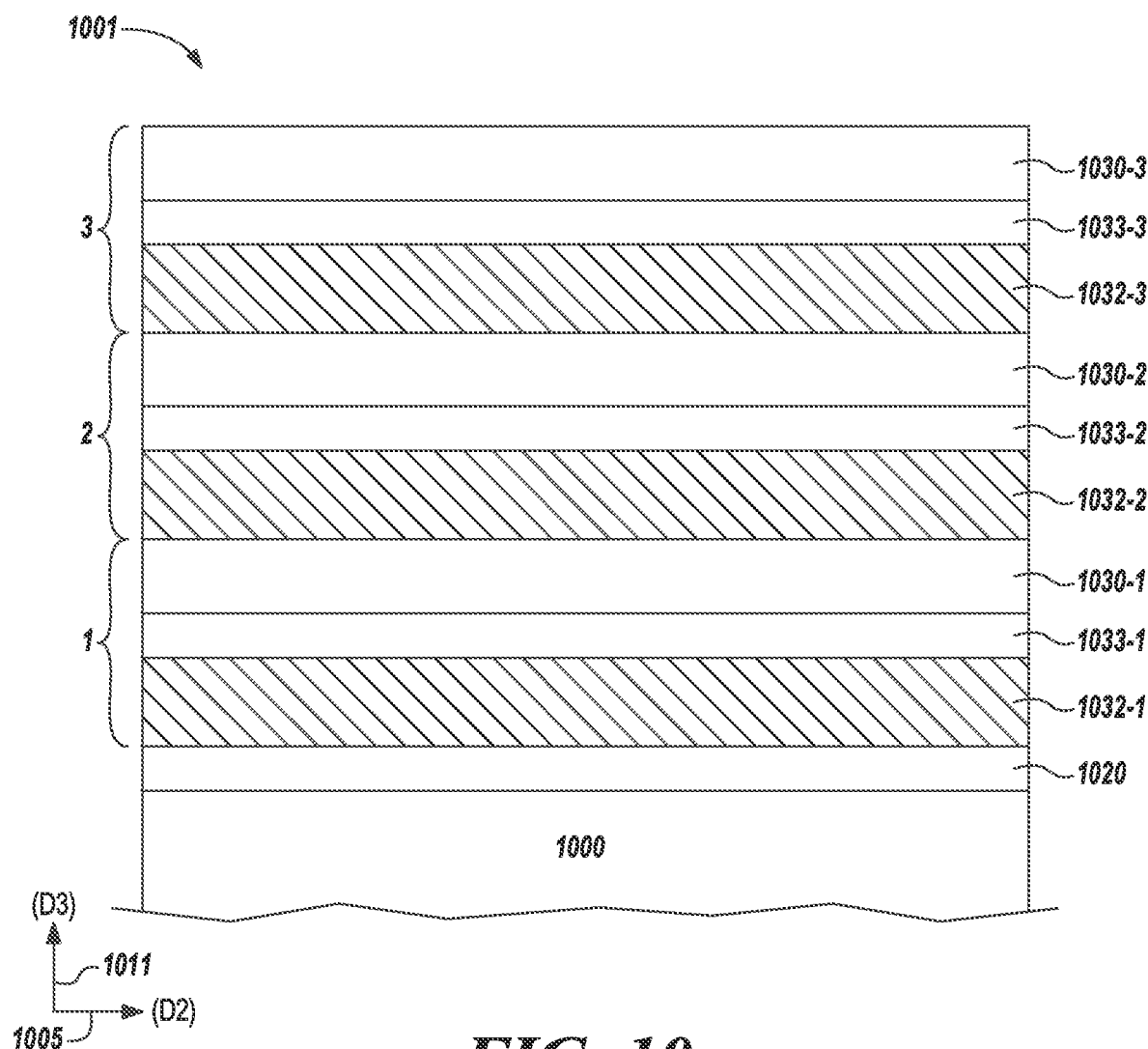

FIG. 10 is a cross-sectional view of an example method for forming arrays of vertically stacked memory cells, at one stage of a semiconductor fabrication process, with epitaxial single crystalline silicon growth for memory arrays, in accordance with a number of embodiments of the present disclosure.

Figure 11A:
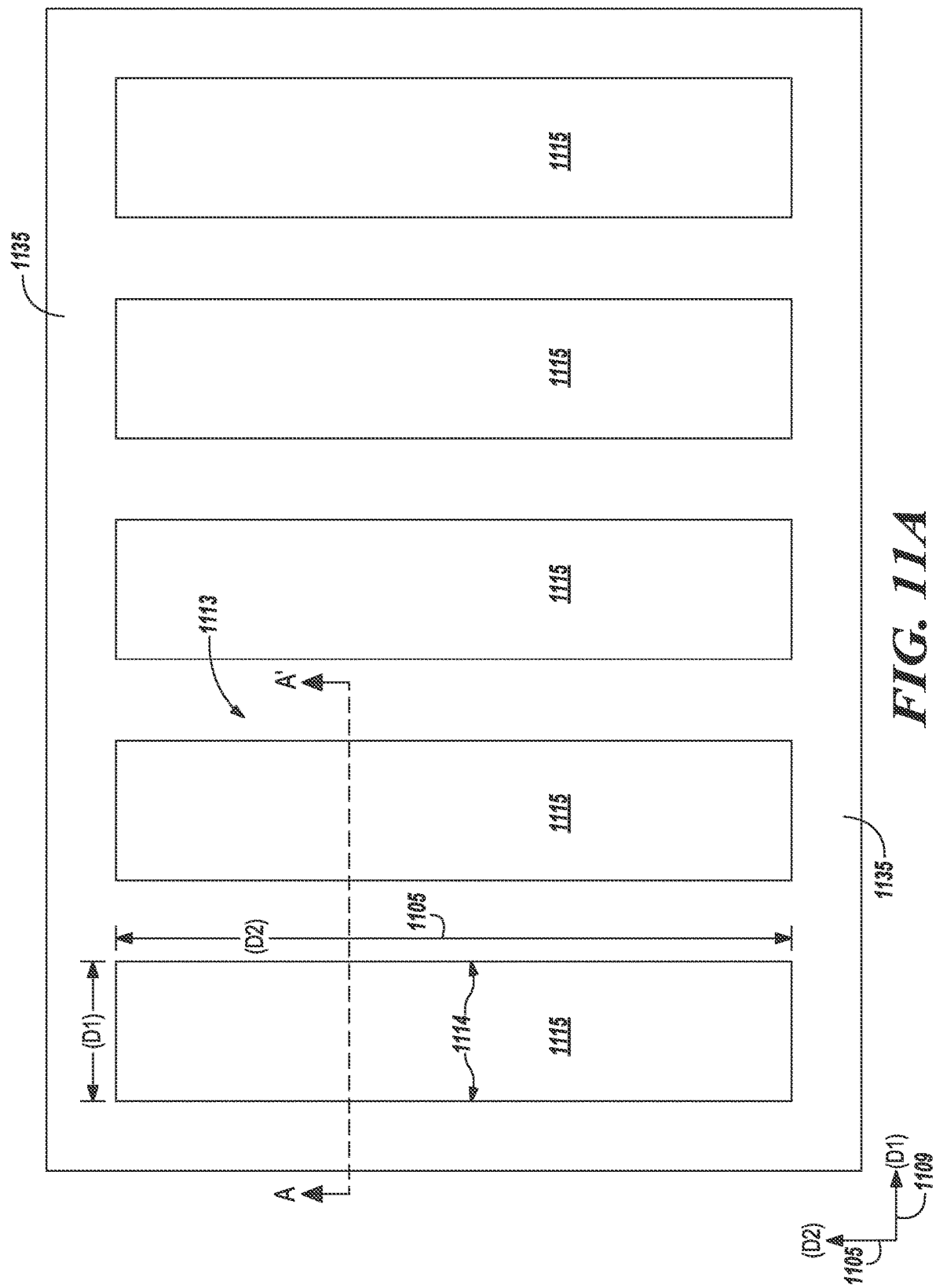
Figure 11B:
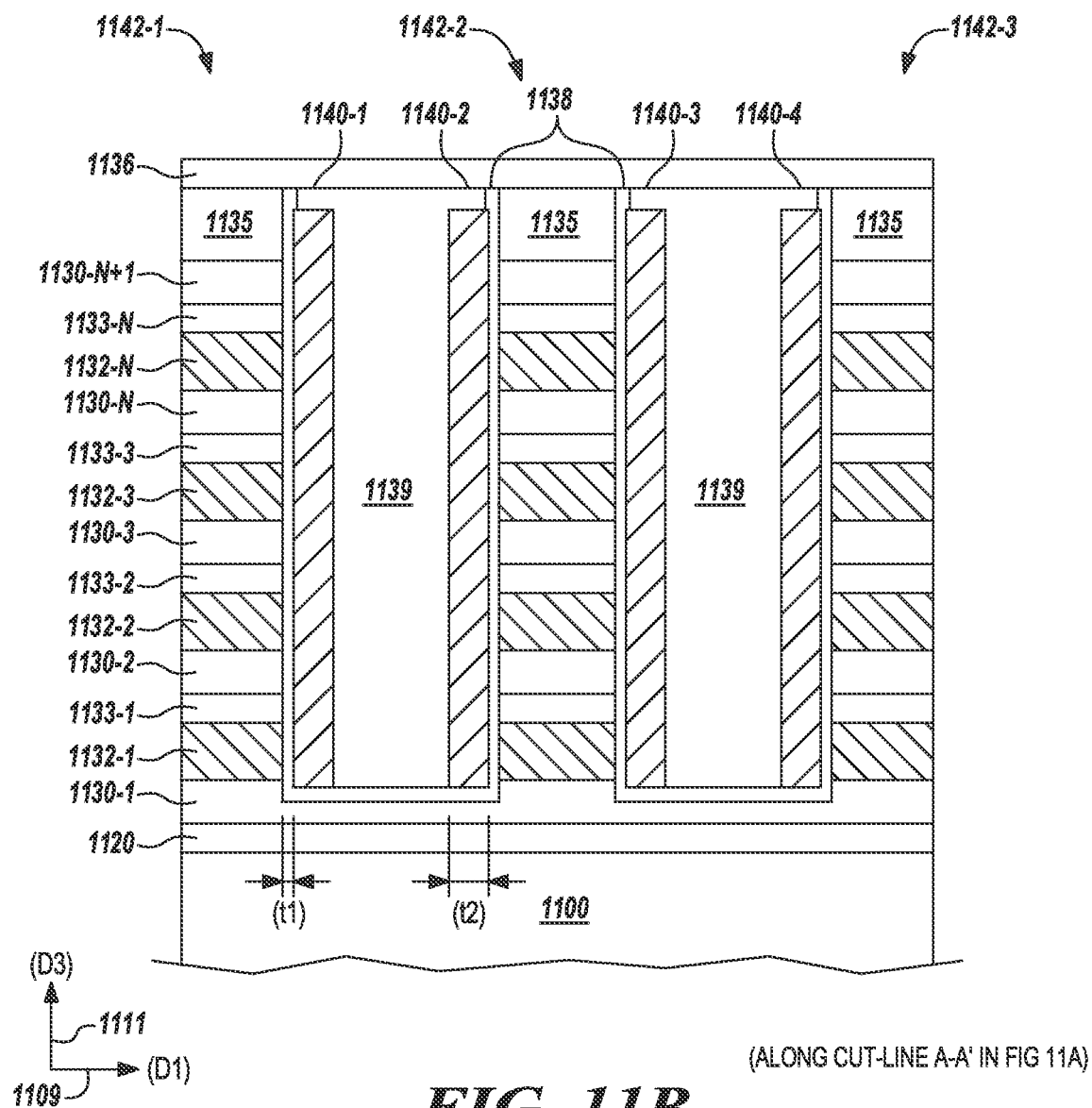

FIGS. 11A-11B illustrate an example method, at another stage of a semiconductor fabrication process, for forming arrays of vertically stacked memory cells with epitaxial single crystalline silicon growth for a horizontal access device, in accordance with a number of embodiments of the present disclosure.

FIGS. 12A to 12E illustrate an example method, at another stage of a semiconductor fabrication process, for forming arrays of vertically stacked memory cells with epitaxial single crystalline silicon growth a horizontal access device, in accordance with a number of embodiments of the present disclosure.

FIGS. 13A to 13I illustrate an example method, at another stage of a semiconductor fabrication process, for forming arrays of vertically stacked memory cells with epitaxial single crystalline silicon growth for a horizontal access device, in accordance with a number of embodiments of the present disclosure.

FIGS. 14A to 14E illustrate an example method, at another stage of a semiconductor fabrication process, for forming arrays of vertically stacked memory cells with epitaxial single crystalline silicon growth for a horizontal access device, in accordance with a number of embodiments of the present disclosure.

FIGS. 15A-15E illustrate an example method, at another stage of a semiconductor fabrication process, for forming arrays of vertically stacked memory cells with epitaxial single crystalline silicon growth for a horizontal access device, in accordance with a number of embodiments of the present disclosure.

Figure 16:
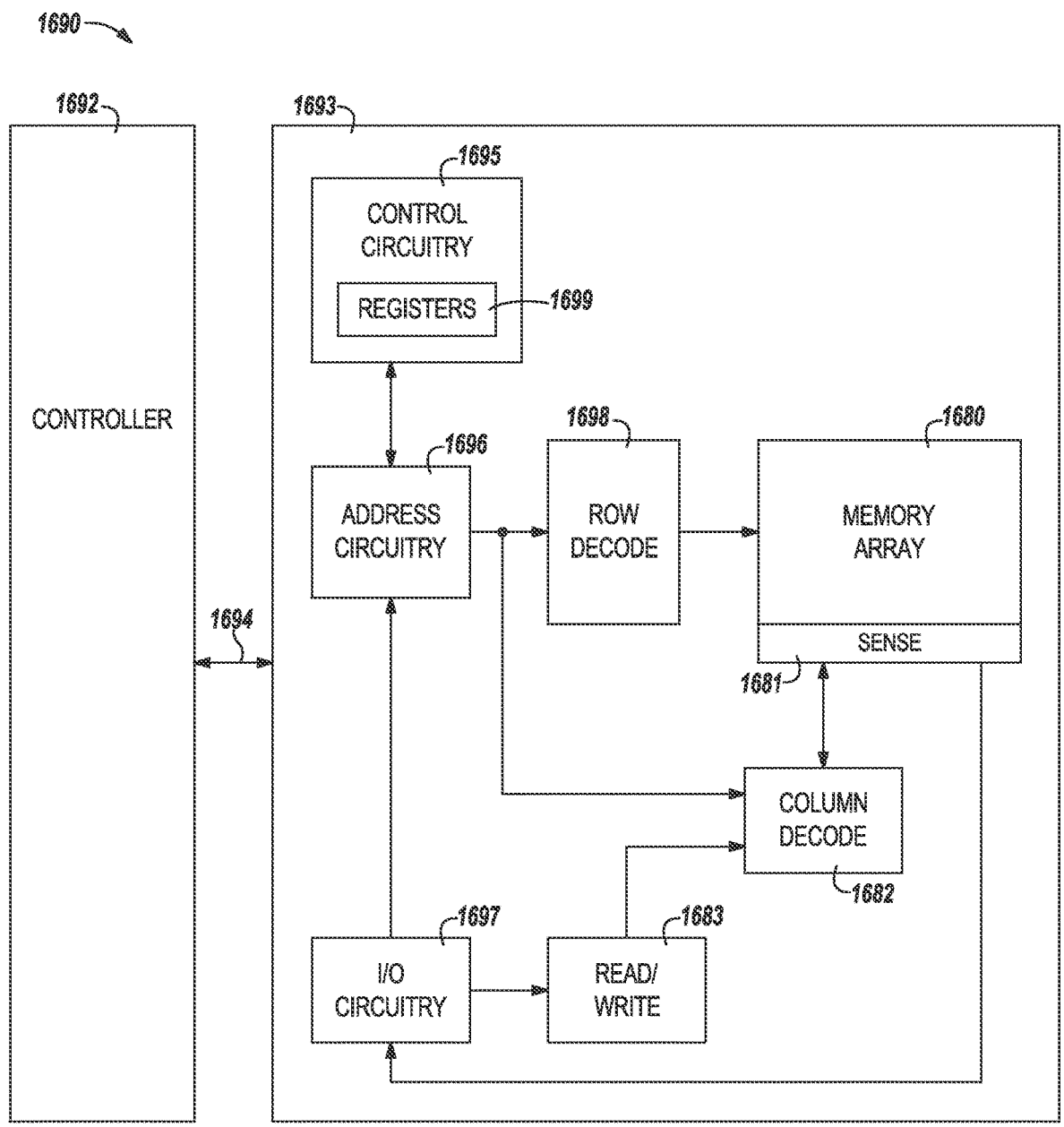

FIG. 16 is a block diagram of an apparatus in the form of a computing system including a memory device, in accordance with a number of embodiments of the present disclosure.

DETAILED DESCRIPTION

Embodiments of the present disclosure describe epitaxial single crystalline silicon growth for semiconductor devices. A channel is epitaxially grown from a single crystalline silicon seed material and integrated into horizontal access devices in an array of vertically stacked memory cells. The horizontal access devices are integrated with vertically oriented access lines and integrated with horizontally oriented digit lines. The channel may provide improved electron mobility due to the increased grain size of the silicon material in the channel and a decreased density in the grain boundary. The decreased grain boundary density may also decrease the electron hole pair generation and decrease the value of the off current (Ioff). This may decrease the anneal process time in comparison to other processes not disclosed herein.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1, and a similar element may be referenced as 204 in FIG. 2. Multiple analogous elements within one figure may be referenced with a reference numeral followed by a hyphen and another numeral or a letter. For example, 302-1 may reference element 302-1 in FIGS. 3 and 302-2 may reference element 302-2, which may be analogous to element 302-1. Such analogous elements may be generally referenced without the hyphen and extra numeral or letter. For example, elements 302-1 and 302-2 or other analogous elements may be generally referenced as 302.

FIG. 1 is a cross-sectional view of a memory array area, e.g., working surface for memory array formation, formed over complementary metal oxide semiconductor (CMOS) logic circuitry, in accordance with a number of embodiments of the present disclosure. As shown in FIG. 1, CMOS logic circuitry, 106-1, 106-2, . . . , 106-N, has been formed on a silicon substrate 100 on a first working surface 116. Suitable semiconduction fabrication process techniques may be used to form the CMOS logic circuitry, 106-1, 106-2, . . . , 106-N, on a silicon substrate 100 as the first working surface 116. For example, the first working surface 116 may have formed thereupon one or more layers of conductive and/or dielectric materials in which to form discrete components of the logic circuitry, 106-1, 106-2, . . . , 106-N, e.g., transistor logic. Suitable semiconductor fabrication techniques can include deposition, masking, patterning (e.g., photolithographic masking and patterning), and removing processes (e.g., CVD, PECVD deposition, and etch removal techniques). Conductive pathways through layers, 102-1, 102-2, . . . , 102-N, to the logic circuitry, 106-1, 106-2, . . . , 106-N are shown. These conductive pathways through layers, 102-1, 102-2, . . . , 102-N, to the logic circuitry, 106-1, 106-2, . . . , 106-N, may similarly be formed according to suitable semiconductor fabrication processes. An isolation material 108, e.g., dielectric material, is shown as part of the first working surface 116, encapsulating the logic circuitry, 106-1, 106-2, . . . , 106-N. The isolation material may be deposited on the first working surface 116 according to suitable semiconductor fabrication processes to encapsulate the logic circuitry, 106-1, 106-2, . . . , 106-N, and form a second working surface 118 above the first working surface 116.

As shown in the example embodiment of FIG. 1, one or more epitaxial single crystalline silicon areas, 187-1, 187-2, . . . , 187-N, have been formed above the logic circuitry, 106-1, 106-2, . . . , 106-N, through vertical openings, 120-1, . . . , 120-N, from the silicon substrate 100 according to techniques described herein. In the example embodiment of FIG. 1, the epitaxially grown single crystalline silicon, 187-1, 187-2, . . . , 187-N, has been partition into a plurality of third working surfaces, 122-1, 122-2, . . . , 122-N, in which memory cells components are to be formed, as described in more detail herein below. The resultant structures can form CMOS under Array (CuA) architectures. Further layers of support material may be deposited above the third working surface areas, 122-1, 122-2, . . . , 122-N, in which to form storage nodes above memory cell components as will be described in more detail in connection with FIG. 3.

FIGS. 2A to 2D illustrate an example method, at one stage of a semiconductor fabrication process, of epitaxial single crystalline silicon growth for memory arrays, in accordance with an embodiment shown in FIG. 1. As shown in the example embodiment of FIG. 2A an isolation material, 108-1 and 108-2, may be formed over and encapsulate CMOS logic circuitry, e.g., 106-1, 106-2, . . . , 106-N shown in FIG. 1.

As shown in FIG. 2A, the method includes patterning and etching the isolation material, 108-1 and 108-2, to form vertical openings 212 through the isolation material, 108-1 and 108-2. According to embodiments, the vertical openings 212 can be formed between the logic circuitry, e.g., 106-1, 106-2, . . . , 106-N shown in FIG. 1, to the silicon substrate 200 (e.g., using suitable photolithographic masking and semiconductor fabrication process etch techniques). In one embodiment, the vertical openings 212 are patterned and etched through the isolation material, 108-1 and 108-2, to the silicon substrate 200 to have a length (L) 214 in a range from 50-200 nanometers (nm), a height (H) 226 in a range from 10-100 nm, and a width (W) 224 in a range from 5-20 nm. In another embodiment, the vertical openings 212 are patterned and etched through the isolation material, 108-1 and 108-2, to the silicon substrate 200 to have a length (L) 214 in a range from 60-1000 nm, a height (H) 226 in a range from 100-500 nm, and a width (W) 224 in a range from 20-100 nm. In yet another embodiment, the vertical openings 212 are patterned and etched through the isolation material, 108-1 and 108-2, to the silicon substrate 200 to have a length (L) 214 in a range between 100-1500 nm, a height (H) 226 in a range from 500-1000 nm, and a width (W) 224 in a range from 100-500 nm.

As shown in the embodiment of FIG. 2B, the method includes epitaxially growing single crystalline silicon 287 from the silicon substrate 200 through the vertical openings 212 such that the epitaxial single crystalline silicon growth 287 is selective to growth on silicon 200. In one example, the epitaxial single crystalline silicon 287 is grown by flowing dichlorosilane (DCS) and hydrogen chloride (HCl) gases into the vertical opening 212 to epitaxially grow the single crystalline silicon 287 from the silicon substrate 200 within the vertical opening 212. Embodiments, however, are not limited to this example.

In one embodiment of FIG. 2B, a length (L) 214 the vertical opening is patterned and etched in an orientation parallel to a <100> crystalline direction of the silicon in the silicon substrate 200. As such, epitaxially growing the single crystalline silicon 200 from the silicon substrate 200 through the vertical opening 212 will occur along a <100> crystalline direction of the silicon in the silicon substrate 200. In another embodiment of FIG. 2B, a length (L) 214 the vertical opening is patterned and etched in an orientation parallel to a <110> crystalline direction of the silicon in the silicon substrate 200. As such, epitaxially growing the single crystalline silicon 287 from the silicon substrate 200 through the vertical opening 212 will occur along a <110> crystalline direction of the silicon in the silicon substrate 200.

As shown in the embodiment of FIG. 2C, the method includes continuing epitaxial single crystalline silicon growth 287 horizontally on a working surface 218 of the isolation material, 208-1 and 208-2, e.g., second working surface 118 in FIG. 1, in a first (D1) 205, a second (D2) 209, and a third (D3) 211 direction to cover the working surface 218. Again, the epitaxial single crystalline silicon growth is selective to growth on silicon. In various embodiments, epitaxially growing single crystalline silicon 287 from the silicon substrate 200 through the vertical openings 212, according to the length (L) 214, height (H) 226, and width (W) 224 ranges described above in FIG. 2B, and in a manner such that the epitaxial single crystalline silicon growth 287 is selective to growth on silicon substrate 200, produces epitaxial single crystalline silicon 287 that is grain free of twin and stacking fault defects.

As shown in the embodiment of FIG. 2D, the method includes patterning and removing a portion of the epitaxially grown single crystalline silicon (e.g., using semiconductor fabrication process photolithographic and etch techniques) to partition distinct and separate third working surface areas, 287-1 and 287-2, among the epitaxially grown single crystalline silicon 287 in which to form memory cell components.

Figure 3:
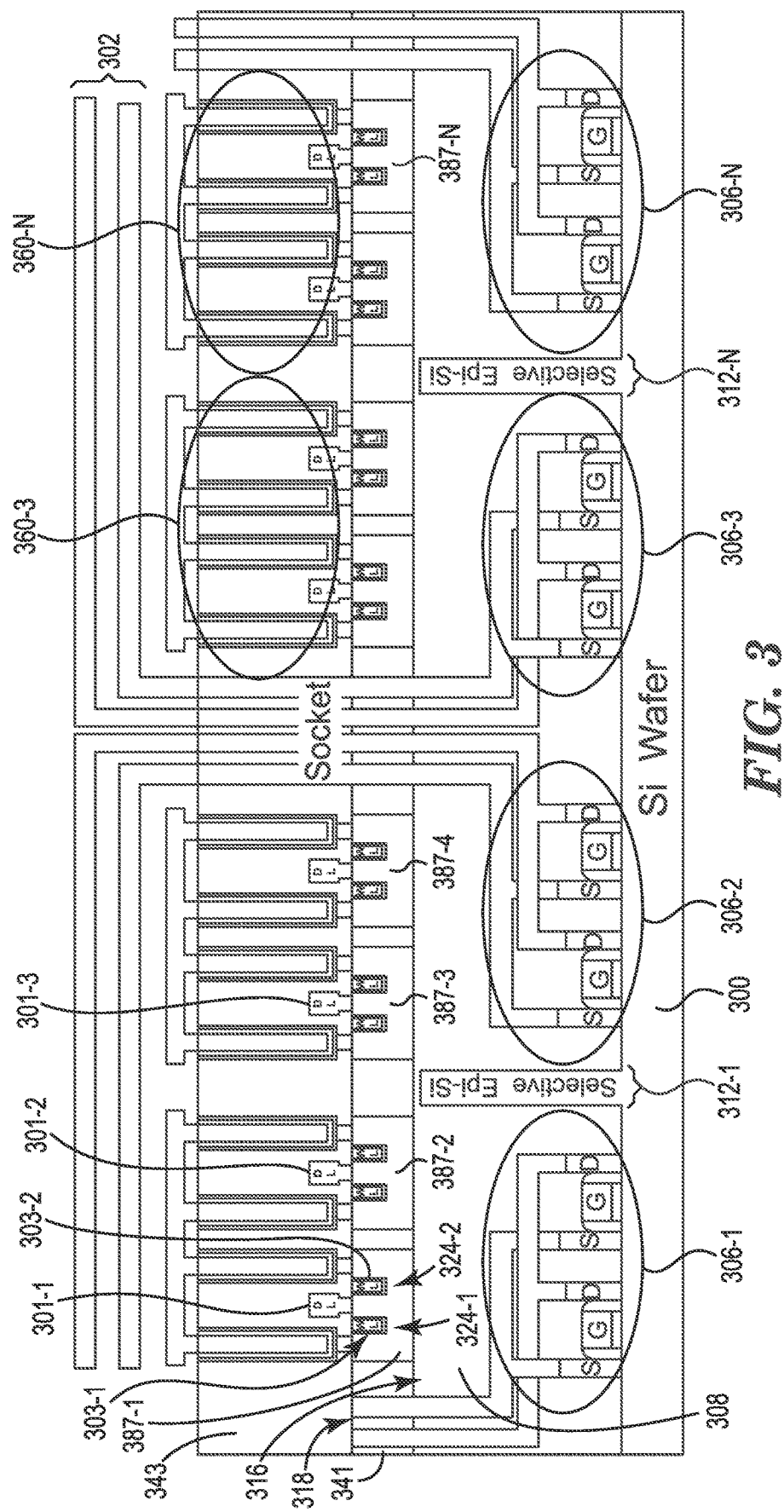
FIG. 3 is a cross-sectional view of a memory array formed over complementary metal oxide semiconductor (CMOS) logic circuity having vertical storage node formed above access devices, in accordance with a number of embodiments of the present disclosure.

FIG. 3 is a cross-sectional view of a memory array formed over complementary metal oxide semiconductor (CMOS) logic circuity, e.g., CMOS under Array (CuA), having vertical storage nodes, 360-1, 360-2, . . . , 360-N, formed above access devices, 324-1, 324-2, . . . , 324-N, in accordance with a number of embodiments of the present disclosure. As shown in the embodiment of FIG. 3, the CMOS under Array (CuA) architecture includes logic circuitry, e.g., CMOS circuitry, formed on a working surface 316, e.g., first working surface 116 shown in FIG. 1, of silicon substrate 300. The logic circuitry 306-1, 306-2, . . . , 306-N, may be encapsulated with an isolation material 308 to form a second working surface second working surface 118 shown in FIG. 1.

As shown in the example embodiment of FIG. 3, single crystalline silicon 387 has been epitaxially grown up through a plurality of vertical openings, 312-1, . . . , 312-N, and growth continued horizontally on a working surface 318 of the isolation material, 308-1 and 308-2, e.g., second working surface 118 in FIG. 1, in a first (D1) 305, a second (D2) 309, and a third (D3) 311 direction to cover the working surface 318. The epitaxially grown single crystalline silicon 387 has been patterned and a portion epitaxially grown single crystalline silicon 387 has been removed to partition distinct and separate third working surface areas, 387-1, 387-2, . . . , 387-N of epitaxially grown single crystalline silicon 387. An isolation material 341, e.g., dielectric material, may be deposited over the distinct and separate third working surface areas, 387-1, 387-2, . . . , 387-N of epitaxially grown single crystalline silicon 387 to form a further working surface.

As shown in the example embodiment of FIG. 3, memory cell components, e.g., access devices 324-1, 324-2, . . . , 324-N, have been formed in the epitaxially grown single crystalline silicon of the third working surface areas, 387-1, . . . , 387-N, including connections to access lines, 303-1, . . . , 303-N, e.g., wordlines (WLs), and digit lines, 301-1, . . . , 301-N, e.g., bitlines (BLs). In one embodiment, the access devices 324-1, 324-2, . . . , 324-N are buried recessed access devices (BRADs). In another embodiment, the access devices 324-1, 324-2, . . . , 324-N are FIN field effect transistor (FINFET) devices. Embodiments, however, are not limited to these examples.

Further, in the example embodiment of FIG. 3, support structure material 343 is formed above the third working surface areas, 387-1, 387-2, . . . , 387-N of epitaxially grown single crystalline silicon 387. According to the example embodiment of FIG. 3, storage nodes, 360-1, 360-2, . . . , 360-N, are formed in the support material 343 above the memory cell components in the third working surface areas, 387-1, 387-2, . . . , 387-N, of epitaxially grown single crystalline silicon 387. In one example, single and/or double-sided, vertical capacitor cells may be formed as the storage nodes, 360-1, 360-2, . . . , 360-N, in the support material 343 above the memory cell components, e.g., access devices, 324-1, . . . , 324-N, in the third working surface areas, 387-1, 387-2, . . . , 387-N of epitaxially grown single crystalline silicon 387. One method example of storage node, 360-1, . . . , 360-N, formation in support material 343 above memory cell components is provided in issued U.S. Pat. No. 10,978,553. Another example of storage node, 360-1, . . . , 360-N, formation in support material 343 above memory cell components is provided in issued U.S. Pat. No. 10,777,561. Embodiments, however, are not limited to these examples. According to the embodiments described herein, the storage nodes, 360-1, 360-2, . . . , 360-N, are formed in the support material 343 above the memory cell components in the third working surface areas, 387-1, 387-2, . . . , 387-N, of epitaxially grown single crystalline silicon 387.

FIG. 4 is a cross-sectional view of a memory array formed over complementary metal oxide semiconductor (CMOS) logic circuity, e.g., CMOS under Array (CuA), in accordance with another number of embodiments of the present disclosure. As shown in the embodiment of FIG. 4, the CMOS under Array (CuA) architecture may include logic circuitry, e.g., CMOS circuitry, formed on a first working surface 416 of silicon substrate 400. The silicon substrate 400 may be formed from a silicon material. An isolation material 408 has been deposited on the working surface 416 to encapsulate the logic circuitry 406-1, 406-2, 406-3, . . . , 406-N, and to form a second working surface 418 above the first working surface 416.

As shown in the example embodiment of FIG. 4, single crystalline silicon ("selective epi-si") 487, shown adjacent the logic circuitry 406, may be epitaxially grown from the first working surface 416 through a plurality of vertical openings 420, towards second working surface 418 and continuing horizontally on the second working surface 418 of the isolation material 408 in a first (D1) 405, a second (D2) 409, and a third (D3) 411 direction. The epitaxially grown single crystalline silicon 487 is grown from the silicon substrate 400 within and through the plurality of vertical openings 420. Additional layers of material may be deposited above the encapsulated logic circuitry 406 on a silicon substrate and/or working surface as described above. The additional layers of materials, as described more in connection with FIG. 10, may include separate layers of a sacrificial material 432, and dielectric material 433.

FIGS. 5A to 5C illustrate an example method, at one stage of a semiconductor fabrication process, for epitaxial single crystalline silicon growth for memory arrays, in accordance with an embodiment shown in FIG. 4. As shown in FIG. 5A, the method includes forming the logic circuity, e.g., 406-1, 406-2, 406-3, . . . , 406-N, in FIG. 4, by patterning, removing, and/or deposition techniques within layers materials on a silicon substrate 500.

Additional layers of material may be deposited above the encapsulated logic circuitry on a silicon substrate and/or working surface as described above. The additional layers of materials, as described more in connection with FIG. 10, may include separate layers of a dielectric material 530-1, a sacrificial material 532, and dielectric material 533-1. However, embodiments are not so limited, the term "dielectric material" may refer to multiple layers of dielectric materials. In one example, the sacrificial material 532 may also be a dielectric material. In another example, the sacrificial material 532 may be a semiconductor material such as a polysilicon semiconductor material. The sacrificial material 532 may be chosen in a material different from dielectric material 530-1 and dielectric material 533-1. The method further comprises using an etchant process to form a plurality of vertical openings in the stack of materials. The plurality of vertical openings may be formed through the stack of materials to the silicon substrate 500.

In one embodiment, the width 524 of the plurality of vertical openings may have a range from 5-20 nm through the stack of materials encapsulated by the isolation material to the silicon substrate 500. The length of the plurality of vertical openings may range from 50-200 nanometers (nm) while the height 526 may range from 10-100 nm. In a second embodiment, the width 524 of the plurality of vertical openings may have a range from 20-100 nm through the stack of materials encapsulated by the isolation material to the silicon substrate 500. The length of the plurality of vertical openings may range from 60-1000 nm while the height 526 may range from 100-500 nm. In another embodiment, the width 524 of the plurality of vertical openings may have a range from 100-500 nm through the stack of materials encapsulated by the isolation material to the silicon substrate 500. The length of the plurality of vertical openings may range from 100-1500 nm while the height 526 may range from 500-1000 nm.

Epitaxially grown single crystalline silicon 587 may be grown vertically through the stack of materials within the plurality of vertical openings. The epitaxially grown single crystalline silicon 587 may be grown vertically from the silicon substrate 500 within the plurality of vertical openings.

As shown in the embodiment of FIG. 5B, the method includes an etching process to remove sacrificial material 532. The etchant may be selective to the sacrificial material (e.g., sacrificial material 532) such that only the sacrificial material is removed from the stack of materials. The sacrificial material may be a material different from the other materials within the stack of materials to aid in the selective etch of the sacrificial material. The etch may be restrained by controlling time, composition of etchant gas, and etch rate of a reactant gas flowed into the vertical opening e.g., rate, concentration, temperature, pressure, and time parameters.

The sacrificial material may be etched from the vertical opening. Horizontal openings 534 may result from the etching process. The horizontal opening may be formed in a first horizontal direction 534-1 and a second horizontal direction 534-2. The selective etch may be isotropic, but selective to the sacrificial material, substantially stopping on the dielectric material 530 and dielectric material 533-1. The isolation material 541 which encapsulated the stack of materials that make up the logic circuitry and the epitaxially grown single crystalline silicon may be unetched.

In one embodiment, the width 586 of the horizontal openings 534 may have a range from 10-80 nanometers (nm), the length 584 of the horizontal openings 534 may range from 100-400 nm while the height 588 may range from 5-10 nm. In a second embodiment, the width 586 of the horizontal openings 534 may have a range from 80-240 nanometers (nm), the length 584 of the horizontal openings 534 may range from 400-1,000 nm while the height 588 may range from 10-50 nm. In another embodiment, the width 586 of the horizontal openings 534 may have a range from 240-1200 nanometers (nm), the length 584 of the horizontal openings 534 may range from 1,000-10,000 nm while the height 588 may range from 50-200 nm.

As shown in FIG. 5C, the method may include epitaxially growing the single crystalline silicon 589-1 to fill the horizontal openings (e.g. horizontal openings 534 in FIG. 5B). For example, the epitaxially grown single crystalline silicon 589-1 may have dielectric material 530-1 on one side and dielectric material 533-1 on a second side. In some embodiments, a gas, e.g., dichlorosilane (DCS) and/or hydrogen chloride (HCl), may be flowed into the horizontal openings to grow the single crystalline silicon 589-1 to fill the horizontal openings.

In some embodiments, the single crystalline silicon 589-1 may be grown in the horizontal openings from the single crystalline silicon 587 in the vertical openings at a temperature in a range of approximately 700-1000° C. The single crystalline silicon 589-1 may be epitaxially grown in in a first horizontal direction (e.g., first horizontal direction 534-1 in FIG. 5B) and a second horizontal direction (e.g., second horizontal direction 534-2 in FIG. 5B). Horizontal epitaxially grown single crystalline silicon 589-1 may be encapsulated by isolation material 541 along with the other materials within the stack of materials.

FIGS. 6A to 6B illustrate a perspective view of a vertical three dimensional (3D) memory, in accordance with a number of embodiments of the present disclosure. In the example embodiment shown in FIG. 6A, the memory comprises alternating layers of a first dielectric material, 630-1, 630-2, . . . , 630-N (collectively referred to as first dielectric material 630), an epitaxially grown single crystalline silicon material, 637-1, 637-2, . . . , 637-N (collectively referred to as epitaxially grown single crystalline silicon material 637), and a second dielectric material, 633-1, 633-2, . . . , 633-N (collectively referred to as second dielectric material 633), in repeating iterations to form a vertical stack on a silicon substrate 600. In some embodiments, at least two (2) repeating iterations of the vertical stack may be formed. In some embodiments, the first dielectric material 630, the epitaxially grown single crystalline silicon material 637, and the second dielectric material 633 may be deposited using a chemical vapor deposition (CVD) process.

In some embodiments, the first dielectric material 630 and the second dielectric material 633 may be interlayer dielectrics (ILD). By way of example, and not by way of limitation, the first dielectric material 630 and the second dielectric material 633 may comprise an oxide material, e.g., $SiO_2$. In another example the first dielectric material 630 and the second dielectric material 633 may comprise a silicon nitride ($Si_3N_4$) material (also referred to herein as "SiN"). In another example the first dielectric material 630 and the second dielectric material 633 may comprise a silicon oxy-carbide (SiOxCy) material. In another example the first dielectric material 630 and the second dielectric material 633, may include silicon oxy-nitride (SiOxNy) material (also referred to herein as "SiON"), and/or combinations thereof. Embodiments are not limited to these examples.

The layers may occur in repeating iterations vertically. In the example of FIG. 6A, five tiers of the repeating iterations are shown. For example, the stack may include: a first dielectric material 630-1, an epitaxially grown single crystalline silicon material 637-1, a second dielectric material 633-1, a third dielectric material 630-2, a second epitaxially grown single crystalline silicon material 637-2, a fourth dielectric material 633-2, a fifth dielectric material 630-3, a third epitaxially grown single crystalline silicon material 637-3, a sixth dielectric material 633-3, a seventh dielectric material 630-4, a fourth epitaxially grown single crystalline silicon material 637-4, an eighth dielectric material 633-4, a ninth dielectric material 630-5, a fifth epitaxially grown single crystalline silicon material 637-5, a tenth dielectric material 633-5, and so on.

A plurality of vertical openings may be formed through the vertical stack to the silicon substrate 600. Single crystalline silicon 687 may be epitaxially grown within the plurality of vertical openings. The epitaxially grown single crystalline silicon 687 may be grown vertically from the silicon substrate 600 within the plurality of vertical openings up the vertical stack. The vertical stack may be encapsulated by an isolation material 641.

In the example embodiment shown in FIG. 6B, vertical word lines 603 (as described in FIG. 3) and horizontal digit lines 601 (as described in FIG. 3) have been formed in the vertical stack. In this example, some embodiments may include forming the vertical word lines and the horizontal digit lines according to a method as described in U.S. patent application Ser. No. 16/943,108, entitled "Digit Line Formation for Horizontally Oriented Access Devices".

FIG. 7 is a block diagram of an apparatus in accordance a number of embodiments of the present disclosure. FIG. 7 illustrates a circuit diagram showing a cell array of a three dimensional (3D) semiconductor memory device according to embodiments of the present disclosure. FIG. 7 illustrates a cell array may have a plurality of sub cell arrays 701-1, 701-2, . . . , 701-N. The sub cell arrays 701-1, 701-2, . . . , 701-N may be arranged along a second direction (D2) 705. Each of the sub cell arrays, e.g., sub cell array 701-2, may include a plurality of access lines 703-1, 703-2, . . . , 703-Q (which also may be referred to a word lines). Also, each of the sub cell arrays, e.g., sub cell array 701-2, may include a plurality of digit lines 707-1, 707-2, . . . , 707-P (which also may be referred to as bit lines, data lines, or sense lines). In FIG. 7, the digit lines 707-1, 707-2, . . . , 707-P are illustrated extending in a first direction (D1) 709 and the access lines 703-1, 703-2, . . . , 703-Q are illustrated extending in a third direction (D3) 711. According to embodiments, the first direction (D1) 709 and the second direction (D2) 705 may be considered in a horizontal ("X-Y") plane. The third direction (D3) 711 may be considered in a vertical ("Z") plane. Hence, according to embodiments described herein, the access lines 703-1, 703-2, . . . , 703-Q are extending in a vertical direction, e.g., third direction (D3) 711.

A memory cell, e.g., memory cell 710, may include an access device, e.g., access transistor, and a storage node, e.g., storage capacitor, located at an intersection of each access line 703-1, 703-2, . . . , 703-Q and each digit line 707-1, 707-2, . . . , 707-P. By way of example, and not by way of limitation, a storage node may include conductive material, such as ferroelectric material. The ferroelectric material may include, but is not limited, to zirconium oxide ($ZrO_2$), hafnium oxide ($HfO_2$), lanthanum oxide ($LaO_2$), and aluminum oxide ($Al_2O_3$), or a combination thereof. Memory cells may be written to, or read from, using the access lines 703-1, 703-2, . . . , 703-Q and digit lines 707-1, 707-2, . . . , 707-P. The digit lines 707-1, 707-2, . . . , 707-P may conductively interconnect memory cells along horizontal columns of each sub cell array 701-, 701-2, . . . , 701-N, and the access lines 703-1, 703-2, . . . , 703-Q may conductively interconnect memory cells along vertical rows of each sub cell array 701-1, 701-2, . . . , 701-N. One memory cell, e.g. 710, may be located between one access line, e.g., 703-2, and one digit line, e.g., 707-2. Each memory cell may be uniquely addressed through a combination of an access line 703-1, 703-2, . . . , 703-Q and a digit line 707-1, 707-2, . . . , 707-P.

The digit lines 707-1, 707-2, . . . , 707-P may be or include conducting patterns (e.g., metal lines) disposed on and spaced apart from a substrate. The digit lines 707-1, 707-2, . . . , 707-P may extend in a first direction (D1) 709. The digit lines 707-1, 707-2, . . . , 707-P in one sub cell array, e.g., 701-2, may be spaced apart from each other in a vertical direction, e.g., in a third direction (D3) 711.

The access lines 703-1, 703-2, . . . , 703-Q may be or include conductive patterns (e.g., metal lines) extending in a vertical direction with respect to the substrate, e.g., in a third direction (D3) 711. The access lines in one sub cell array, e.g., 701-2, may be spaced apart from each other in the first direction (D1) 709.

A gate of a memory cell, e.g., memory cell 710, may be connected to an access line, e.g., 703-2, and a first conductive node, e.g., first source/drain region, of an access device, e.g., transistor, of the memory cell 710 may be connected to a digit line, e.g., 707-2. Each of the memory cells, e.g., memory cell 710, may be connected to a storage node, e.g., capacitor. A second conductive node, e.g., second source/drain region, of the access device, e.g., transistor, of the memory cell 710 may be connected to the storage node, e.g., capacitor. While first and second source/drain region references are used herein to denote two separate and distinct source/drain regions, it is not intended that the source/drain region referred to as the "first" and/or "second" source/drain regions have some unique meaning. It may be intended only that one of the source/drain regions is connected to a digit line, e.g., 707-2, and the other may be connected to a storage node.

FIG. 8 illustrates a perspective view showing a three dimensional (3D) semiconductor memory device, e.g., a portion of a sub cell array 701-2 shown in FIG. 7 as a vertically oriented stack of memory cells in an array, according to some embodiments of the present disclosure. FIG. 9 illustrates a perspective view showing unit cell, e.g., memory cell 710 shown in FIG. 7, of the 3D semiconductor memory device shown in FIG. 8.

As shown in FIG. 8, a substrate 800 may have formed thereon one of the plurality of sub cell arrays, e.g., 701-2, described in connection with FIG. 7. For example, the substrate 800 may be or include a silicon substrate, a germanium substrate, or a silicon-germanium substrate, etc. Embodiments, however, are not limited to these examples.

As shown in the example embodiment of FIG. 8, the silicon substrate 800 may have fabricated thereon a vertically oriented stack of memory cells, e.g., memory cell 710 in FIG. 7, extending in a vertical direction, e.g., third direction (D3) 711. According to some embodiments the vertically oriented stack of memory cells may be fabricated such that each memory cell, e.g., memory cell 710 in FIG. 7, is formed on plurality of vertical levels, e.g., a first level (L1), a second level (L2), and a third level (L3). The repeating, vertical levels, L1, L2, and L3, may be arranged, e.g., "stacked", in a vertical direction, e.g., third direction (D3) 711 shown in FIG. 7, and separated from the silicon substrate 800 by an insulator material 820. Each of the repeating, vertical levels, L1, L2, and L3 may include a plurality of discrete components, e.g., regions, to the laterally oriented access devices 830, e.g., transistors, and storage nodes, e.g., capacitors, including access line 803-1, 803-2, . . . , 803-Q connections and digit line 807-1, 807-2, . . . , 807-P connections. The plurality of discrete components to the laterally oriented access devices 830, e.g., transistors, may be formed in a plurality of iterations of vertically, repeating layers within each level, as described in more detail below in connection with FIGS. 13A-13I and 14A-14E and may extend horizontally in the second direction (D2) 805, analogous to second direction (D2) 705 shown in FIG. 7.

The plurality of discrete components to the laterally oriented access devices 830, e.g., transistors, may include a first source/drain region 821 and a second source/drain region 823 separated by a channel and body region 825, extending laterally in the second direction (D2) 805, and formed in a body of the access devices. In some embodiments, the channel region 825 may include silicon, germanium, silicon-germanium, and/or indium gallium zinc oxide (IGZO). In some embodiments, the first and the second source/drain regions, 821 and 823, can include an n-type dopant region formed in a p-type doped body to the access device to form an n-type conductivity transistor. In some embodiments, the first and the second source/drain regions, 821 and 823, may include a p-type dopant formed within an n-type doped body to the access device to form a p-type conductivity transistor. By way of example, and not by way of limitation, the n-type dopant may include Phosphorous (P) atoms and the p-type dopant may include atoms of Boron (B) formed in an oppositely doped body region of a semiconductor material. Embodiments, however, are not limited to these examples.

The storage node 827, e.g., capacitor, may be connected to one respective end of the access device. As shown in FIG. 8, the storage node 827, e.g., capacitor may be connected to the second source/drain region 823 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell, e.g., memory cell 710 in FIG. 7, may similarly extend in the second direction (D2) 805, analogous to second direction (D2) 705 shown in FIG. 7.

As shown in FIG. 8, a plurality of horizontally oriented digit lines 807-1, 807-2, . . . , 807-P extend in the first direction (D1) 809, analogous to the first direction (D1) 709 in FIG. 7. The plurality of horizontally oriented digit lines 807-1, 807-2, . . . , 807-P may be analogous to the digit lines 707-1, 707-2, . . . , 707-P shown in FIG. 7. The plurality of horizontally oriented digit lines 807-1, 807-2, . . . , 807-P may be arranged, e.g., "stacked", along the third direction (D3) 811. The plurality of horizontally oriented digit lines 807-1, 807-2, . . . , 807-P may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), etc., and/or a metal-semiconductor compound, e.g., tungsten silicide, cobalt silicide, silver silicide, titanium silicide, etc. Embodiments, however, are not limited to these examples.

Among each of the vertical levels, (L1) 813-1, (L2) 813-2, and (L3) 813-M, the horizontally oriented memory cells, e.g., memory cell 710 in FIG. 7, may be spaced apart from one another horizontally in the first direction (D1) 809. However, as described in more detail below in connection with FIGS. 10A-10E, the plurality of discrete components to the laterally oriented access devices 830, e.g., first source/drain region 821 and second source/drain region 823 separated by a channel and body region 825, extending laterally in the second direction (D2) 805, and the plurality of horizontally oriented digit lines 807-1, 807-2, . . . , 807-P extending laterally in the first direction (D1) 809, may be formed within different vertical layers within each level. For example, the plurality of horizontally oriented digit lines 807-1, 807-2, . . . , 807-P, extending in the first direction (D1) 809, may be disposed on, and in electrical contact with, top surfaces of first source/drain regions 821 and orthogonal to laterally oriented access devices 830, e.g., transistors, extending laterally in the second direction (D2) 805. In some embodiments, the plurality of horizontally oriented digit lines 807-1, 807-2, . . . , 807-P, extending in the first direction (D1) 809 are formed in a higher vertical layer, farther from the silicon substrate 800, within a level, e.g., within level (L1), than a layer in which the discrete components, e.g., first source/drain region 821 and second source/drain region 823 separated by a channel and body region 825, of the laterally oriented access device are formed. In some embodiments, the plurality of horizontally oriented digit lines 807-1, 807-2, . . . , 807-P, extending in the first direction (D1) 809, may be connected to the top surfaces of the first source/drain regions 821 directly and/or through additional contacts including metal silicides.

As shown in the example embodiment of FIG. 8, the access lines, 803-1, 803-2, . . . , 803-Q, extend in a vertical direction with respect to the silicon substrate 800, e.g., in a third direction (D3) 811. Further, as shown in FIG. 8, the access lines, 803-1, 803-2, . . . , 803-Q, in one sub cell array, e.g., sub cell array 701-2 in FIG. 7, may be spaced apart from each other in the first direction (D1) 809. The access lines, 803-1, 803-2, . . . , 803-Q, may be provided, extending vertically relative to the silicon substrate 800 in the third direction (D3) 811 between a pair of the laterally oriented access devices 830, e.g., transistors, extending laterally in the second direction (D2) 805, but adjacent to each other on a level, e.g., first level (L1), in the first direction (D1) 809. Each of the access lines, 803-1, 803-2, . . . , 803-Q, may vertically extend, in the third direction (D3) 811, on sidewalls of respective ones of the plurality of laterally oriented access devices 830, e.g., transistors, that are vertically stacked.

For example, and as shown in more detail in FIG. 9, a first one of the vertically extending access lines, e.g., 803-1, may be adjacent a sidewall of a channel and body region 825 to a first one of the laterally oriented access devices 830, e.g., transistors, in the first level (L1) 813-1, a sidewall of a channel and body region 825 of a first one of the laterally oriented access devices 830, e.g., transistors, in the second level (L2) 813-2, and a sidewall of a channel and body region 825 of a first one of the laterally oriented access devices 830, e.g., transistors, in the third level (L3) 813-M, etc. Similarly, a second one of the vertically extending access lines, e.g., 803-2, may be adjacent a sidewall to a channel and body region 825 of a second one of the laterally oriented access devices 830, e.g., transistors, in the first level (L1) 813-1, spaced apart from the first one of laterally oriented access devices 830, e.g., transistors, in the first level (L1) 813-1 in the first direction (D1) 809. And the second one of the vertically extending access lines, e.g., 803-2, may be adjacent a sidewall of a channel and body region 825 of a second one of the laterally oriented access devices 830, e.g., transistors, in the second level (L2) 813-2, and a sidewall of a channel and body region 825 of a second one of the laterally oriented access devices 830, e.g., transistors, in the third level (L3) 813-M, etc. Embodiments are not limited to a particular number of levels.

The vertically extending access lines, 803-1, 803-2, ..., 803-Q, may include a conductive material, such as, for example, one of a doped semiconductor material, a conductive metal nitride, metal, and/or a metal-semiconductor compound. The access lines, 803-1, 803-2, ..., 803-Q, may correspond to word lines (WL) described in connection with FIG. 7.

As shown in the example embodiment of FIG. 8, a conductive body contact 850 may be formed extending in the first direction (D1) 809 along an end surface of the laterally oriented access devices 830, e.g., transistors, in each level (L1) 813-1, (L2) 813-2, and (L3) 813-M above the silicon substrate 800. The body contact 850 may be connected to a body 826, e.g., body region, of the laterally oriented access devices 830, e.g., transistors, in each memory cell, e.g., memory cell 710 in FIG. 7. The body contact 850 may include a conductive material such as, for example, one of a doped semiconductor material, a conductive metal nitride, metal, and/or a metal-semiconductor compound.

Although not shown in FIG. 8, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

FIG. 9 illustrates in more detail a unit cell, e.g., memory cell 710 in FIG. 7, of the vertically stacked array of memory cells, e.g., within a sub cell array 701-2 in FIG. 7, according to some embodiments of the present disclosure. As shown in FIG. 9, the first and the second source/drain regions, 921 and 923, may be impurity doped regions to the horizontally oriented access devices 930, e.g., transistors. The first and the second source/drain regions, 921 and 923, may be analogous to the first and the second source/drain regions 821 and 823 shown in FIG. 8. The first and the second source/drain regions, 921 and 923 may be separated by a channel and body region 925 formed in a body of semiconductor material, e.g., body region 926, of the horizontally oriented access devices 930, e.g., transistors. The first and the second source/drain regions, 921 and 923, may be formed from an n-type or p-type dopant doped in the body region 926. Embodiments are not so limited.

For example, for an n-type conductivity transistor construction, the body region 926 of the horizontally oriented access devices 930, e.g., transistors, may be formed of a low doped (p–) p-type semiconductor material. In one embodiment, the body region 926 and the channel 925 separating the first and the second source/drain regions, 921 and 923, may include a low doped, p-type (e.g., low dopant concentration (p–)) silicon material consisting of Boron (B) atoms as an impurity dopant to the crystalline silicon. In this example, the first and the second source/drain regions, 921 and 921, may include a high dopant concentration, n-type conductivity impurity (e.g., high dopant (n+)) doped in the first and the second source/drain regions, 921 and 923. In some embodiments, the high dopant, n-type conductivity first and second drain regions 921 and 923 may include a high concentration of Phosphorus (P) atoms deposited therein. Embodiments, however, are not limited to this example. In other embodiments, the horizontally oriented access devices 930, e.g., transistors, may be of a p-type conductivity construction in which case the impurity, e.g., dopant, conductivity types would be reversed.

As shown in the example embodiment of FIG. 9, the first source/drain region 921 may occupy an upper portion in the body 926 of the horizontally oriented access devices 930, e.g., transistors. For example, the first source/drain region 921 may have a bottom surface 924 within the body 926 of the horizontally oriented access device 930 which is located higher, vertically in the third direction (D3) 911, than a bottom surface of the body 926 of the laterally, horizontally oriented access device 930. As such, the laterally, horizontally oriented transistor 930 may have a body portion 926 which is below the first source/drain region 921 and is in electrical contact with the body contact, e.g., 850 shown in FIG. 8. Further, as shown in the example embodiment of FIG. 9, a digit line, e.g., 907-1, analogous to the digit lines 807-1, 807-2, ..., 807-P in FIGS. 8 and 707-1, 707-2, ..., 707-P shown in FIG. 7, may be disposed on a top surface 922 of the first source/drain region 921 and electrically coupled thereto.

As shown in the example embodiment of FIG. 9, an access line, e.g., 903-1, analogous to the access lines 803-1, 803-2, ..., 803-Q in FIGS. 8 and 703-1, 703-2, ..., 703-Q in FIG. 7, may be vertically extending in the third direction (D3) 911 adjacent the sidewall of the channel region 925 portion of the body 926 to the horizontally oriented access devices 930, e.g., transistors horizontally conducting between the first and the second source/drain regions 921 and 923 along the second direction (D2) 905. A gate dielectric material 904 may be interposed between the access line 903-1 (a portion thereof forming a gate to the horizontally oriented access devices 930, e.g., transistors) and the channel region 925. The gate dielectric material 904 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 904 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

FIG. 10 is a cross-sectional view for an example method for forming arrays of vertically stacked memory cells, at one stage of a semiconductor fabrication process, with epitaxial single crystalline silicon growth for a horizontal access device, in accordance with a number of embodiments of the present disclosure.

In the example embodiment shown in FIG. 10, the method comprises depositing alternating layers of a first dielectric material, 1030-1, 1030-2, ..., 1030-N (collectively referred to as first dielectric material 1030), a semiconductor material, 1032-1, 1032-2, ..., 1032-N (collectively referred to as semiconductor material 1032), and a second dielectric material, 1033-1, 1033-2, ..., 1033-N (collectively referred to as second dielectric 1033), in repeating iterations to form a vertical stack 1001 on an insulator material 1020 and a working surface of a semiconductor substrate 1000. In some embodiments, at least two (2) repeating iterations of the vertical stack 1001 may be formed to form the vertical stack 1001 to a height in a range of twenty (20) nm to three hundred (300) nm. In some embodiments, the first dielectric material 1030, the semiconductor material 1032, and the second dielectric material 1033 may be deposited using a chemical vapor deposition (CVD) process. In one embodiment, the first dielectric material 1030 can be deposited to have a thickness, e.g., vertical height in the third direction (D3), in a range of twenty (20) nanometers (nm) to sixty (60) nm. In one embodiment, the semiconductor material 1032 can be deposited to have a thickness, e.g., vertical height, in a range of twenty (20) nm to one hundred and fifty (150) nm. In one embodiment, the second dielectric material 1033 can be deposited to have a thickness, e.g., vertical height, in a range of ten (10) nm to thirty (30) nm. Embodiments, however, are not limited to these examples. As shown in FIG. 10, a vertical direction 1011 is illustrated as a third direction (D3), e.g., z-direction in an x-y-z coordinate system, analogous to the third direction (D3) 711 among first, second, and third directions, shown in FIGS. 7-9.

In some embodiments, the first dielectric material, 1030-1, 1030-2, . . . , 1030-N, may be an interlayer dielectric (ILD). By way of example, and not by way of limitation, the first dielectric material, 1030-1, 1030-2, . . . , 1030-N, may comprise an oxide material, e.g., $SiO_2$. In another example the first dielectric material, 1030-1, 1030-2, . . . , 1030-N, may comprise a silicon nitride ($Si_3N_4$) material (also referred to herein as "SiN"). In another example the first dielectric material, 1030-1, 1030-2, . . . , 1030-N, may comprise a silicon oxy-carbide ($SiO_xC_y$) material. In another example the first dielectric material, 1030-1, 1030-2, . . . , 1030-N, may include silicon oxy-nitride ($SiO_xN_y$) material (also referred to herein as "SiON"), and/or combinations thereof. Embodiments are not limited to these examples.

In some embodiments the semiconductor material, 1032-1, 1032-2, . . . , 1032-N, may comprise a silicon (Si) material. The semiconductor material, 1032-1, 1032-2, . . . , 1032-N, may be a low doped, p-type (p−) silicon material. The semiconductor material, 1032-1, 1032-2, . . . , 1032-N, may be formed by gas phase doping boron atoms (B), as an impurity dopant, at a low concentration to form the low doped, p-type (p−) silicon material. In some embodiments, the semiconductor material 1032-1, 1032-2, . . . , 1032-N may be formed by gas phase doping boron atoms (B) in-situ. The low doped, p-type (p−) silicon material may be an amorphous silicon material. Embodiments, however, are not limited to these examples. In other embodiments, the semiconductor material, 1032-1, 1032-2, . . . , 1032-N, may comprise a silicon (Si) material in a polycrystalline and/or amorphous state.

In some embodiments, the second dielectric material, 1033-1, 1033-2, . . . , 1033-N, may be an interlayer dielectric (ILD). By way of example, and not by way of limitation, the second dielectric material, 1033-1, 1033-2, . . . , 1033-N, may comprise a nitride material. The nitride material may be a silicon nitride ($Si_3N_4$) material (also referred to herein as "SiN"). In another example the second dielectric material, 1033-1, 1033-2, . . . , 1033-N, may comprise a silicon oxy-carbide (SiOC) material. In another example the second dielectric material, 1033-1, 1033-2, . . . , 1033-N, may include silicon oxy-nitride (SiON), and/or combinations thereof. Embodiments are not limited to these examples. However, according to embodiments, the second dielectric material, 1033-1, 1033-2, . . . , 1033-N, is purposefully chosen to be different in material or composition than the first dielectric material, 1030-1, 1030-2, . . . , 1030-N, such that a selective etch process may be performed on one of the first and second dielectric layers, selective to the other one of the first and the second dielectric layers, e.g., the second SiN dielectric material, 1033-1, 1033-2, . . . , 1033-N, may be selectively etched relative to the semiconductor material, 1032-1, 1032-2, . . . , 1032-N, and a first oxide dielectric material, 1030-1, 1030-2, . . . , 1030-N.

Again, the repeating iterations of alternating first dielectric material, 1030-1, 1030-2, . . . , 1030-N layers, semiconductor material, 1032-1, 1032-2, . . . , 1032-N layers, and second dielectric material, 1033-1, 1033-2, . . . , 1033-N layers may be deposited according to a semiconductor fabrication process such as chemical vapor deposition (CVD) in a semiconductor fabrication apparatus. Embodiments, however, are not limited to this example and other suitable semiconductor fabrication techniques may be used to deposit the alternating layers of a first dielectric material, a semiconductor material, and a second dielectric material, in repeating iterations to form the vertical stack 1001. In some embodiments, instead of depositing a first dielectric material, 1030-1, 1030-2, . . . , 1030-N, a semiconductor material, 1032-1, 1032-2, . . . , 1032-N, and a second dielectric material, 1033-1, 1033-2, . . . , 1033-N to form the vertical stack 1001, a first dielectric material, a second dielectric material, and a third dielectric material may be deposited to form the vertical stack.

The layers may occur in repeating iterations vertically. In the example of FIG. 10A, three tiers, numbered 1, 2, and 3, of the repeating iterations are shown. For example, the stack may include: a first dielectric material 1030-1, a semiconductor material 1032-1, a second dielectric material 1033-1, a third dielectric material 1030-2, a second semiconductor material 1032-2, a fourth dielectric material 1033-2, a fifth dielectric material 1030-3, a third semiconductor material 1032-3, and a sixth dielectric material 1033-3. As such, a stack may include: a first oxide material 1030-1, a first semiconductor material 1032-1, a first nitride material 1033-1, a second oxide material 1030-2, a second semiconductor material 1032-2, a second nitride material 1033-2, a third oxide material 1030-3, a third semiconductor material 1032-3, and a third nitride material 1033-3 in further repeating iterations. Embodiments, however, are not limited to this example and more or fewer repeating iterations may be included.

FIG. 11A illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 11A illustrates a top down view of a semiconductor structure, at a particular point in time, in a semiconductor fabrication process, according to one or more embodiments. In the example embodiment shown in the example of FIG. 11A, the method comprises using an etchant process to form a plurality of first vertical openings 1115, having a horizontal direction (D1) 1109 and a second horizontal direction (D2) 1105, through the vertical stack to the substrate. In one example, as shown in FIG. 11A, the plurality of first vertical openings 1115 are extending predominantly in the second horizontal direction (D2) 1105 and may form elongated vertical, pillar columns 1113 with sidewalls 1114 in the vertical stack.

FIG. 11B is a cross sectional view, taken along cut-line A-A' in FIG. 11A, showing another view of the semiconductor structure at a particular time in the semiconductor fabrication process, in accordance with a number of embodiments of the present disclosure. The cross sectional view shown in FIG. 11B shows the repeating iterations of alternating layers of a first dielectric material, 1130-1, 1130-2, . . . , 1130-(N+1), a semiconductor material, 1132-1, 1132-2, . . . , 1132-N, and a second dielectric material, 1133-1, 1133-2, . . . , 1133-N, on an insulator material 1120 and a semiconductor substrate 1100 to form the vertical stack, e.g., 1001 as shown in FIG. 10. FIG. 11B illustrates that a conductive material, 1140-1, 1140-2, . . . , 1140-4, may be formed on a gate dielectric material 1138 in the plurality of vertical openings, e.g., first vertical openings 1115 shown in FIG. 11A. By way of example and not by way of limitation, a gate dielectric material 1138 may be conformally deposited in the plurality of first vertical openings 1115 using a chemical vapor deposition (CVD) process, plasma enhanced CVD (PECVD), atomic layer deposition (ALD), or other suitable deposition process, to cover a bottom surface and the vertical sidewalls of the plurality of first vertical openings 1115. The gate dielectric 1138 may be deposited to a particular thickness (t1) as suited to a particular design rule, e.g., a gate dielectric thickness of approximately 10 nanometers (nm). Embodiments, however, are not limited to this example. By way of example, and not by way of limitation, the gate dielectric 1138 may comprise a silicon dioxide ($SiO_2$) material, aluminum oxide ($Al_2O_3$) material, high dielectric constant (k), e.g., high-k, dielectric material, and/or combinations thereof as also described in FIG. 9.

Further, as shown in FIG. 11B, a conductive material, 1140-1, 1140-2, ..., 1140-4, may be conformally deposited in the plurality of vertical openings on a surface of the gate dielectric material 1138. By way of example, and not by way of limitation, the conductive material, 1140-1, 1140-2, ..., 1140-4, may be conformally deposited in the plurality of vertical openings on a surface of the gate dielectric material 1138 using a chemical vapor deposition process (CVD), plasma enhanced CVD (PECVD), atomic layer deposition (ALD), or other suitable deposition process, to cover a bottom surface and the vertical sidewalls of the plurality of vertical openings over the gate dielectric 1138. The conductive material, 1140-1, 1140-2, ..., 1140-4, may be conformally deposited to a particular thickness (t2) to form vertically oriented access lines, such as shown as access lines 703-1, 703-2, ..., 703-Q (which also may be referred to a word lines) shown in FIGS. 7, et. seq., and as suited to a particular design rule. For example, the conductive material, 1140-1, 1140-2, ..., 1140-4, may be conformally deposited to a thickness of approximately 20 nanometers (nm). Embodiments, however, are not limited to this example. By way of example, and not by way of limitation, the conductive material, 1140-1, 1140-2, ..., 1140-4, may be comprise a metal such as tungsten (W), metal composition, titanium nitride (TiN), doped amorphous silicon, and/or some other combination thereof.

As shown in FIG. 11B, the conductive material, 1140-1, 1140-2, ..., 1140-4, may be recessed back to remain only along the vertical sidewalls of the elongated vertical, pillar columns, now shown as 1142-1, 1142-2, and 1142-3 in the cross-sectional view of FIG. 11B. The plurality of separate, vertical access lines formed from the conductive material, 1140-1, 1140-2, ..., 1140-4, may be recessed back by using a suitable selective, anisotropic etch process to remove the conductive material, 1140-1, 1140-2, ..., 1140-4, from a bottom surface of the first vertical openings, e.g., 1115 in FIG. 11A, exposing the gate dielectric 1138 on the bottom surface to form separate, vertical access lines, 1140-1, 1140-2, ..., 1140-4. As shown in FIG. 11B, a dielectric material 1139, such as an oxide or other suitable spin on dielectric (SOD), may then be deposited in the vertical openings, using a process such as CVD, to fill the vertical openings. Similar semiconductor process techniques may be used at other points of the semiconductor fabrication process described herein.

Figure 12A:
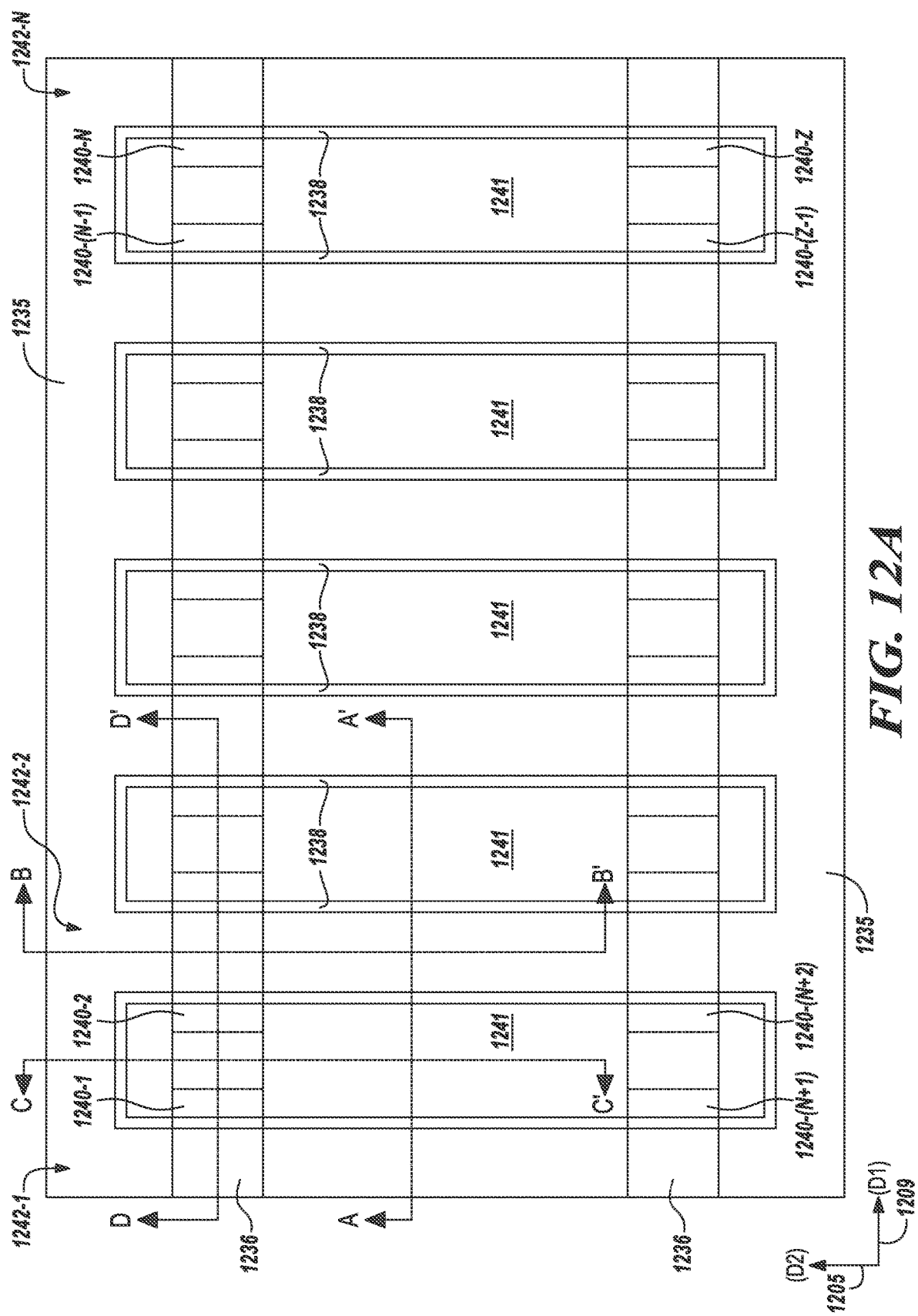

FIG. 12A illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 12A illustrates a top down view of a semiconductor structure, at a particular point in time, in a semiconductor fabrication process, according to one or more embodiments. In the example embodiment of FIG. 12A, the method comprises using a photolithographic process to pattern the photolithographic mask 1236, 1136 in FIG. 11B. The method in FIG. 12A, further illustrates using a selective, isotropic etchant process to remove portions of the exposed conductive material, 1240-1, 1240-2, ..., 1240-N, 1240-(N+1), ..., 1240-(Z-1), and 1240-Z, to separate and individually form the plurality of separate, vertical access lines, 1240-1, 1240-2, ..., 1240-N, 1240-(N+1), ..., 1240-(Z-1), and 1240-Z, e.g., access lines 703-1, 703-2, ..., 703-Q in FIGS. 7, et. seq. Hence the plurality of separate, vertical access lines, 1240-1, 1240-2, ..., 1240-N, 1240-(N+1), ..., 1240-(Z-1), and 1240-Z, are shown along the sidewalls of the elongated vertical, pillar columns, 1242-1, 1242-2, ..., 1242-N.

As shown in the example of FIG. 12A, the exposed conductive material, 1240-1, 1240-2, ..., 1240-N, 1240-(N+1), ..., 1240-(Z-1), and 1240-Z, may be removed back to the gate dielectric material 1238, in the first vertical openings, e.g., 1115 in FIG. 11A, using a suitable selective, isotropic etch process. As shown in FIG. 12A, a subsequent dielectric material 1241, such as an oxide or other suitable spin on dielectric (SOD), may then be deposited to fill the remaining openings from where the exposed conductive material, 1240-1, 1240-2, ..., 1240-N, 1240-(N+1) ..., 1240-(Z-1), and 1240-Z, was removed using a process such as CVD, or other suitable technique. Embodiments, however, are not limited to these process examples.

FIG. 12B illustrates a cross sectional view, taken along cut-line A-A' in FIG. 12A, showing another view of the semiconductor structure at this particular point in one example semiconductor fabrication process of an embodiment of the present disclosure. The cross sectional view shown in FIG. 12B is away from the plurality of separate, vertical access lines, 1240-1, 1240-2, ..., 1240-N, 1240-(N+1), ..., 1240-(Z-1), and shows the repeating iterations of alternating layers of a first dielectric material, 1230-1, 1230-2, ..., 1230-(N+1), a semiconductor material, 1232-1, 1232-2, ..., 1232-N, and a second dielectric material, 1233-1, 1233-2, ..., 1233-N, on an insulator material 1220 and a semiconductor substrate 1200 to form the vertical stack, e.g. 1001 as shown in FIG. 10. As shown in FIG. 12B, a vertical direction 1211 is illustrated as a third direction (D3), e.g., z-direction in an x-y-z coordinate system, analogous to the third direction (D3) 711, among first, second and third directions, shown in FIGS. 7-9. The plane of the drawing sheet, extending right and left, is in a first direction (D1) 1209. In the example embodiment of FIG. 12B, the dielectric material 1241 is shown filling the vertical openings on the residual gate dielectric 1238 deposition.

Figure 12C:
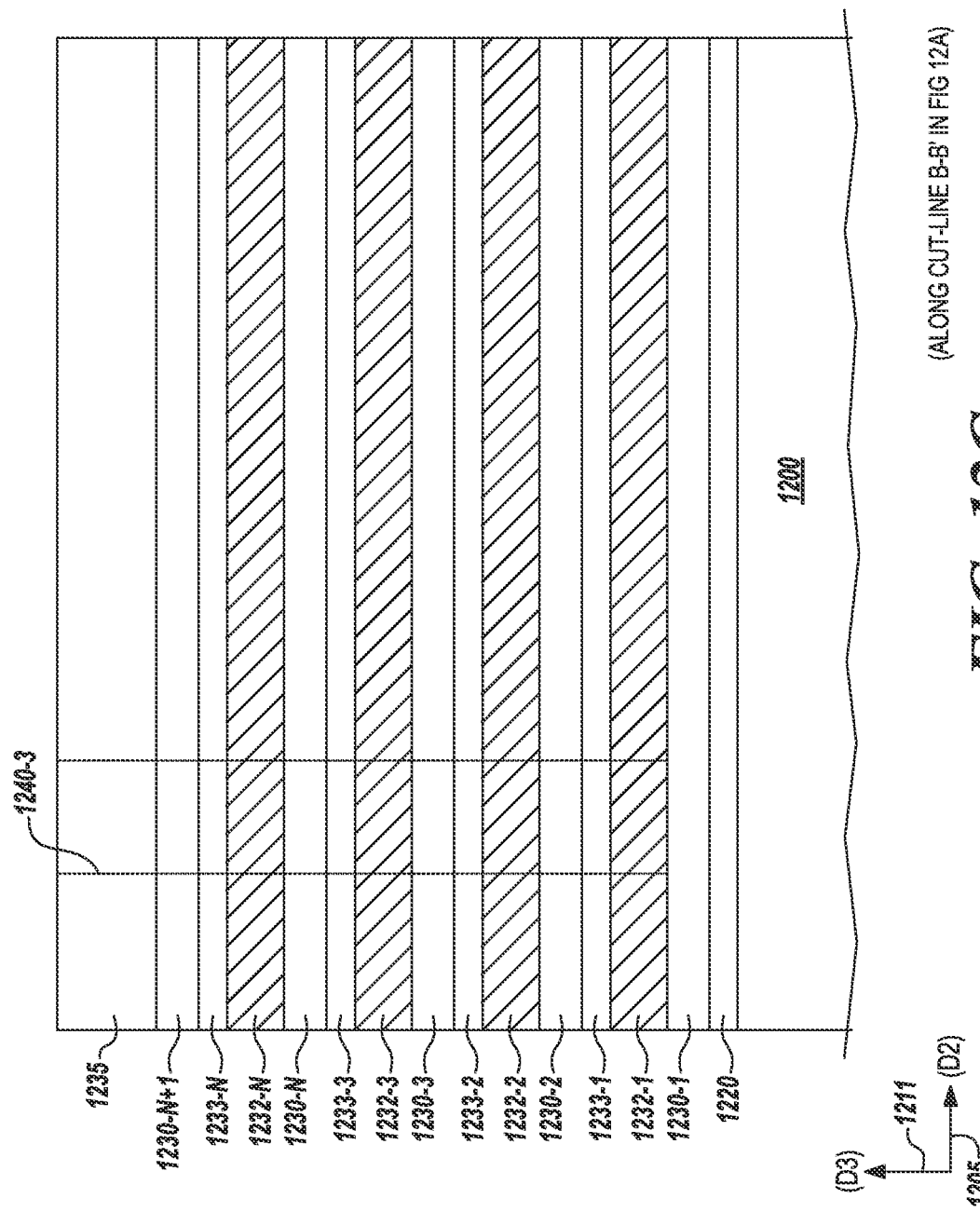

FIG. 12C illustrates a cross sectional view, taken along cut-line B-B' in FIG. 12A, showing another view of the semiconductor structure at this particular point in one example semiconductor fabrication process of an embodiment of the present disclosure. The cross sectional view shown in FIG. 12C is illustrated extending in the second direction (D2) 1205 along an axis of the repeating iterations of alternating layers of a first dielectric material, 1230-1, 1230-2, ..., 1230-(N+1), a semiconductor material, 1232-1, 1232-2, ..., 1232-N, and a second dielectric material, 1233-1, 1233-2, ..., 1233-N, along and in which the horizontally oriented access devices and horizontally oriented storage nodes, e.g., capacitor cells, can be formed within the layers of semiconductor material, 1232-1, 1232-2, . . . , 1232-N. In FIG. 12C, a neighboring, opposing vertical access line 1240-3 is illustrated by a dashed line indicating a location set in from the plane and orientation of the drawing sheet.

FIG. 12D illustrates a cross sectional view, taken along cut-line C-C' in FIG. 12A, showing another view of the semiconductor structure at this particular point in one example semiconductor fabrication process of an embodiment of the present disclosure. The cross sectional view shown in FIG. 12D is illustrated extending in the second direction (D2) 1205 along an axis of the repeating iterations of alternating layers of a first dielectric material, 1230-1, 1230-2, . . . , 1230-(N+1), a semiconductor material, 1232-1, 1232-2, . . . , 1232-N, and a second dielectric material, 1233-1, 1233-2, . . . , 1233-N, outside of a region in which the horizontally oriented access devices and horizontally oriented storage nodes, e.g., capacitor cells, will be formed within the layers of semiconductor material, 1232-1, 1232-2, . . . , 1232-N. In FIG. 12D, the dielectric material 1241 is shown filling the space between the horizontally oriented access devices and horizontally oriented storage nodes, which can be spaced along a third direction (D3) 1211, extending into and out from the plane of the drawings sheet, for a three dimensional array of vertically oriented memory cells. At the left end of the drawing sheet is shown the repeating iterations of alternating layers of a first dielectric material, 1230-1, 1230-2, . . . , 1230-(N+1), a semiconductor material, 1232-1, 1232-2, . . . , 1232-N, and a second dielectric material, 1233-1, 1233-2, . . . , 1233-N, at which location a horizontally oriented digit line, e.g., digit lines 707-1, 707-2, . . . , 707-P shown in FIG. 7, et. seq., can be integrated to form electrical contact with the second source/drain regions or digit line conductive contact material, described in more detail below.

Figure 12E:
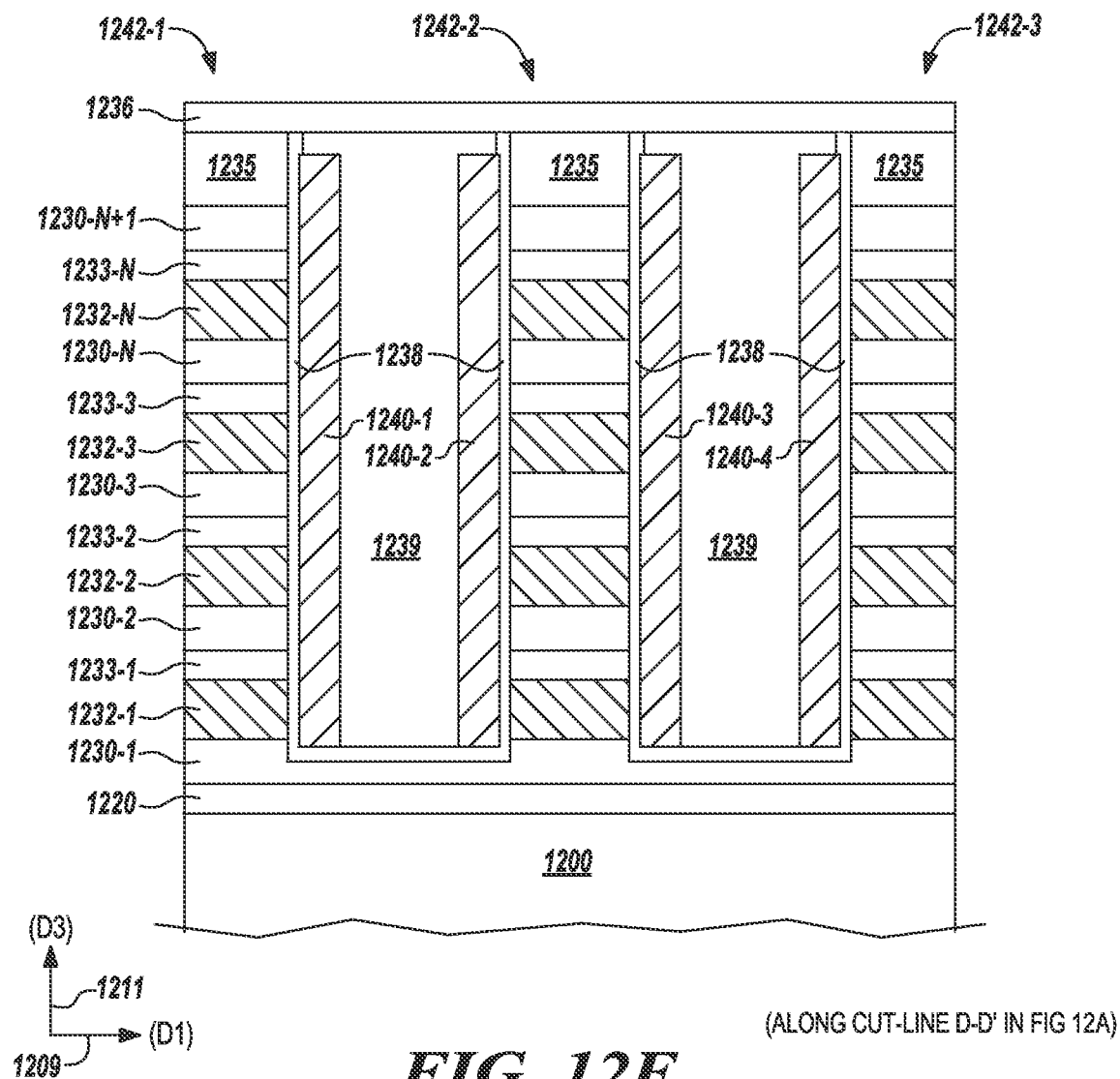

FIG. 12E illustrates a cross sectional view, taken along cut-line D-D' in FIG. 12A, showing another view of the semiconductor structure at this particular point in one example semiconductor fabrication process of an embodiment of the present disclosure. The cross sectional view shown in FIG. 12E is illustrated, right to left in the plane of the drawing sheet, extending in the first direction (D1) 1209 along an axis of the repeating iterations of alternating layers of a first dielectric material, 1230-1, 1230-2, . . . , 1230-(N+1), a semiconductor material, 1232-1, 1232-2, . . . , 1232-N, and a second dielectric material, 1233-1, 1233-2, . . . , 1233-N, intersecting across the plurality of separate, vertical access lines, 1240-1, 1240-2, 1240-3, 1240-4, and intersecting regions of the semiconductor material, 1232-1, 1232-2, . . . , 1232-N, in which a channel and body region may be formed, separated from the plurality of separate, vertical access lines, 1240-1, 1240-2, -3, 1240-4, by the gate dielectric 1238. In FIG. 12E, the first dielectric fill material 1239 is shown separating the space between neighboring horizontally oriented access devices and horizontally oriented storage nodes, which may be formed extending into and out from the plane of the drawing sheet as described in more detail below, and can be spaced along a first direction (D1) 1209 and stacked vertically in arrays extending in the third direction (D3) 1211 in the three dimensional (3D) memory.

Figure 13A:
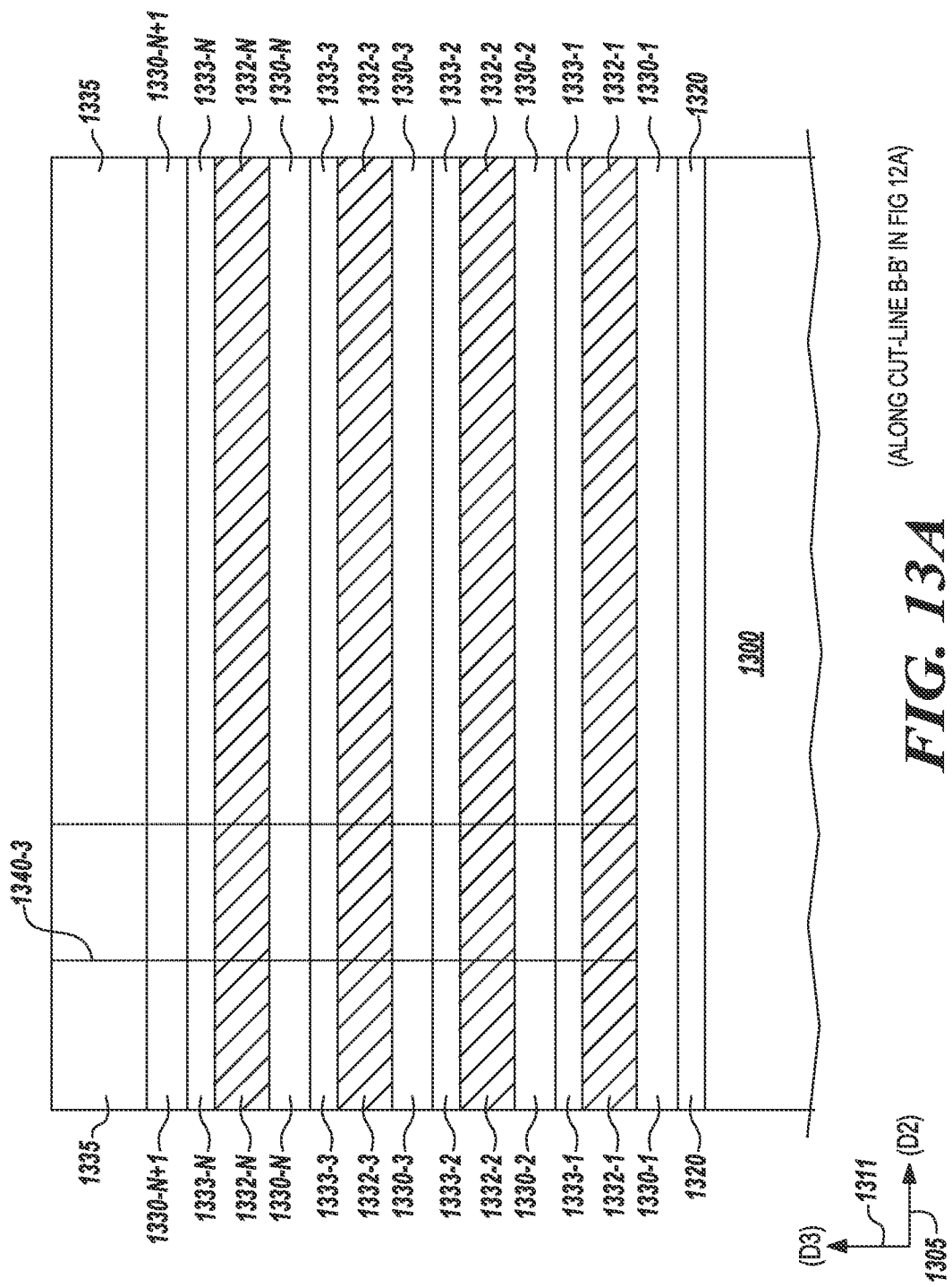

FIG. 13A illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 13A illustrates a cross sectional view, taken along cut-line B-B' in FIG. 12A, showing another view of the semiconductor structure at this particular point in one example semiconductor fabrication process of an embodiment of the present disclosure.

The cross sectional view shown in FIG. 13A is illustrated extending in the second direction (D2) 1305 along an axis of the repeating iterations of alternating layers of a first dielectric material, 1330-1, 1330-2, . . . , 1330-(N+1), a semiconductor material, 1332-1, 1332-2, . . . , 1332-N, and a second dielectric material, 1333-1, 1333-2, . . . , 1333-N, along and in which the horizontally oriented access devices and horizontally oriented storage nodes, e.g., capacitor cells, can be formed within the layers of semiconductor material, 1332-1, 1332-2, . . . , 1332-N. The repeating iterations of alternating layers of the first dielectric material, 1330-1, 1330-2, . . . , 1330-(N+1), the semiconductor material, 1332-1, 1332-2, . . . , 1332-N, and the second dielectric material, 1333-1, 1333-2, . . . , 1333-N, may be formed on an insulator material 1320 and a semiconductor substrate 1300. In FIG. 13A, a neighboring, opposing vertical access line 1340-3 is illustrated by a dashed line indicating a location set in from the plane and orientation of the drawing sheet.

As described in FIG. 10, the first dielectric material, 1330-1, 1330-2, . . . , 1330-(N+1), may comprise an oxide material or a nitride material. In some embodiments, the first dielectric material, 1330-1, 1330-2, . . . , 1330-(N+1), may be formed to a vertical thickness in a third direction (D3) 1311 in a range of approximately ten (10) nm to fifty (50) nm. For example, the first dielectric material, 1330-1, 1330-2, . . . , 1330-(N+1), may be formed to a vertical thickness in a third direction (D3) 1311 of forty (40) nm. In some embodiments, the semiconductor material, 1332-1, 1332-2, . . . , 1332-N, may be formed to a vertical thickness in the third direction (D3) 1311 in a range of approximately twenty (20) nm to one hundred and fifty (150) nm. Further, as described in FIG. 4, the second dielectric material, 1333-1, 1333-2, . . . , 1333-N, may comprise an oxide material or a nitride material. In some embodiments, the second dielectric material, 1333-1, 1333-2, . . . , 1333-N, may be formed to a vertical thickness in the third direction (D3) 1311 in a range of approximately 10-50 nm. For example, the second dielectric material, 1333-1, 1333-2, . . . , 1333-N, may be formed to a vertical thickness in the third direction (D3) 1311 of 20 nm.

FIG. 13B illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 13B illustrates a cross sectional view, taken along cut-line B-B' in FIG. 12A, showing a view as described in FIG. 13A of the semiconductor structure at different point in one example semiconductor fabrication process of an embodiment of the present disclosure.

As shown in FIG. 13B, elongated vertical, pillar columns with first vertical sidewalls in the vertical stack may be formed by a plurality of first vertical openings, e.g., first vertical openings 1115 in FIG. 11A, having a first horizontal direction and a second horizontal direction, through the vertical stack and extending predominantly in the second horizontal direction. An etching process may be performed to remove portions of the repeated iterations of the first dielectric material, 1330-1, 1330-2, . . . , 1330-(N+1), the semiconductor material, 1332-1, 1332-2, . . . , 1332-N, and the second dielectric material, 1333-1. 1333-2, . . . , 1333-N, in first regions, e.g., access device regions, of the elongated vertical, pillar column 1342 to form second vertical openings 1371-1, 1371-2 (individually or collectively referred to as second vertical openings 1371). As used herein, the term "access device region" refers to a region of an elongated vertical, pillar column in which an access device is formed. In some embodiments, the etching process may be an anisotropic etching process.

Figure 13C:
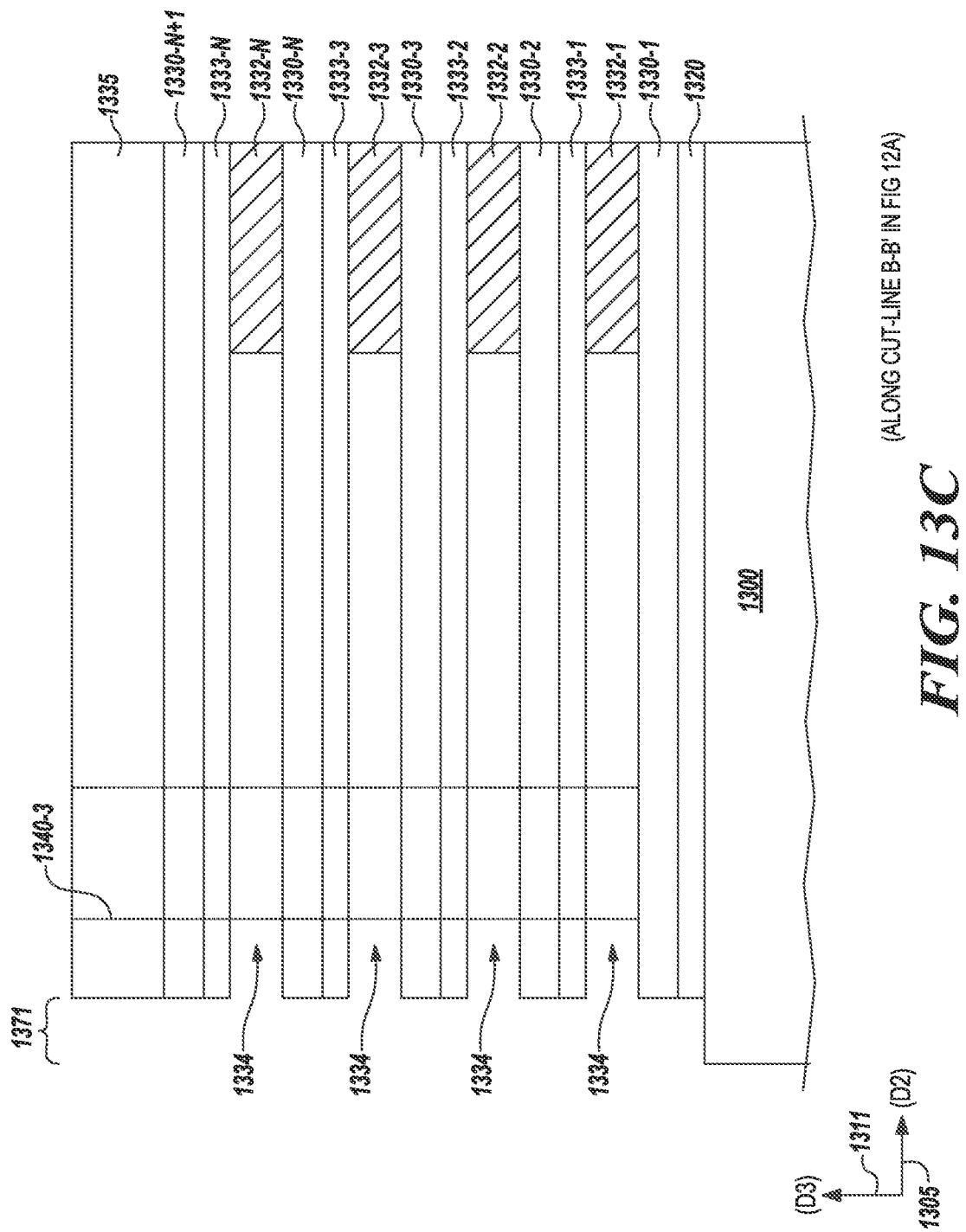

FIG. 13C illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 13C illustrates a cross sectional view, taken along cut-line B-B' in FIG. 12A, showing a view as described in FIG. 13A of the semiconductor structure at different point in one example semiconductor fabrication process of an embodiment of the present disclosure.

As shown in FIG. 13C, first portions of the semiconductor material may be selectively removed a first distance (DIST 1) 1319 from the second vertical openings to form first horizontal openings in the second horizontal direction with a remaining second portion of the semiconductor material at a distal end of the first horizontal openings from the second vertical openings. An etching process may be performed to remove a portion of the semiconductor material, 1332-1, 1332-2, . . . , 1332-N to form first horizontal openings 1334-1, 1334-2, . . . , 1334-N. In some embodiments, a selective etch may be used to laterally recess a portion of the semiconductor material, 1332-1, 1332-2, . . . , 1332-N, a first distance (DIST 1) 1319 from the second vertical openings 1371 described in connection with FIG. 13B. In some embodiments the first distance (DIST 1) 1319 is in a range of approximately 20-300 nm. As shown in FIG. 13C, there may be a remaining portion of the semiconductor material, 1332-1, 1332-2, . . . , 1332-N, at distal end 1328 of the first horizontal openings 1334-1, 1334-2, . . . , 1334-N from the second vertical openings 1371.

In one embodiment, the width 1386 of the horizontal openings 1334 may have a range from 10-80 nanometers (nm), the length 1384 of the horizontal openings 1334 may range from 100-400 nm while the height 1388 may range from 13-10 nm. In a second embodiment, the width 1386 of the horizontal openings 1334 may have a range from 80-240 nanometers (nm), the length 1384 of the horizontal openings 1334 may range from 400-1,000 nm while the height 1388 may range from 10-50 nm. In another embodiment, the width 1386 of the horizontal openings 1334 may have a range from 240-1200 nanometers (nm), the length 1384 of the horizontal openings 1334 may range from 1,000-10,000 nm while the height 1388 may range from 130-200 nm.

Figure 13D:
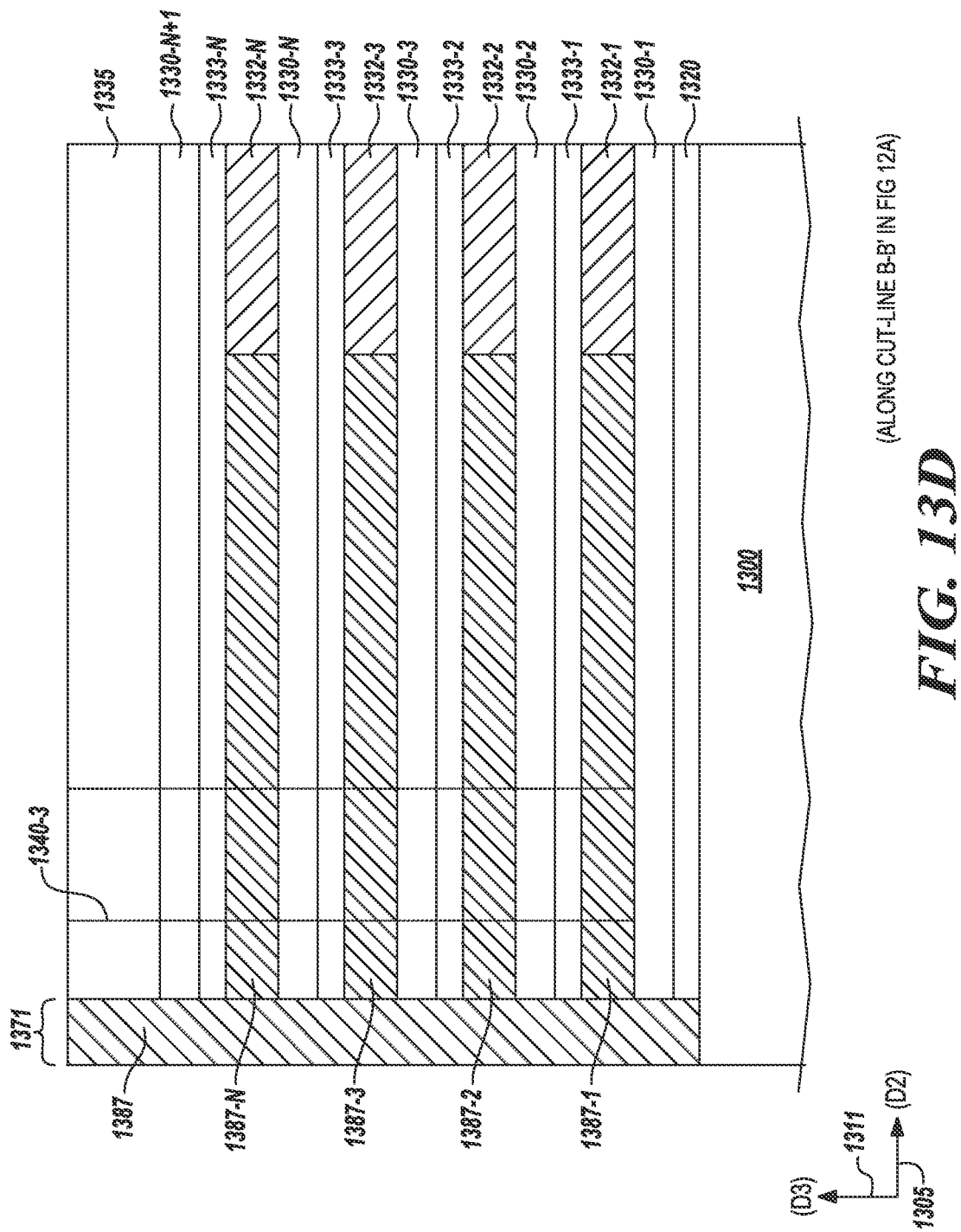

FIG. 13D illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 13D illustrates a cross sectional view, taken along cut-line B-B' in FIG. 12A, showing a view as described in FIG. 13A of the semiconductor structure at different point in one example semiconductor fabrication process of an embodiment of the present disclosure.

As shown in FIG. 13D, a single crystalline silicon may be grown from the substrate within the second vertical opening 1371. In some embodiments, the substrate 1300 may be used as a seed to grow the single crystalline silicon 1387 to fill the second vertical opening 1371. In some embodiments, the single crystalline silicon 1387 may be grown at a temperature in a range of 700-1000° C.

In some embodiments, the single crystalline silicon 1387-1, 1387-2, . . . , 1387-N may be epitaxially grown within the first horizontal openings, 1334-1, 1334-2, . . . , 1334-N, from the remaining portions of the semiconductor material, 1332-1, 1332-2, . . . , 1332-N, along a <100> crystalline direction toward the second vertical openings 1371 to fill the first horizontal openings, 1334-1, 1334-2, . . . , 1334-N.

Figure 13E:
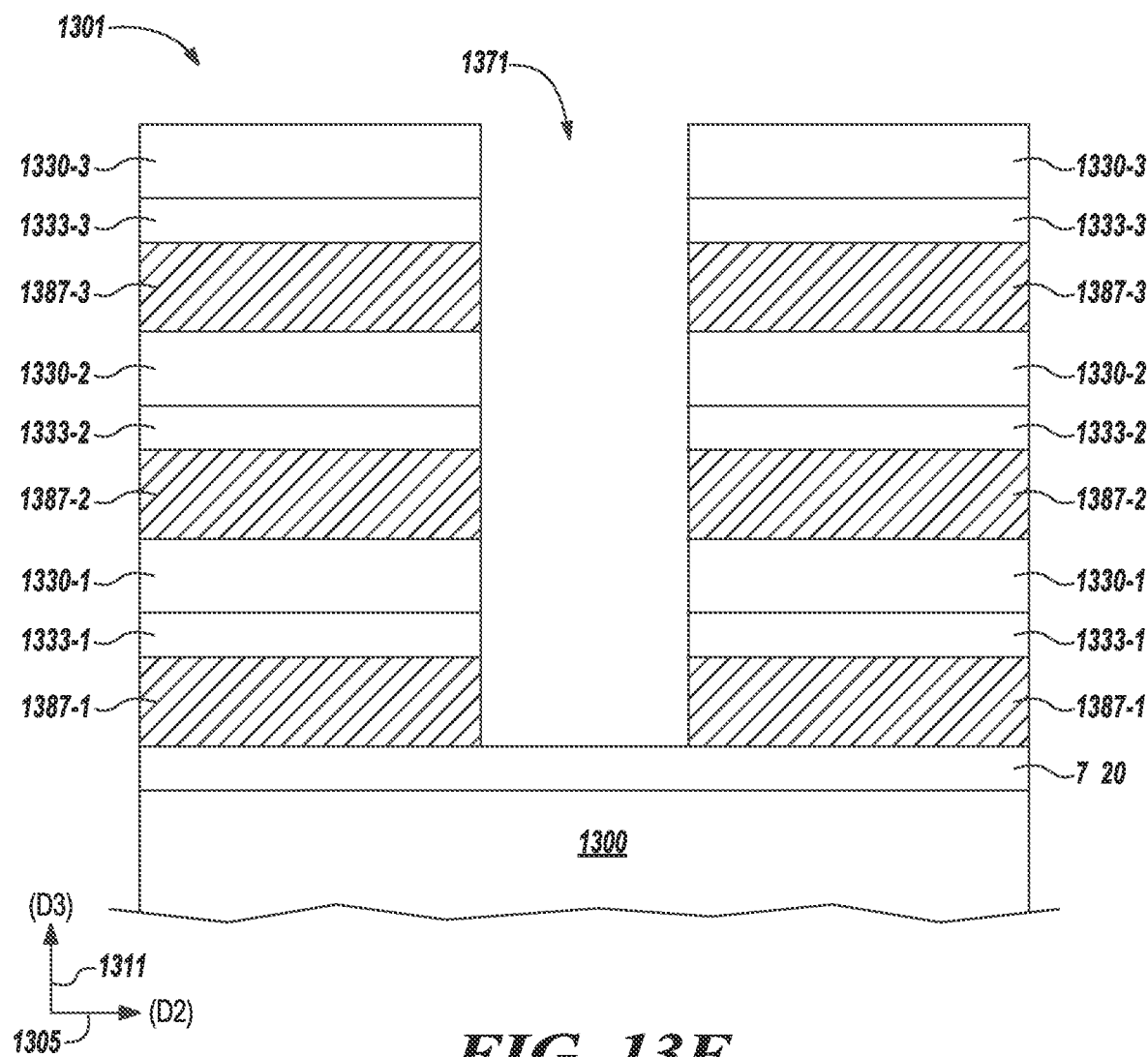

FIG. 13E illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 13E illustrates a cross sectional view, taken along cut-line B-B' in FIG. 12A, showing a view that is similar to the view described in FIG. 13A of the semiconductor structure at different point in one example semiconductor fabrication process of an embodiment of the present disclosure. Unlike FIGS. 13A-7D, the view in FIG. 13E centers on one of the second vertical openings 1371.

As shown in FIG. 13E, a second vertical opening 1371 may be formed through the layers within the vertically stacked memory cells to expose vertical sidewalls in the vertical stack. The second vertical opening 1371 may be formed through the repeating iterations of the first dielectric material 1330, the single crystalline silicon 1387-1, 1387-2, . . . , 787-N, and the second dielectric material 1333. As such, the second vertical opening 1371 may be formed through the first, first dielectric material 1330-1, the first single crystalline silicon 1387-1, the first, second dielectric material 1333-1, the second, first dielectric material 1330-2, the second single crystalline silicon 1387-2, the second, second dielectric material 1333-2, the third, first dielectric material 1330-3, the third single crystalline silicon 1387-3, and the third, second dielectric material 1333-3. Embodiments, however, are not limited to the single second vertical opening 1371 shown in FIG. 13E. Multiple second vertical openings 1371 may be formed through the layers of materials. The second vertical opening 1371 may be formed to expose vertical sidewalls in the vertical stack 1301.

Figure 13F:
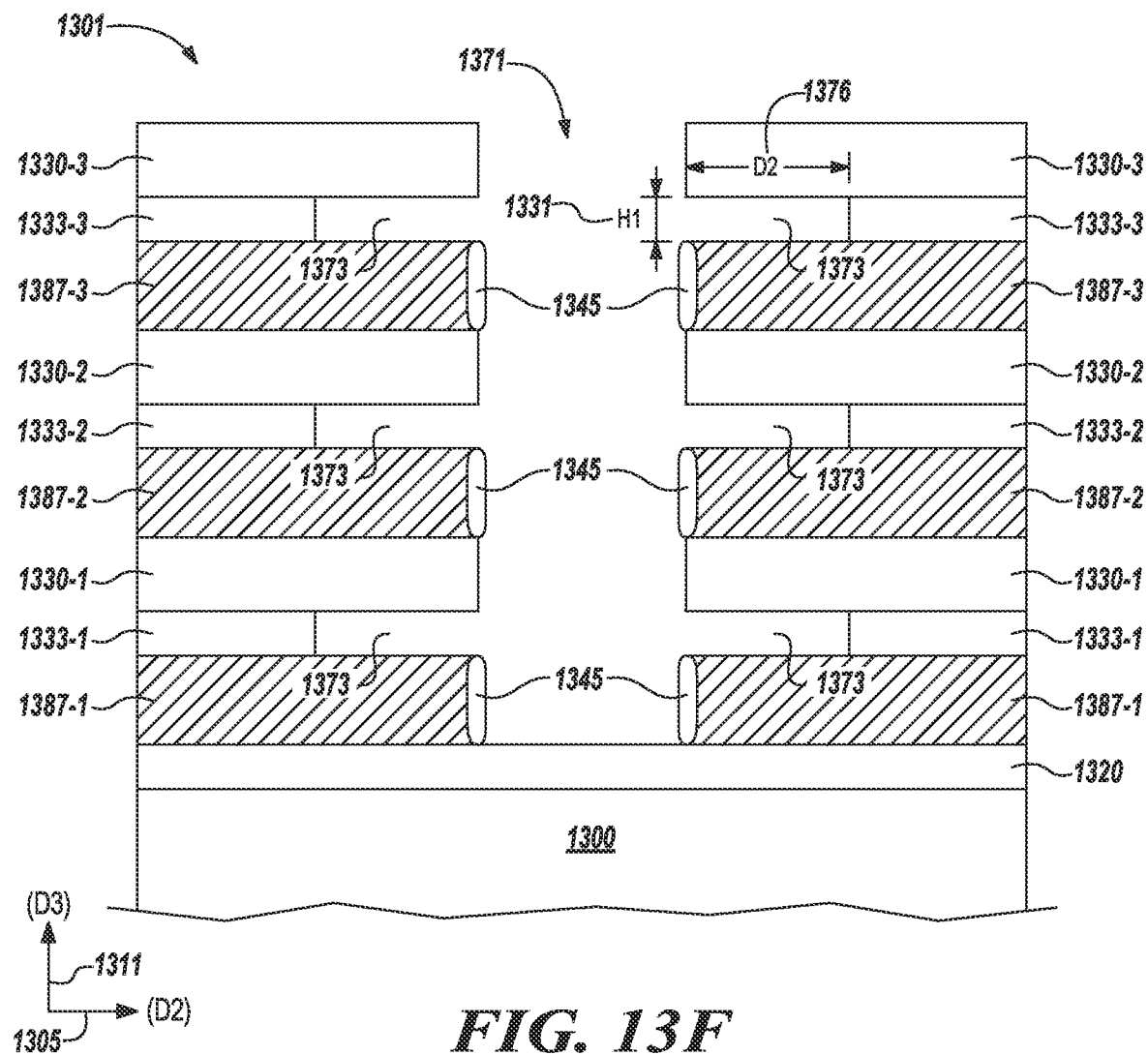

FIG. 13F illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 13F illustrates a cross sectional view, taken along cut-line B-B' in FIG. 6A, showing a view as described in FIG. 13E of the semiconductor structure at different point in one example semiconductor fabrication process of an embodiment of the present disclosure.

As shown in FIG. 13F, a selective etchant process may etch the second dielectric material 1333 to form a second horizontal opening 1373. The selective etchant process may be performed such that the second horizontal opening 1373 has a length or depth (DIST 2) 1376 a second distance (DIST 2) 1376 from the second vertical opening 1371. The distance (DIST 2) 1376 may be controlled by controlling time, composition of etchant gas, and etch rate of a reactant gas flowed into the second vertical opening 1371, e.g., rate, concentration, temperature, pressure, and time parameters. As such, the second dielectric material 1333 may be etched a second distance (DIST 2) 1376 from the second vertical opening 1371. The selective etch may be isotropic, but selective to the second dielectric material 1333, substantially stopping on the first dielectric material 1330 and the single crystalline silicon 1387. Thus, in one example embodiment, the selective etchant process may remove substantially all of the second dielectric material 1333 from a top surface of the single crystalline silicon 1387 to a bottom surface of the first dielectric material 1330, e.g., oxide material, in a layer above while etching horizontally a distance (DIST 2) 1376 from the second vertical opening 1371 between the single crystalline silicon 1387 and the first dielectric material 1330. In this example the second horizontal opening 1373 will have a height (H1) 1331 substantially equivalent to and be controlled by a thickness, to which the second dielectric layer 1333, e.g., nitride material, was deposited. Embodiments, however, are not limited to this example. As described herein, the selective etchant process may etch the second dielectric material 1333 to a second distance (DIST 2) 1376 and to a height (H1) 1331.

Figure 13G:
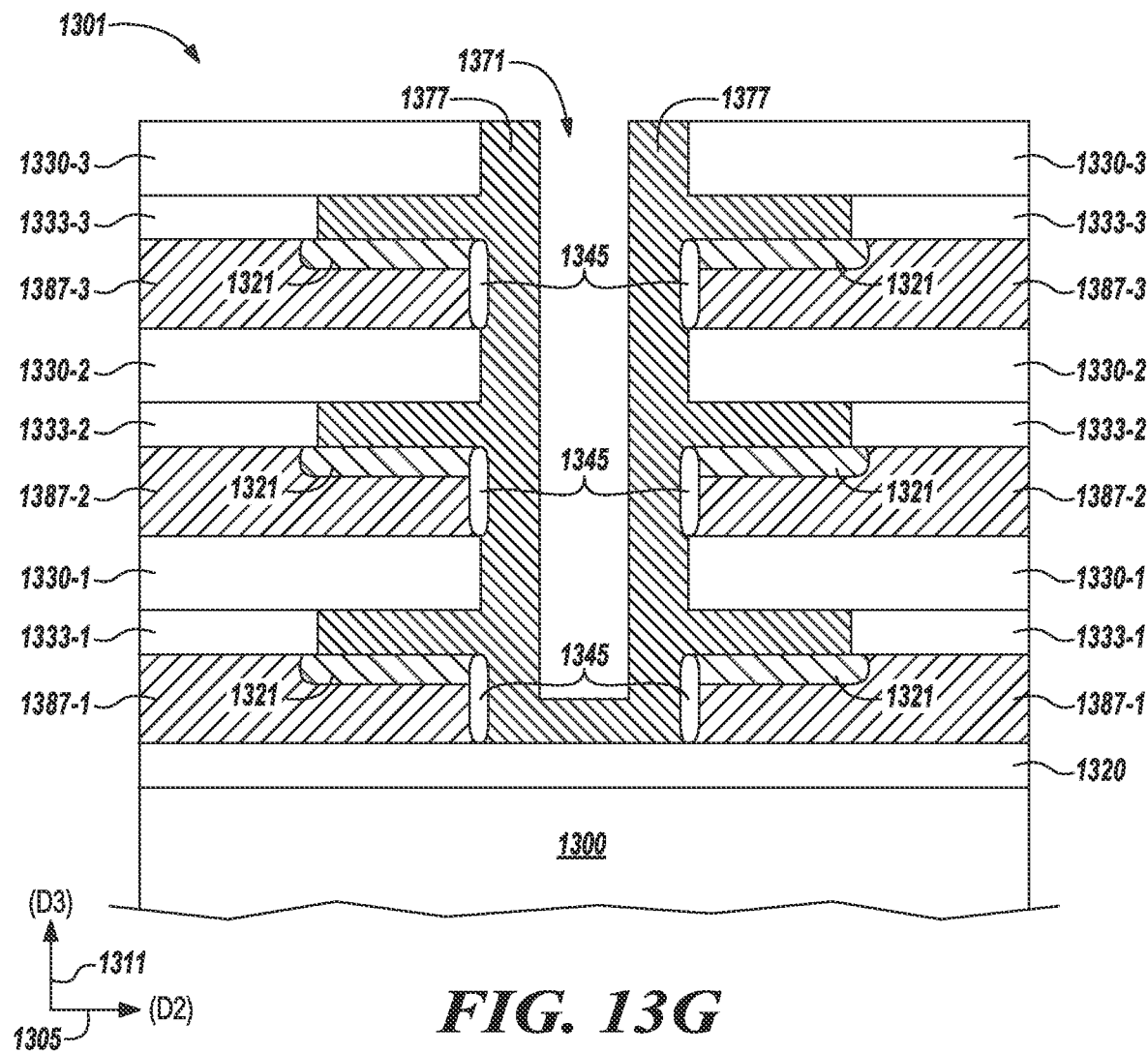

FIG. 13G illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 13G illustrates a cross sectional view, taken along cut-line B-B' in FIG. 12A, showing a view as described in FIG. 13E of the semiconductor structure at different point in one example semiconductor fabrication process of an embodiment of the present disclosure.

As show in FIG. 13G, a first source/drain region 1321 may be formed by gas phase doping a top region of the single crystalline silicon 1387. Further, as shown in FIG. 13G, a conductive material 1377 may be deposited into a portion of the second vertical opening 1371, e.g., using a chemical vapor deposition (CVD) process, such that the conductive material 1377 may also be deposited into the second horizontal opening 1373. The conductive material 1377 may be formed to be in contact with first source/drain region 1321. In some embodiments, the conductive material 1377 may comprise a titanium nitride (TiN) material. In some embodiments the conductive material 1377 may be tungsten (W). In this example, some embodiments may include forming the tungsten (W) material according to a method as described in co-pending U.S. patent application Ser. No. 16/943,108, entitled "Digit Line Formation for Horizontally Oriented Access Devices", and having at least one common inventor. The conductive material 1377 may form a laterally oriented digit line.

Figure 13H:
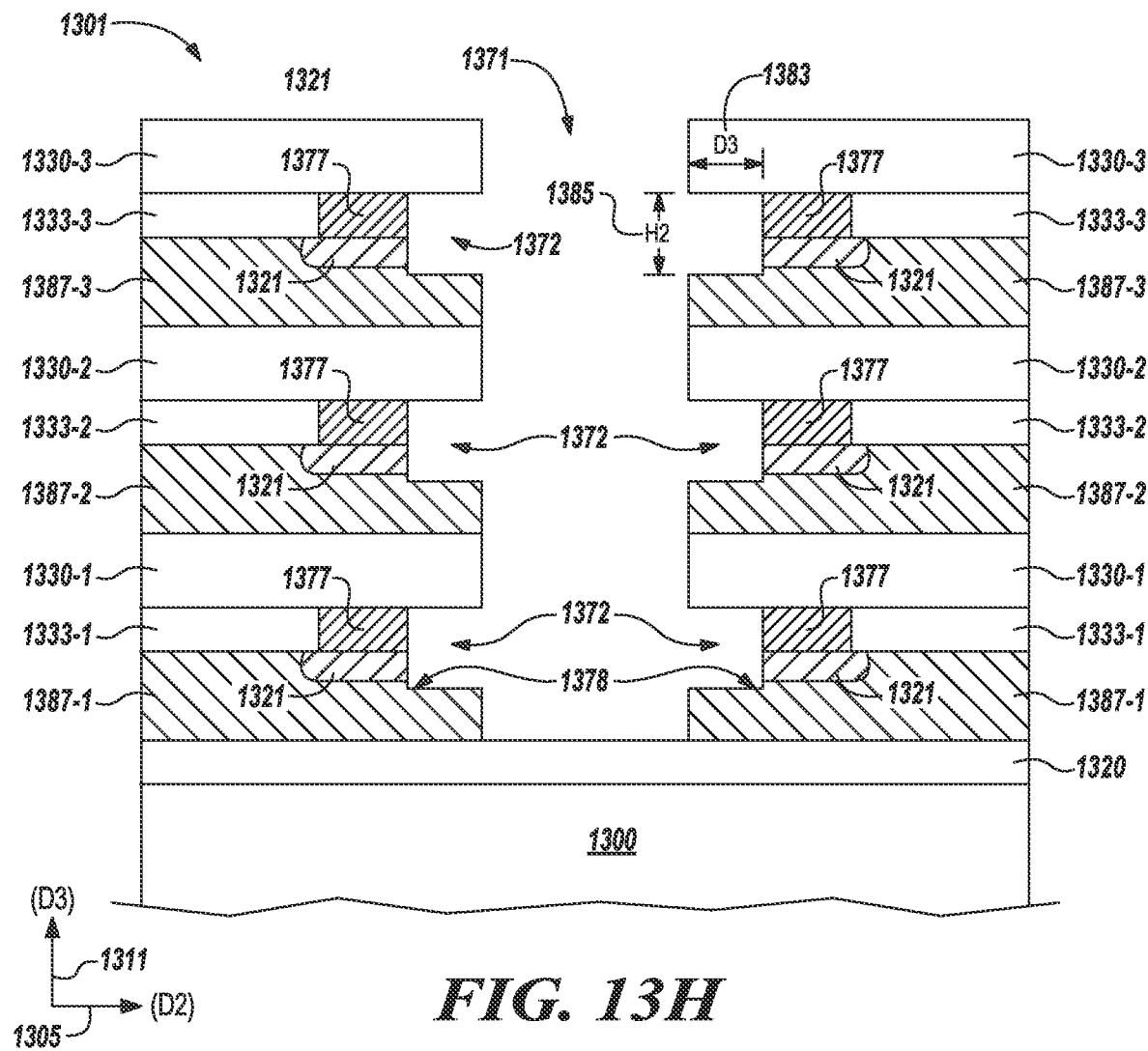

FIG. 13H illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 13H illustrates a cross sectional view, taken along cut-line B-B' in FIG. 12A, showing a view as described in FIG. 13E of the semiconductor structure at different point in one example semiconductor fabrication process of an embodiment of the present disclosure.

As shown in FIG. 13H, the oxide material protecting the sidewalls of semiconductor material (illustrated as 1345 in FIGS. 13F-7G) in the second vertical opening 1371, a portion of the first source/drain region 1321, and a first portion 1378 of the single crystalline silicon 1387 beneath the first source/drain region 1321 may be selectively etched away to allow for formation of a body contact to a body region of the horizontal access device. In this example, the conductive material 1377, a portion of the first source/drain region 1321 and a top portion, e.g., first portion 1378, of the single crystalline silicon 1387 beneath the first source/drain region 1321 may also be etched back to a third distance (DIST 3) 1383 from the second vertical opening 1371. The etch may be performed using an etchant process, e.g., using an atomic layer etching (ALE) or other suitable technique.

In some embodiments, the first source/drain region 1321 may be etched to the same horizontal distance (DIST 3) 1383 from the second vertical opening 1371 as the conductive material 1377.

Thus, a horizontal opening 1372 may be formed by the etching the portion of the first source/drain region 1321 and the top surface, e.g., 1378, of the single crystalline silicon 1387 beneath the first source/drain region 1321 the third horizontal distance (DIST 3) 1383 from the second vertical opening 1371. As such, the horizontal openings 1372 may have a second vertical height (H2) 1385. The second vertical height (H2) 1385 may be greater, e.g., taller vertically, than a combination of the height (H1) 1331 of the second horizontal opening 1373 formed in the second dielectric material, e.g., nitride material, and the height, e.g., depth of gas phase doping into the top surface of the single crystalline silicon 1387, of the first source/drain region 1321. For example, the second vertical height (H2) 1385 may also include the height of the top portion, e.g., 1378, of the single crystalline silicon 1387 that was etched away. Thus, the third distance (DIST 3) 1383 may be shorter than the second distance (DIST 2) 1376, but the second vertical height (H2) 1385 may be taller than the first height (illustrated as H1 in FIG. 13F).

Figure 13I:
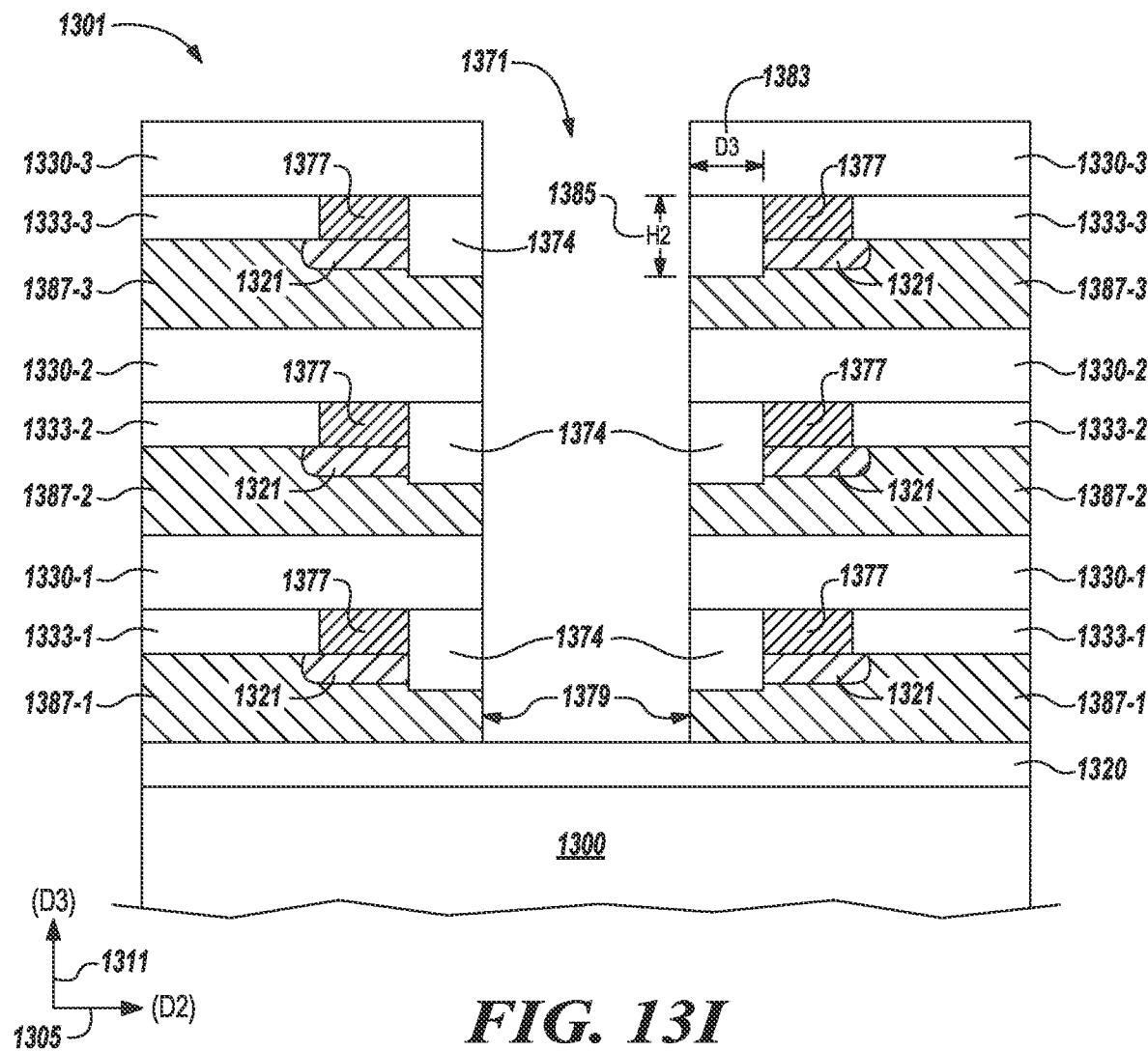

FIG. 13I illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 13I illustrates a cross sectional view, taken along cut-line B-B' in FIG. 12A, showing a view as described in FIG. 13E of the semiconductor structure at different point in one example semiconductor fabrication process of an embodiment of the present disclosure.

As shown in FIG. 13I, a third dielectric material 1374 may be deposited into the second vertical opening 1371 and recessed back to remove the third dielectric material 1374 from the second vertical opening 1371 and maintain the second vertical opening 1371 to allow for deposition of a conductive material (not shown) to form a direct, electrical contact between such conductive material deposited within the second vertical opening 1371 and a second portion 1379 of the single crystalline silicon 1387, e.g., body region contact, of the horizontally oriented access device, e.g., horizontally oriented access device 830 in FIG. 8, within the vertical stack 1301. In some embodiments, the third dielectric material 1374 may be etched away from the second vertical opening 1371 to expose the sidewalls of the first dielectric material 1330, the third dielectric material 1374, and a second portion 1379 of the single crystalline silicon 1387.

Figure 14A:
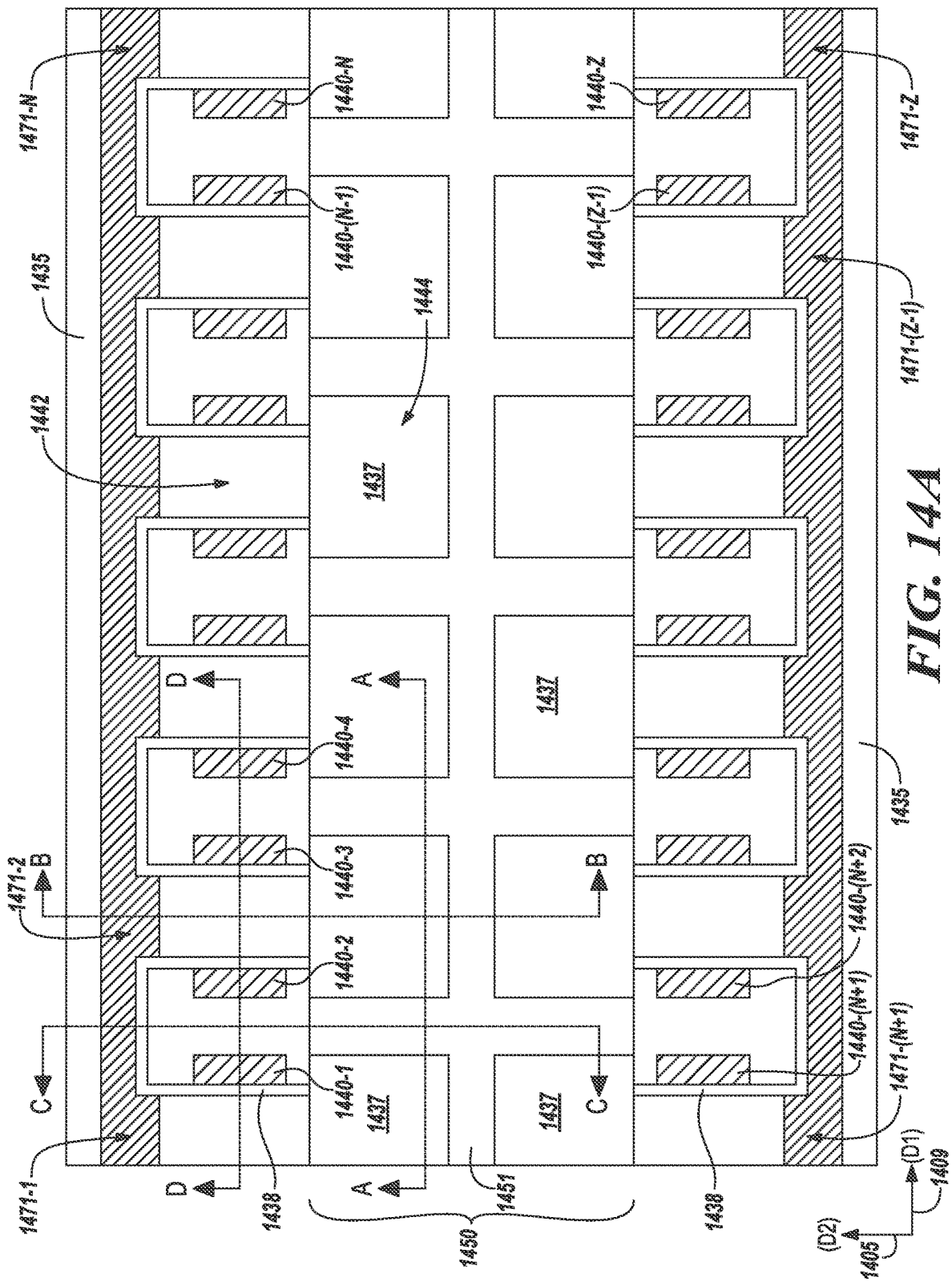

FIG. 14A illustrates an example method, at another stage of a semiconductor fabrication process, for forming arrays of vertically stacked memory cells with epitaxial single crystalline silicon growth for a horizontal access device, in accordance with a number of embodiments of the present disclosure. FIG. 14A illustrates a top down view of a semiconductor structure, at a particular point in time, in a semiconductor fabrication process, according to one or more embodiments. The method in FIG. 14A, further illustrates using one or more etchant processes to form a third vertical opening 1451 in a storage node region 1450 (and 1444 in FIGS. 14A and 14C) through the vertical stack and extending predominantly in the horizontal direction (D1) 1409. The one or more etchant processes forms a third vertical opening 1451 to expose third sidewalls in the repeating iterations of alternating layers of a first dielectric material, 1430-1, 1430-2, . . . , 1430-(N+1), a single crystalline silicon, 1478-1, 1478-2, . . . , 1478-N, and a second dielectric material, 1433-1, 1433-2, . . . , 1433-N, in the vertical stack, shown in FIGS. 14B-8E, adjacent a second region, e.g., access device region, of the single crystalline silicon. Other numerated components may be analogous to those shown and discussed in connection with FIG. 12A-12E.

In some embodiments, this process is performed before selectively removing an access device region, e.g., transistor region, of the semiconductor material in which to form a first source/drain region, channel region, and second source/drain region of the horizontally oriented access devices. In other embodiments, this process is performed after selectively removing an access device region of the semiconductor material in which to form a first source/drain region, channel region, and second source/drain region of the horizontally oriented access devices.

According to an example embodiment, shown in FIGS. 14B-14E, the method comprises forming a third vertical opening 1451 in the vertical stack, e.g., 401 in FIG. 4A, and selectively etching the second region 1444 of the single crystalline silicon, 1478-1, 1478-2, . . . , 1478-N, and the remaining semiconductor material, e.g., semiconductor material 1332, to form a third horizontal opening 1479 a third horizontal distance (DIST 3) back from the third vertical opening 1451 in the vertical stack. According to embodiments, selectively etching the second region 1444 of the single crystalline silicon, 1478-1, 1478-2, . . . , 1478-N can comprise using an atomic layer etching (ALE) process. As will be explained more in connection with FIG. 14C, a second source/drain region 1423 can be formed in the single crystalline silicon, 1478-1, 1478-2, . . . , 1478-N at a distal end 1428 of the third horizontal openings 1479 from the third vertical opening 1451.

FIG. 14B illustrates a cross sectional view, taken along cut-line A-A' in FIG. 14A, showing another view of the semiconductor structure at this particular point in one example semiconductor fabrication process of an embodiment of the present disclosure. The cross sectional view shown in FIG. 14B is away from the plurality of separate, vertical access lines, 1440-1, 1440-2, . . . , 1440-N, 1440-(N+1), . . . , 1440-(Z–1), and shows repeating iterations of alternating layers of a dielectric material, 1430-1, 1430-2, . . . , 1430-(N+1), a single crystalline silicon, 1478-1, 1478-2, . . . , 1478-N, and a second dielectric material, 1433-1, 1433-2, . . . , 1433-N, separated by a third vertical opening 1451, on an insulator material 1420 and a semiconductor substrate 1400 to form the vertical stack. As shown in FIG. 14B, a vertical direction 1411 is illustrated as a third direction (D3), e.g., z-direction in an x-y-z coordinate system, analogous to the third direction (D3) 711, among first, second, and third directions, shown in FIGS. 7-9. The plane of the drawing sheet, extending right and left, is in a first direction (D1) 1409. In the example embodiment of FIG. 14B, the materials within the vertical stack—a dielectric material, 1430-1, 1430-2, . . . , 1430-(N+1), a single crystalline silicon, 1478-1, 1478-2, . . . , 1478-N, and a second dielectric material, 1433-1, 1433-2, . . . , 1433-N, extend into and out of the plane of the drawing sheet in second direction (D2) and along an axis of orientation of the horizontal access devices and horizontal storage nodes of the arrays of vertically stacked memory cells of the three dimensional (3D) memory.

FIG. 14C illustrates a cross sectional view, taken along cut-line B-B' in FIG. 14A, showing another view of the semiconductor structure at this particular point in one example semiconductor fabrication process of an embodiment of the present disclosure. The cross sectional view shown in FIG. 14C is illustrated extending in the second direction (D2) 1405, left and right along the plane of the drawing sheet, along an axis of the repeating iterations of alternating layers of a first dielectric material, 1430-1, 1430-2, . . . , 1430-(N+1), a single crystalline silicon, 1478-1, 1478-2, . . . , 1478-N, and a second dielectric material, 1433-1, 1433-2, . . . , 1433-N, and in which the horizontally oriented access devices and horizontally oriented storage nodes, e.g., capacitor cells, can be formed within the layers of single crystalline silicon, 1478-1, 1478-2, . . . , 1478-N. In the example embodiment of FIG. 14C, a third vertical opening 1451 is illustrated where the horizontally oriented storage nodes, e.g., capacitor cells, may be formed later in this semiconductor fabrication process.

In the example embodiment of FIG. 14C, a third vertical opening 1451 and third horizontal openings 1479 are shown formed from the mask, patterning and etching process described in connection with FIG. 14A. As shown in FIG. 14C, the single crystalline silicon, 1478-1, 1478-2, . . . , 1478-N, in the second region 1444 has been selectively removed to form the third horizontal openings 1479. In one example, an atomic layer etching (ALE) process is used to selectively etch the single crystalline silicon, 1478-1, 1478-2, . . . , 1478-N, and remove the single crystalline silicon, 1478-1, 1478-2, . . . , 1478-N, a distance back from the third vertical opening 1451. Horizontally oriented storage nodes, e.g., capacitor cells, may be formed, as shown in FIGS. 15A-15E, later or first, relative to the fabrication process shown in FIGS. 13A-13I, in the third horizontal openings 1479.

According to one example embodiment, as shown in FIG. 14C a second source/drain region 1423 may be formed by flowing a high energy gas phase dopant, such as Phosphorous (P) for an n-type transistor, into the third horizontal openings 1479 to implant the dopant in the single crystalline silicon, 1478-1, 1478-2, . . . , 1478-N, at a distal end 1428 of the third horizontal openings 1479 from the third vertical opening 1451. In one example, gas phase doping may be used to achieve a highly isotropic e.g., non-directional doping, to form the second source/drain region 1423 to a horizontally oriented access device in region 1442. In another example, thermal annealing with doping gas, such as phosphorous may be used with a high energy plasma assist to break the bonding. Embodiments, however, are not so limited and other suitable semiconductor fabrication techniques may be utilized.

As shown further in FIG. 15C, a first electrode, e.g., 1561, for horizontally oriented storage nodes are to be coupled to the second source/drain regions 1423 of the horizontal access devices. As shown later in FIG. 15C, such horizontally oriented storage nodes are shown formed in a third horizontal opening 1479 extending in second direction (D2), left and right in the plane of the drawing sheet, a distance from the third vertical opening 1451 formed in the vertical stack, e.g., 1001 in FIG. 10A, and along an axis of orientation of the horizontal access devices and horizontal storage nodes of the arrays of vertically stacked memory cells of the three dimensional (3D) memory. In FIG. 14C, a neighboring, opposing vertical access line 1440-3 is illustrated by a dashed line indicating a location set inward from the plane and orientation of the drawing sheet.

Figure 14D:
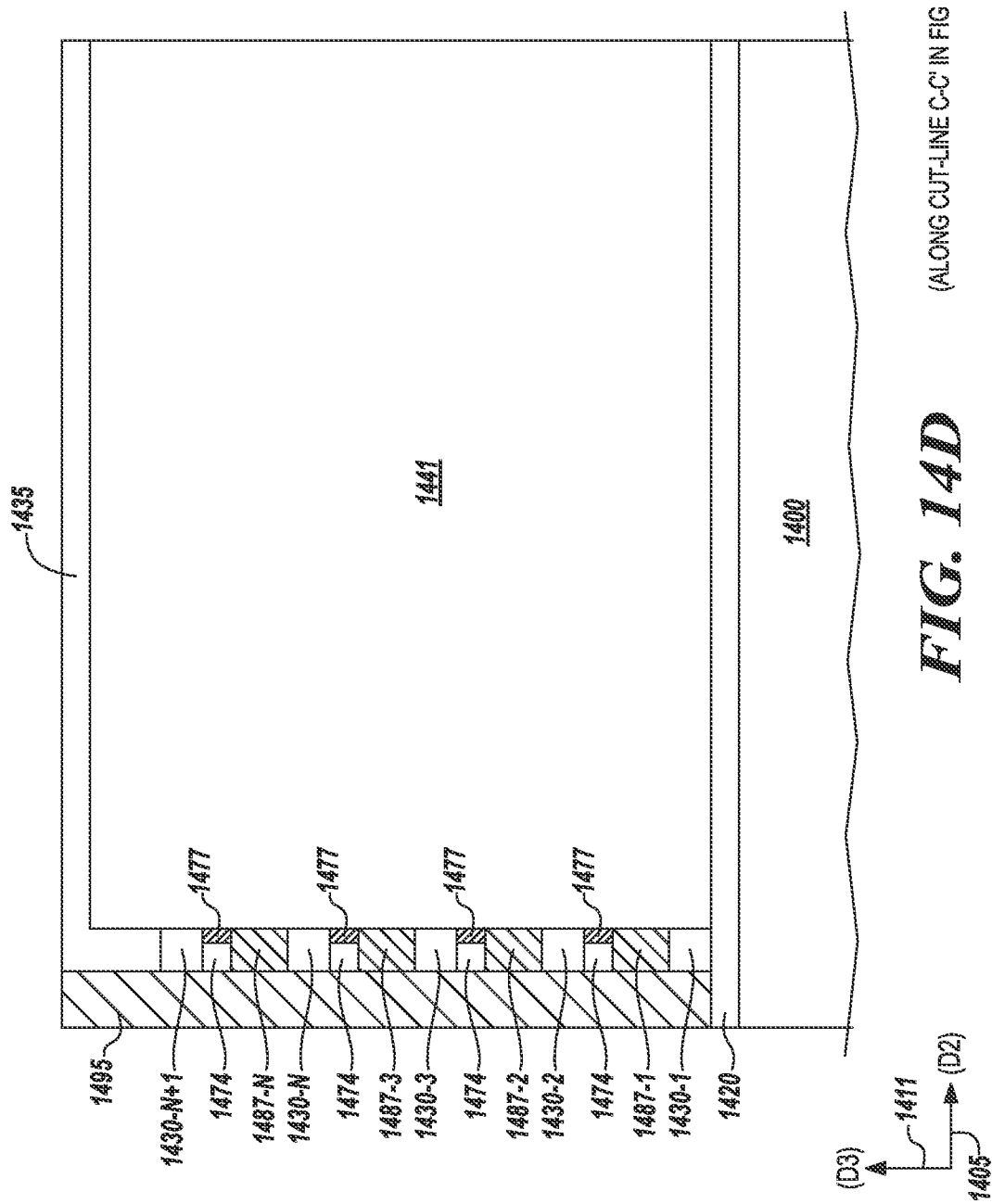

FIG. 14D illustrates a cross sectional view, taken along cut-line C-C' in FIG. 14A, showing another view of the semiconductor structure at this particular point in one example semiconductor fabrication process of an embodiment of the present disclosure. The cross sectional view shown in FIG. 14D is illustrated extending in the second direction (D2) 1405, left and right in the plane of the drawing sheet, along an axis of the repeating iterations of alternating layers of a first dielectric material, 1430-1, 1430-2, . . . , 1430-(N+1), a single crystalline silicon, 1478-1, 1478-2, . . . , 1478-N, and a second dielectric material, 1433-1, 1433-2, . . . , 1433-N, outside of a region in which the horizontally oriented access devices and horizontally oriented storage nodes, e.g., capacitor cells, will be formed within the layers of single crystalline silicon, 1478-1, 1478-2, . . . , 1478-N. At the left end of the drawing sheet is shown the repeating iterations of alternating layers of a first dielectric material, 1430-1, 1430-2, . . . , 1430-(N+1), a single crystalline silicon, 1478-1, 1478-2, . . . , 1478-N, and a second dielectric material, 1433-1, 1433-2, . . . , 1433-N, at which location a horizontally oriented digit line, e.g., digit lines 707-1, 707-2, . . . , 707-P shown in FIG. 7, et. seq., can be integrated to form electrical contact with first source/drain regions or digit line conductive contact material, described above in connection with FIGS. 13A-13I. As shown in FIG. 14D, a subsequent dielectric material 1441, such as an oxide or other suitable spin on dielectric (SOD), may then be deposited to fill the remaining openings from where the exposed conductive material, 1440-1, 1440-2, . . . 1440-N, 1440-(N+1), . . . , 1440-(Z−1), and 1440-Z, was removed using a process such as CVD, or other suitable technique.

Again, while first and second source/drain region references are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 707-2, and the other may be connected to a storage node.

FIG. 14E illustrates a cross sectional view, taken along cut-line D-D' in FIG. 14A, showing another view of the semiconductor structure at this particular point in one example semiconductor fabrication process of an embodiment of the present disclosure. The cross sectional view shown in FIG. 14E is illustrated, right to left in the plane of the drawing sheet, extending in the first direction (D1) 1409 along an axis of the repeating iterations of alternating layers of a first dielectric material, 1430-1, 1430-2, . . . , 1430-(N+1), a single crystalline silicon, 1478-1, 1478-2, . . . , 1478-N, and a second dielectric material, 1433-1, 1433-2, . . . , 1433-N, intersecting across the plurality of separate, vertical access lines, 1440-1, 1440-2, . . . , 1440-4, and intersecting regions of the single crystalline silicon, 1478-1, 1478-2, . . . , 1478-N, in which a channel and body region may be formed, separated from the plurality of separate, vertical access lines, 1440-1, 1440-2, . . . , 1440-4, by the gate dielectric 1438. In FIG. 14E, the first dielectric fill material 1439 is shown separating the space between neighboring horizontally oriented access devices which may be formed extending into and out from the plane of the drawing sheet as described in connection with FIGS. 13A-13I and can be spaced along a first direction (D1) 1409 and stacked vertically in arrays extending in the third direction (D3) 1411 in the three dimensional (3D) memory.

Figure 15A:
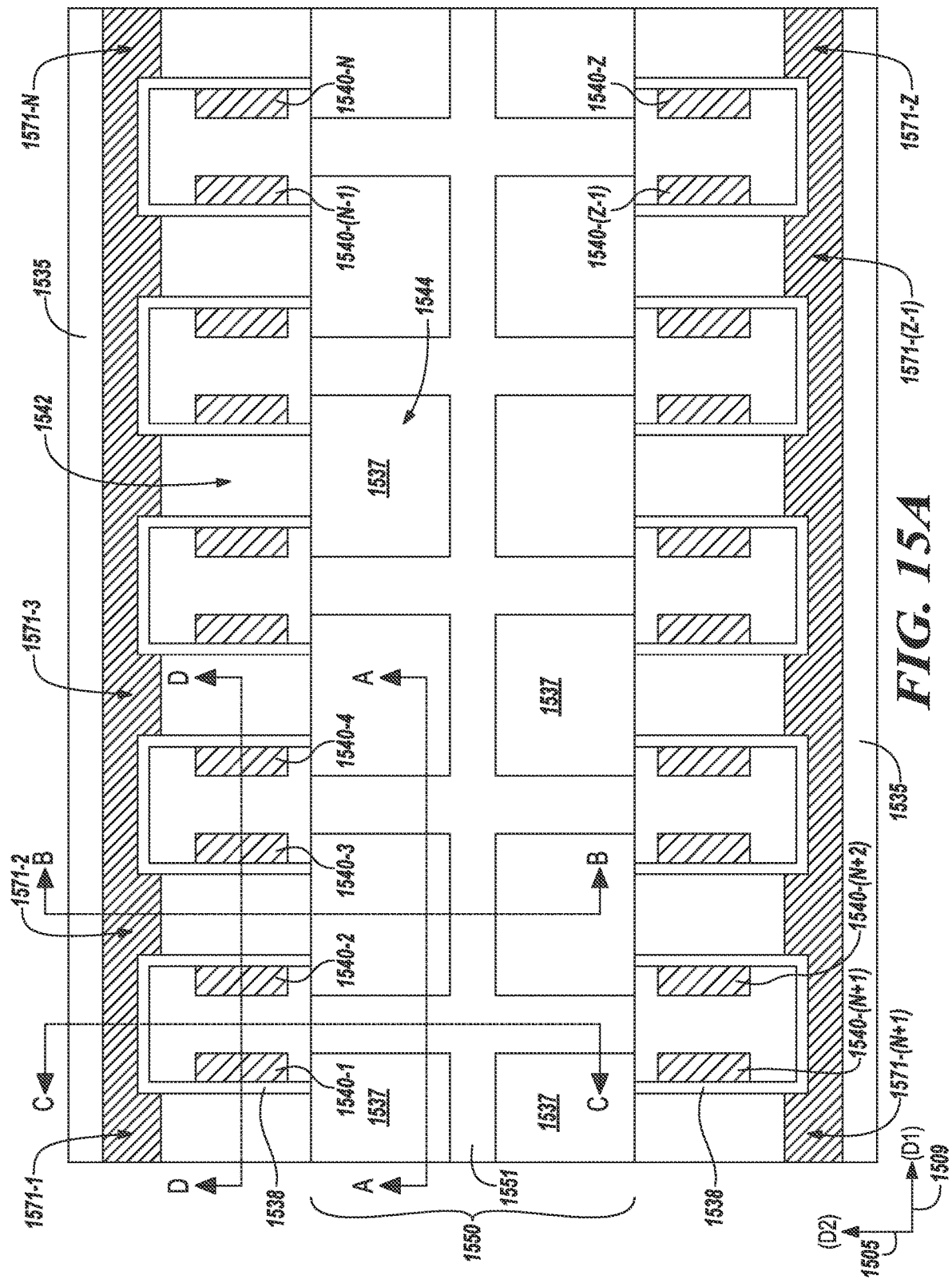

FIG. 15A illustrate an example method, at another stage of a semiconductor fabrication process, for forming arrays of vertically stacked memory cells with epitaxial single crystalline silicon growth for a horizontal access device, in accordance with a number of embodiments of the present disclosure. FIG. 15A illustrates a top down view of a semiconductor structure, at a particular point in time, in a semiconductor fabrication process, according to one or more embodiments. In the example embodiment of FIG. 15A, the method comprises using one or more etchant processes to form a vertical opening 1551 in a storage node region 1550 (and 1544 in FIGS. 15A and 15C) through the vertical stack and extending predominantly in the horizontal direction (D1) 1509. The one or more etchant processes forms a vertical opening 1551 to expose sidewalls in the repeating iterations of alternating layers of a first dielectric material, 1530-1, 1530-2, . . . , 1530-(N+1), a single crystalline silicon, 1587-1, 1587-2, . . . , 1587-N, and a second dielectric material, 1533-1, 1533-2, . . . , 1533-N, in the vertical stack, shown in FIGS. 15B-9E, adjacent a second region of the single crystalline silicon, 1587-1, 1587-2, . . . , 1587-N. Other numerated components may be analogous to those shown and discussed in connection with FIGS. 12-14.

In some embodiments, this process is performed after selectively removing an access device region of the single crystalline silicon 1587-1, 1587-2, . . . , 1587-N in which to form a first source/drain region, channel region, and second source/drain region of the horizontally oriented access devices, as illustrated in FIG. 7. According to an example embodiment, shown in FIGS. 15B-15E, the method comprises selectively etching the second region of the single crystalline silicon, 1587-1, 1587-2, . . . , 1587-N, to deposit a second source/drain region and capacitor cells through the horizontal opening, which is a second horizontal distance back from a vertical opening 1551 in the vertical stack. In some embodiments, as shown in FIGS. 15B-15E, the method comprises forming capacitor cell as the storage node in the horizontal opening. By way of example, and not by way of limitation, forming the capacitor comprises using an atomic layer deposition (ALD) process to sequentially deposit, in the horizontal opening, a first electrode 1561 and a second electrode 1556 separated by a cell dielectric 1563. Other suitable semiconductor fabrication techniques and/or storage nodes structures may be used.

FIG. 15B illustrates a cross sectional view, taken along cut-line A-A' in FIG. 15A, showing another view of the semiconductor structure at this particular point in one example semiconductor fabrication process of an embodiment of the present disclosure. The cross sectional view shown in FIG. 15B is away from the plurality of separate, vertical access lines, 1540-1, 1540-2, . . . , 1540-N, 1540-(N+1), . . . , 1540-(Z−1), and shows repeating iterations of alternating layers of a dielectric material, 1530-1, 1530-2, . . . 1530-(N+1) and a second dielectric material 1533-1, 1533-2, . . . , 1533-N, separated by horizontally oriented capacitor cells having first electrodes 1561, e.g., bottom cell contact electrodes, cell dielectrics 1563, and second electrodes 1556, e.g., top, common node electrodes, on an insulator material 1520 and a semiconductor substrate 1500 to form the vertical stack. As shown in FIG. 15B, a vertical direction 1511 is illustrated as a third direction (D3), e.g., z-direction in an x-y-z coordinate system, analogous to the third direction (D3) 711, among first, second and third directions, shown in FIGS. 7-9. The plane of the drawing sheet, extending right and left, is in a first direction (D1) 1509. In the example embodiment of FIG. 15B, the first electrodes 1561, e.g., bottom electrodes to be coupled to source/drain regions of horizontal access devices, and second electrodes 1556 are illustrated separated by a cell dielectric material 1563 extending into and out of the plane of the drawing sheet in second direction (D2) and along an axis of orientation of the horizontal access devices and horizontal storage nodes of the arrays of vertically stacked memory cells of the three dimensional (3D) memory.

FIG. 15C illustrates a cross sectional view, taken along cut-line B-B' in FIG. 15A, showing another view of the semiconductor structure at this particular point in one example semiconductor fabrication process of an embodiment of the present disclosure. The cross sectional view shown in FIG. 15C is illustrated extending in the second direction (D2) 1505, left and right along the plane of the drawing sheet, along an axis of the repeating iterations of alternating layers of a first dielectric material, 1530-1, 1530-2, . . . , 1530-(N+1), a single crystalline silicon, 1587-1, 1587-2, . . . , 1587-N, and a second dielectric material, 1533-1, 1533-2, . . . , 1533-N, along and in which the horizontally oriented access devices and horizontally oriented storage nodes, e.g., capacitor cells, can be formed within the layers of single crystalline silicon, 1587-1, 1587-2, . . . , 1587-N. In the example embodiment of FIG. 15C, the horizontally oriented storage nodes, e.g., capacitor cells, are illustrated as having been formed in this semiconductor fabrication process and first electrodes 1561, e.g., bottom electrodes to be coupled to source/drain regions of horizontal access devices, and second electrodes 1556, e.g., top electrodes to be coupled to a common electrode plane such as a ground plane, separated by cell dielectrics 1563, are shown. However, embodiments are not limited to this example. In other embodiments the first electrodes 1561, e.g., bottom electrodes to be coupled to source/drain regions of horizontal access devices, and second electrodes 1556, e.g., top electrodes to be coupled to a common electrode plane such as a ground plane, separated by cell dielectrics 1563, may be formed before forming a first source/drain region, a channel and body region, and a second source/drain region in a region of the single crystalline silicon, 1587-1, 1587-2, . . . , 1587-N, intended for location, e.g., placement formation, of the horizontally oriented access devices, described next.

In the example embodiment of FIG. 15C, the horizontally oriented storage nodes having the first electrodes 1561, e.g., bottom electrodes to be coupled to source/drain regions of horizontal access devices, and second electrodes 1556, e.g., top electrodes to be coupled to a common electrode plane such as a ground plane, are shown formed in a third horizontal opening, e.g., 1479 shown in FIG. 14C, extending in second direction (D2), left and right in the plane of the drawing sheet, a second distance (DIST 2 opening) from the third vertical opening, e.g., 1451 in FIG. 14C, formed in the vertical stack, e.g., 1001 in FIG. 10A, and along an axis of orientation of the horizontal access devices and horizontal storage nodes of the arrays of vertically stacked memory cells of the three dimensional (3D) memory. In FIG. 15C, a neighboring, opposing vertical access line 1540-3 is illustrated by a dashed line indicating a location set inward from the plane and orientation of the drawing sheet.

FIG. 15D illustrates a cross sectional view, taken along cut-line C-C' in FIG. 15A, showing another view of the semiconductor structure at this particular point in one example semiconductor fabrication process of an embodiment of the present disclosure. The cross sectional view shown in FIG. 15D is illustrated extending in the second direction (D2) 1505, left and right in the plane of the drawing sheet, along an axis of the repeating iterations of alternating layers of a first dielectric material, 1530-1, 1530-2, . . . , 1530-(N+1), a single crystalline silicon, 1587-1, 1587-2, . . . , 1587-N, and a second dielectric material, 1533-1, 1533-2, . . . , 1533-N, outside of a region in which the horizontally oriented access devices and horizontally oriented storage nodes, e.g., capacitor cells, will be formed within the layers of single crystalline silicon, 1587-1, 1587-2, . . . , 1587-N. In the cross sectional view of FIG. 15D, the second electrode 1556, e.g., top, common electrode to the capacitor cell structure, is additionally shown present in the space between horizontally neighboring devices. At the left end of the drawing sheet is shown the repeating iterations of alternating layers of a first dielectric material, 1530-1, 1530-2, . . . , 1530-(N+1), a single crystalline silicon, 1587-1, 1587-2, . . . , 1587-N, and a second dielectric material, 1533-1, 1533-2, . . . , 1533-N, at which location a horizontally oriented digit line, e.g., digit lines 707-1, 707-2, . . . , 707-P shown in FIG. 7, et. seq., can be integrated to form electrical contact with the second source/drain regions or digit line conductive contact material, described in more detail below.

FIG. 15E illustrates a cross sectional view, taken along cut-line D-D' in FIG. 15A, showing another view of the semiconductor structure at this particular point in one example semiconductor fabrication process of an embodiment of the present disclosure. The cross sectional view shown in FIG. 15E is illustrated, right to left in the plane of the drawing sheet, extending in the first direction (D1) 1509 along an axis of the repeating iterations of alternating layers of a first dielectric material, 1530-1, 1530-2, . . . , 1530-(N+1), a single crystalline silicon, 1587-1, 1587-2, . . . , 1587-N, and a second dielectric material, 1533-1, 1533-2, . . . , 1533-N, intersecting across the plurality of separate, vertical access lines, 1540-1, 1540-2, . . . , 1540-4, and intersecting regions of the single crystalline silicon, 1587-1, 1587-2, . . . , 1587-N, in which a channel and body region may be formed, separated from the plurality of separate, vertical access lines, 1540-1, 1540-2, . . . , 1540-4, by the gate dielectric 1538. In FIG. 15E, the first dielectric fill material 1539 is shown separating the space between neighboring horizontally oriented access devices and horizontally oriented storage nodes, which may be formed extending into and out from the plane of the drawing sheet as described in more detail below, and can be spaced along a first direction (D1) 1509 and stacked vertically in arrays extending in the third direction (D3) 1511 in the three dimensional (3D) memory. FIG. 15 illustrates a cross-sectional view of a portion of an example horizontally oriented access device coupled to a horizontally oriented storage node and coupled to vertically oriented access lines and horizontally oriented digit lines, as may form part of an array of vertically stacked memory cells, in accordance with a number of embodiments of the present disclosure. The horizontally oriented access device can have a first source/drain region and a second source drain region separated by a channel and body region, and gates opposing the channel region and separated therefrom by a gate dielectric.

FIG. 16 is a block diagram of an apparatus in the form of a computing system 1690 including a memory device 1693 in accordance with a number of embodiments of the present disclosure. As used herein, a memory device 1693, a memory array 1680, and/or a host 1692, for example, might also be separately considered an "apparatus." According to embodiments, the memory device 1693 may comprise at least one memory array 1680 with a memory cell formed having a digit line and body contact, according to the embodiments described herein.

In this example, system 1690 includes a host 1692 coupled to memory device 1693 via an interface 1694. The computing system 1690 can be a personal laptop computer, a desktop computer, a digital camera, a mobile telephone, a memory card reader, or an Internet-of-Things (IoT) enabled device, among various other types of systems. Host 1692 can include a number of processing resources (e.g., one or more processors, microprocessors, or some other type of controlling circuitry) capable of accessing the memory device 1693. The system 1690 can include separate integrated circuits, or both the host 1692 and the memory device 1693 can be on the same integrated circuit. For example, the host 1692 may be a system controller of a memory system comprising multiple memory devices 1693, with the system controller 1695 providing access to the respective memory devices 1693 by another processing resource such as a central processing unit (CPU).

In the example shown in FIG. 16, the host 1692 is responsible for executing an operating system (OS) and/or various applications (e.g., processes) that can be loaded thereto (e.g., from memory device 1693 via controller 1695). The OS and/or various applications can be loaded from the memory device 1693 by providing access commands from the host 1692 to the memory device 1693 to access the data comprising the OS and/or the various applications. The host 1692 can also access data utilized by the OS and/or various applications by providing access commands to the memory device 1693 to retrieve said data utilized in the execution of the OS and/or the various applications.

For clarity, the system 1690 has been simplified to focus on features with particular relevance to the present disclosure. The memory array 1680 can be a DRAM array comprising at least one memory cell having a digit line and body contact formed according to the techniques described herein. For example, the memory array 1680 can be an unshielded DL 4F2 array such as a 3D-DRAM memory array. The memory array 1680 can comprise memory cells arranged in rows coupled by word lines (which may be referred to herein as access lines or select lines) and columns coupled by digit lines (which may be referred to herein as sense lines or data lines). Although a single array 1680 is shown in FIG. 16, embodiments are not so limited. For instance, memory device 1693 may include a number of arrays 1680 (e.g., a number of banks of DRAM cells).

The memory device 1693 includes address circuitry 1696 to latch address signals provided over an interface 1694. The interface can include, for example, a physical interface employing a suitable protocol (e.g., a data bus, an address bus, and a command bus, or a combined data/address/command bus). Such protocol may be custom or proprietary, or the interface 1694 may employ a standardized protocol, such as Peripheral Component Interconnect Express (PCIe), Gen-Z, CCIX, or the like. Address signals are received and decoded by a row decoder 1698 and a column decoder 1682 to access the memory array 1680. Data can be read from memory array 1680 by sensing voltage and/or current changes on the sense lines using sensing circuitry 1681. The sensing circuitry 1681 can comprise, for example, sense amplifiers that can read and latch a page (e.g., row) of data from the memory array 1680. The I/O circuitry 1697 can be used for bi-directional data communication with the host 1692 over the interface 1694. The read/write circuitry 1683 is used to write data to the memory array 1680 or read data from the memory array 1680. As an example, the circuitry 1683 can comprise various drivers, latch circuitry, etc.

Control circuitry 1695 includes registers 1699 and decodes signals provided by the host 1692. The signals can be commands provided by the host 1692. These signals can include chip enable signals, write enable signals, and address latch signals that are used to control operations performed on the memory array 1680, including data read operations, data write operations, and data erase operations. In various embodiments, the control circuitry 1695 is responsible for executing instructions from the host 1692.

The control circuitry 1695 can comprise a state machine, a sequencer, and/or some other type of control circuitry, which may be implemented in the form of hardware, firmware, or software, or any combination of the three. In some examples, the host 1692 can be a controller external to the memory device 1693. For example, the host 1692 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

The figures herein follow a numbering convention in which the first digit or digits correspond to the drawing figure number and the remaining digits identify an element or component in the drawing. Similar (e.g., the same) elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" another element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A method for forming epitaxial single crystalline silicon for arrays of vertically stacked memory cells, comprising:
   forming logic circuitry on a silicon substrate in a first working surface;
   depositing an isolation material on the first working surface to encapsulate the logic circuitry and to form a second working surface above the first working surface;
   patterning and etching the isolation material to form a vertical opening through the isolation material, between the logic circuitry to the silicon substrate;
   epitaxially growing single crystalline silicon from the silicon substrate through the vertical opening and continuing epitaxial single crystalline silicon growth horizontally on the second working surface in a first, a second, and a third direction to cover the second working surface, wherein the epitaxial single crystalline silicon growth is selective to growth on silicon;
   patterning and removing a portion of the epitaxially grown single crystalline silicon to partition distinct and separate third working surface areas in which to form memory cell components;
   forming memory cell components in the epitaxially grown single crystalline silicon of the third working surface; and
   depositing a layer of support material above the third working surface areas in which to form storage nodes above the memory cell components in the third working surface.

2. The method of claim 1, further comprising forming the vertical opening through the isolation material to the silicon substrate with a length in a range from 50-200 nanometers (nm), a height in a range from 10-100 nm and a width in a range from 5-20 nm.

3. The method of claim 1, further comprising forming the vertical opening through the isolation material to the silicon substrate with a length in a range from 60-1000 nm, a height in a range from 100-500 nm and a width in a range from 20-100 nm.

4. The method of claim 1, further comprising forming the vertical opening through the isolation material to the silicon substrate with a length in a range between 100-1500 nm, a height in a range from 500-1000 nm and a width in a range from 100-500 nm.

5. The method of claim 1, further comprising:
   patterning and etching the isolation material to form a vertical opening having a length in an orientation parallel to a <100> crystalline direction of the silicon in the substrate; and
   epitaxially growing the single crystalline silicon from the silicon substrate within the vertical opening along a <100> crystalline direction.

6. The method of claim 1, further comprising:
   patterning and etching the isolation material to form a vertical opening having a length in an orientation parallel to a <110> crystalline direction of the silicon in the substrate; and
   epitaxially growing the single crystalline silicon from the silicon substrate within the vertical opening along a <110> crystalline direction.

7. The method of claim 1, wherein forming storage nodes above the memory cell components comprises forming vertical storage nodes above the memory cell components.

8. The method of claim 1, further comprising flowing dichlorosilane (DCS) and hydrogen chloride (HCl) gases into the vertical opening to epitaxially grow the single crystalline silicon from the silicon substrate within the vertical opening.

9. An apparatus, comprising:
   logic circuitry on a silicon substrate in a first working surface;
   an isolation material comprising a second working surface above the logic circuitry;
   an array of vertically stacked memory cells made of epitaxial single crystalline silicon having a third working surface formed above the logic circuitry;
   access devices in the third working surface; and
   vertically oriented storage nodes above the horizontally oriented access devices in the third working surface.

10. The apparatus of claim 9, further comprising horizontally oriented digit lines adjacent the access devices above the third working surface.

11. The apparatus of claim 9, wherein the access devices in the third working surface are buried recessed access devices (BRAD).

12. The apparatus of claim 9, wherein the access devices in the third working surface are a fin field-effect transistor (FINFET).

13. The apparatus of claim 9, wherein the vertically oriented storage nodes comprise capacitor cells having a bottom electrode separated from a top electrode by a cell dielectric.

14. The apparatus of claim 9, further comprising a dielectric liner on the second working surface prior to epitaxially growing single crystalline silicon above the logic circuitry.

15. An apparatus, comprising:
   an array of vertically stacked memory cells, the array having horizontally oriented access devices and digit lines and vertically oriented access lines, comprising:
      the horizontally oriented access devices having a first source/drain region and a second source drain region separated by an epitaxially grown single crystalline channel and body region which is free of twin and stacking fault defects, and having gates opposing the channel region and separated therefrom by a gate dielectric;
      the vertically oriented access lines coupled to the gates and separated from the channel region by the gate dielectric;
      the horizontally oriented storage nodes electrically coupled to the second source/drain regions of the horizontally oriented access devices; and
      the horizontally oriented digit lines electrically coupled to the first source/drain regions of the horizontally oriented access devices.

16. The apparatus of claim 15, wherein the epitaxially grown single crystalline body region is deposited horizontally within a vertical stack.

17. The apparatus of claim 15, wherein the epitaxially grown single crystalline body region comprises a length in a range from 100-400 nm, a height in a range from 5-10 nm and a width in a range from 10-80 nm.

18. The apparatus of claim 15, wherein the epitaxially grown single crystalline body region comprise a length in a range from 400-1,000 nm, a height in a range from 10-50 nm and a width in a range from 80-240 nm.

19. The apparatus of claim 15, wherein the epitaxially grown single crystalline body region comprise a length in a range from 1,000-10,000 nm, a height in a range from 50-200 nm and a width in a range from 240-1200 nm.

20. The apparatus of claim 15, wherein the horizontally oriented access device comprises of a first dielectric, epitaxial single crystalline silicon, and a second dielectric in repeating iterations vertically to form a vertical stack on a silicon substrate.

21. The apparatus of claim 15, further comprising logic circuitry formed under the array of vertically stacked memory cells.

22. The apparatus of claim 15, wherein the vertically oriented storage nodes comprise capacitor cells having a bottom electrode electrically coupled to the second source/drain regions of the access transistors and a top electrode separated from the bottom electrode by a cell dielectric.

* * * * *